United States Patent
Onuki et al.

(10) Patent No.: US 10,998,447 B2
(45) Date of Patent: May 4, 2021

(54) SEMICONDUCTOR DEVICE, SEMICONDUCTOR WAFER, AND ELECTRONIC DEVICE

(71) Applicant: Semiconductor Energy Laboratory Co., Ltd., Atsugi (JP)

(72) Inventors: Tatsuya Onuki, Atsugi (JP); Kiyoshi Kato, Atsugi (JP); Tomoaki Atsumi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 238 days.

(21) Appl. No.: 15/451,514

(22) Filed: Mar. 7, 2017

(65) Prior Publication Data

US 2017/0271516 A1 Sep. 21, 2017

(30) Foreign Application Priority Data

Mar. 18, 2016 (JP) .............................. JP2016-055235

(51) Int. Cl.
*G11C 16/10* (2006.01)
*H01L 29/786* (2006.01)
(Continued)

(52) U.S. Cl.
CPC ........ *H01L 29/7869* (2013.01); *G11C 11/401* (2013.01); *G11C 11/404* (2013.01);
(Continued)

(58) Field of Classification Search
CPC ............. H01L 29/7869; H01L 27/1203; H01L 29/0847; G11C 16/0483; G11C 16/0408; G11C 16/0433
(Continued)

(56) References Cited

U.S. PATENT DOCUMENTS

| 4,466,081 A | 8/1984 | Masuoka |
| 5,220,530 A | 6/1993 | Itoh |

(Continued)

FOREIGN PATENT DOCUMENTS

| EP | 1233454 A | 8/2002 |
| JP | 06-021478 | 1/1994 |

(Continued)

OTHER PUBLICATIONS

Kamiya.T et al. "Carrier transport properties and electronic structures of amorphous oxide semiconductors: the present status", Solid State Physics, vol. 44, No. 9, pp. 621-633.

(Continued)

*Primary Examiner* — Huan Hoang
*Assistant Examiner* — Minh Dinh
(74) *Attorney, Agent, or Firm* — Fish & Richardson P.C.

(57) ABSTRACT

A semiconductor device is provided in which the power consumption can be reduced by reducing the driving voltage and the on-state current can be increased in a period in which a transistor having an extremely low off-state current is brought into an electrically floating state. The semiconductor device comprises a memory cell, a first circuit, and a second circuit. The memory cell includes a first transistor. The first transistor includes a first semiconductor layer, a first gate electrode, and a first back gate electrode. The first gate electrode is connected to a word line. The first back gate electrode is connected to a back gate line. The first circuit supplies a signal for controlling the conduction state of the first transistor to the word line. The second circuit supplies a voltage for controlling the threshold voltage of the first transistor to the back gate line. The second circuit has a function of bringing the back gate line into an electrically floating state in a period in which a signal for controlling the (Continued)

conduction state of the first transistor is supplied to the word line.

28 Claims, 23 Drawing Sheets

(51) Int. Cl.
| | |
|---|---|
| G11C 11/401 | (2006.01) |
| G11C 11/404 | (2006.01) |
| G11C 16/04 | (2006.01) |
| H01L 27/11517 | (2017.01) |
| H01L 27/11563 | (2017.01) |
| H01L 27/12 | (2006.01) |
| H01L 29/24 | (2006.01) |

(52) U.S. Cl.
CPC ...... *G11C 16/0416* (2013.01); *G11C 16/0433* (2013.01); *G11C 16/0466* (2013.01); *H01L 27/11517* (2013.01); *H01L 27/11563* (2013.01); *H01L 27/1225* (2013.01); *H01L 27/1255* (2013.01); *H01L 29/24* (2013.01); *G11C 2213/79* (2013.01)

(58) Field of Classification Search
USPC .................................................. 365/185.18
See application file for complete search history.

(56) References Cited

U.S. PATENT DOCUMENTS

| | | | |
|---|---|---|---|
| 5,349,366 A | 9/1994 | Yamazaki et al. | |
| 5,428,238 A | 6/1995 | Hayashi et al. | |
| 5,506,436 A | 4/1996 | Hayashi et al. | |
| 5,576,571 A | 11/1996 | Hayashi et al. | |
| 5,578,852 A | 11/1996 | Hayashi et al. | |
| 5,578,853 A | 11/1996 | Hayashi et al. | |
| 5,581,106 A | 12/1996 | Hayashi et al. | |
| 5,721,444 A | 2/1998 | Oashi et al. | |
| 5,892,267 A | 4/1999 | Takada | |
| 6,064,589 A | 5/2000 | Walker | |
| 6,127,702 A | 10/2000 | Yamazaki et al. | |
| 6,150,687 A | 11/2000 | Noble et al. | |
| 6,248,626 B1 | 6/2001 | Kumar et al. | |
| 6,646,949 B1 | 11/2003 | Ellis et al. | |
| 6,778,424 B2 | 8/2004 | Iwata et al. | |
| 6,912,159 B2 | 6/2005 | Osawa et al. | |
| 6,980,471 B1 * | 12/2005 | Samachisa | G11C 16/10 365/185.02 |
| 7,030,681 B2 | 4/2006 | Yamazaki et al. | |
| 7,674,650 B2 | 3/2010 | Akimoto et al. | |
| 7,675,785 B2 | 3/2010 | Takahashi | |
| 7,714,633 B2 | 5/2010 | Kato | |
| 7,940,085 B2 | 5/2011 | Kim et al. | |
| 8,084,331 B2 | 12/2011 | Ofuji et al. | |
| 8,106,400 B2 | 1/2012 | Miyairi et al. | |
| 8,188,477 B2 | 5/2012 | Miyairi et al. | |
| 8,218,099 B2 | 7/2012 | Yamazaki et al. | |
| 8,269,218 B2 | 9/2012 | Yamazaki | |
| 8,378,341 B2 | 2/2013 | Hayashi et al. | |
| 8,502,220 B2 | 8/2013 | Yamazaki et al. | |
| 8,502,225 B2 | 8/2013 | Yamazaki et al. | |
| 8,513,661 B2 | 8/2013 | Takahashi et al. | |
| 8,518,739 B2 | 8/2013 | Miyairi et al. | |
| 8,530,246 B2 | 9/2013 | Ofuji et al. | |
| 8,541,846 B2 | 9/2013 | Saito | |
| 8,552,423 B2 | 10/2013 | Yamazaki et al. | |
| 8,604,476 B2 | 12/2013 | Kato et al. | |
| 8,737,109 B2 | 5/2014 | Yamazaki et al. | |
| 8,742,412 B2 | 6/2014 | Goyal et al. | |
| 9,024,317 B2 | 5/2015 | Endo et al. | |
| 9,054,179 B2 | 6/2015 | Aikawa et al. | |
| 9,054,203 B2 | 6/2015 | Miyairi et al. | |
| 9,129,937 B2 | 9/2015 | Hayashi et al. | |
| 9,165,632 B2 | 10/2015 | Kato et al. | |
| 9,312,394 B2 | 4/2016 | Hayashi et al. | |
| 9,449,706 B2 | 9/2016 | Yamazaki et al. | |
| 9,472,559 B2 | 10/2016 | Shionoiri et al. | |
| 9,640,226 B2 * | 5/2017 | Matsuzaki | G11C 5/005 |
| 9,734,914 B2 * | 8/2017 | Kamata | G11C 16/24 |
| 9,735,179 B2 | 8/2017 | Endo et al. | |
| 2001/0004273 A1 | 6/2001 | Sugimoto et al. | |
| 2002/139980 A1 | 10/2002 | Yamazaki | |
| 2002/0149048 A1 | 10/2002 | Noble et al. | |
| 2002/0171461 A1 | 11/2002 | Yamazaki et al. | |
| 2002/0172070 A1 | 11/2002 | Arimoto et al. | |
| 2003/0161191 A1 * | 8/2003 | Matsuda | G11C 16/30 365/189.11 |
| 2003/0209739 A1 | 11/2003 | Hisamoto et al. | |
| 2004/0095806 A1 | 5/2004 | Osawa et al. | |
| 2004/0240305 A1 | 12/2004 | Kato | |
| 2004/0264279 A1 | 12/2004 | Wordeman et al. | |
| 2005/0052220 A1 | 3/2005 | Burgener et al. | |
| 2005/0276094 A1 | 12/2005 | Yamaoka et al. | |
| 2006/0118869 A1 | 6/2006 | Lan et al. | |
| 2007/0147165 A1 | 6/2007 | Kato | |
| 2007/0215925 A1 | 9/2007 | Takahashi | |
| 2007/0272759 A1 | 11/2007 | Kato | |
| 2008/0023696 A1 | 1/2008 | Yukawa et al. | |
| 2008/0143653 A1 | 6/2008 | Shishido | |
| 2008/0273366 A1 | 11/2008 | Braceras et al. | |
| 2009/0002590 A1 | 1/2009 | Kimura | |
| 2009/0010056 A1 | 1/2009 | Kuo et al. | |
| 2009/0261325 A1 | 10/2009 | Kawamura et al. | |
| 2010/0032668 A1 | 2/2010 | Yamazaki et al. | |
| 2010/0079169 A1 | 4/2010 | Kim et al. | |
| 2010/0097838 A1 | 4/2010 | Tanaka et al. | |
| 2010/0102313 A1 | 4/2010 | Miyairi et al. | |
| 2010/0148171 A1 | 6/2010 | Hayashi et al. | |
| 2010/0148845 A1 | 6/2010 | Kato | |
| 2010/0193785 A1 | 8/2010 | Kimura | |
| 2010/0244029 A1 | 9/2010 | Yamazaki et al. | |
| 2011/0012117 A1 | 1/2011 | Yamazaki et al. | |
| 2011/0031497 A1 | 2/2011 | Yamazaki et al. | |
| 2011/0076790 A1 | 3/2011 | Ofuji et al. | |
| 2011/0079777 A1 | 4/2011 | Akimoto | |
| 2011/0079784 A1 | 4/2011 | Im | |
| 2011/0102409 A1 | 5/2011 | Hayakawa | |
| 2011/0147737 A1 | 6/2011 | Yamazaki et al. | |
| 2011/0156025 A1 | 6/2011 | Shionoiri et al. | |
| 2011/0175647 A1 | 7/2011 | Kim et al. | |
| 2011/0175674 A1 | 7/2011 | Shimizu et al. | |
| 2011/0198483 A1 | 8/2011 | Kurokawa | |
| 2011/0248261 A1 | 10/2011 | Yamazaki | |
| 2011/0286256 A1 | 11/2011 | Kamata | |
| 2011/0304311 A1 | 12/2011 | Takahashi et al. | |
| 2012/0051118 A1 | 3/2012 | Yamazaki et al. | |
| 2012/0112191 A1 * | 5/2012 | Kato | H01L 21/84 257/57 |
| 2012/0161139 A1 | 6/2012 | Endo et al. | |
| 2016/0211173 A1 | 7/2016 | Hayashi et al. | |
| 2016/0217830 A1 | 7/2016 | Tsubuku et al. | |
| 2016/0253236 A1 * | 9/2016 | Tsutsui | G11C 29/52 714/764 |
| 2016/0336068 A1 | 11/2016 | Yamazaki et al. | |
| 2017/0033110 A1 | 2/2017 | Shionoiri et al. | |

FOREIGN PATENT DOCUMENTS

| | | |
|---|---|---|
| JP | 07-176184 | 7/1995 |
| JP | 10-084047 A | 3/1998 |
| JP | 11-144466 | 5/1999 |
| JP | 2000-124418 | 4/2000 |
| JP | 2001-053167 A | 2/2001 |
| JP | 2001-093989 | 4/2001 |
| JP | 2001-230329 A | 8/2001 |
| JP | 2002-093924 A | 3/2002 |
| JP | 2002-368226 | 12/2002 |
| JP | 2003-086712 A | 3/2003 |
| JP | 2009-277702 | 11/2009 |
| JP | 2012-146965 A | 8/2012 |
| TW | 525292 | 3/2003 |
| TW | 201140753 | 11/2011 |

(56) References Cited

FOREIGN PATENT DOCUMENTS

| TW | 201250931 | 12/2012 |
|---|---|---|
| TW | 201438008 | 10/2014 |
| TW | 201519296 | 5/2015 |
| WO | WO-2011/081000 | 7/2011 |
| WO | WO-2012/060202 | 5/2012 |

OTHER PUBLICATIONS

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Taiwanese Office Action (Application No. 106107615) dated Apr. 29, 2020.

\* cited by examiner

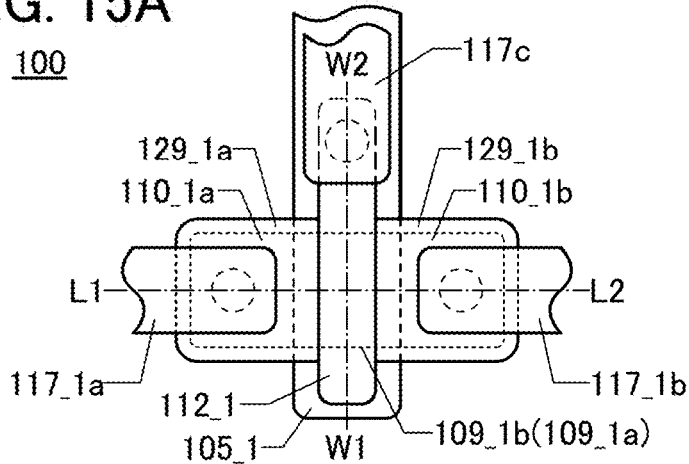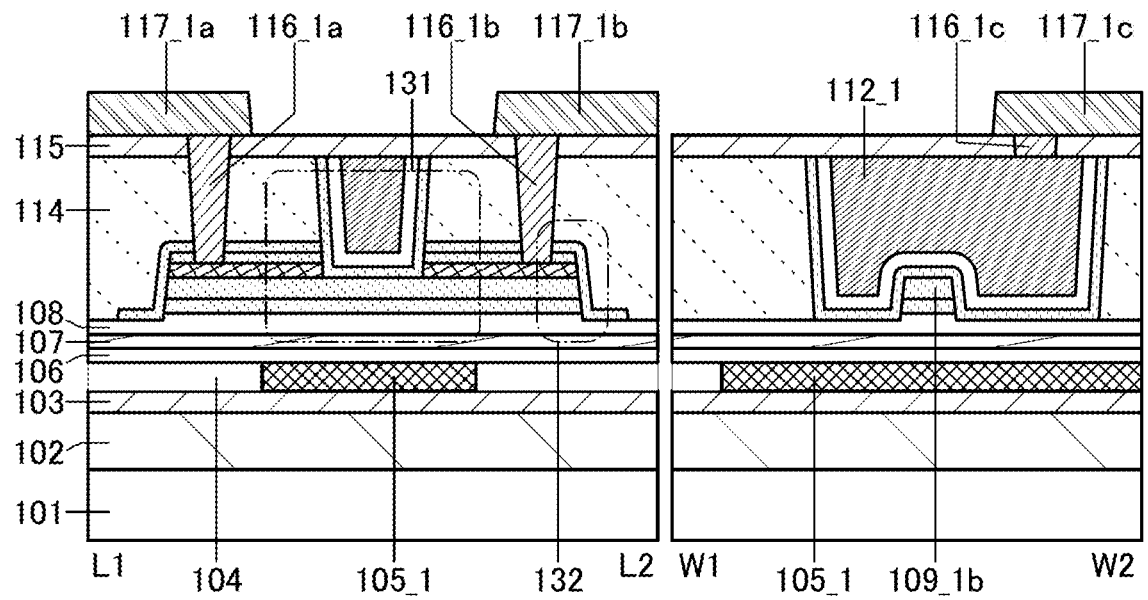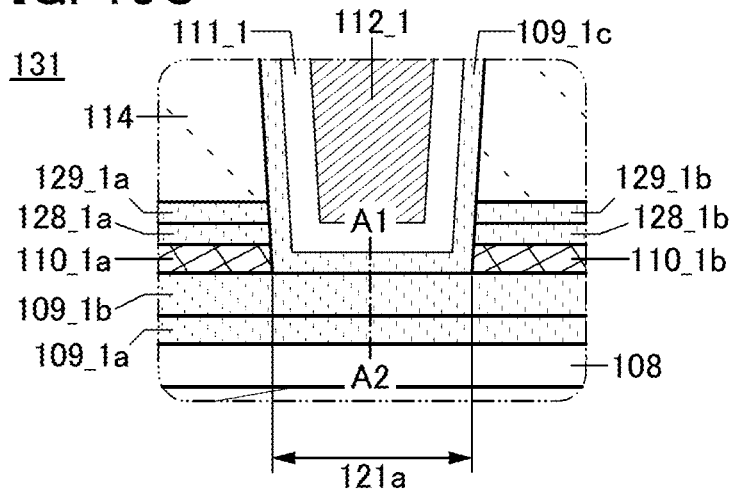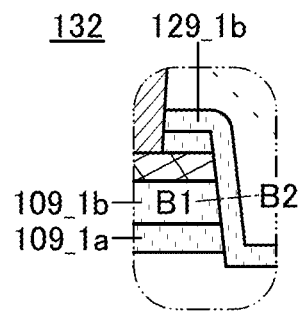

SEMICONDUCTOR DEVICE, SEMICONDUCTOR WAFER, AND ELECTRONIC DEVICE

BACKGROUND OF THE INVENTION

1. Field of the Invention

One embodiment of the present invention relates to a semiconductor device, a semiconductor wafer, and an electronic device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

2. Description of the Related Art

In recent years, transistors using oxide semiconductors for channel formation regions (OS transistors) have attracted attention. The leakage current of an OS transistor flowing when the transistor is in an off state (off-state current) is extremely low. Thus, oxide semiconductors are expected to be applied to semiconductor devices capable of retaining data (e.g., see Patent Document 1).

OS transistors are required to maintain a state of an extremely low off-state current for a long period of time. Thus, a structure in which a threshold voltage is controlled by supplying a voltage to a back gate electrode which is provided in addition to a gate electrode for controlling the conduction state has been proposed (e.g., see Patent Document 2).

PATENT DOCUMENT

[Patent Document 1] United States Patent Application Publication No. 2011/0147737
[Patent Document 2] United States Patent Application Publication No. 2012/0051118

SUMMARY OF THE INVENTION

In a structure of an OS transistor in which a voltage for controlling the threshold voltage is applied to the back gate electrode, a state in which the off-state current is extremely low can be maintained. However, with such a structure, even the current flowing when the transistor is on (on-state current) becomes low. Thus, increasing the on-state current by increasing the driving voltage of the gate electrode becomes necessary. As a result, the following problem arises: the power consumption cannot be reduced. Additionally, in a structure in which the driving voltage of the gate electrode is increased, the electrical characteristics of a transistor might be changed, which might reduce the reliability of the circuit.

One object of one embodiment of the present invention is to provide a semiconductor device and the like in which the on-state current of an OS transistor having an extremely low off-state current can be increased. Another object of one embodiment of the present invention is to provide a semiconductor device and the like in which power consumption can be reduced by reducing the driving voltage of a gate electrode. Another object of one embodiment of the present invention is to provide a semiconductor device and the like in which a change in electrical characteristics of a transistor can be suppressed and in which the reliability of a circuit can be improved. Another object of one embodiment of the present invention is to provide a novel semiconductor device and the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a memory cell, a first circuit, and a second circuit. The memory cell includes a first transistor. The first transistor includes a first semiconductor layer, a first gate electrode, and a first back gate electrode. The first gate electrode is electrically connected to a first wiring. The first back gate electrode is electrically connected to a second wiring. The first circuit has a function of supplying a signal for controlling the conduction state of the first transistor to the first wiring. The second circuit has a function of supplying a voltage for controlling the threshold voltage of the first transistor to the second wiring. The second circuit has a function of bringing the second wiring into an electrically floating state in a period in which a signal for controlling the conduction state of the first transistor is supplied to the first wiring.

One embodiment of the present invention is a semiconductor device including a memory cell, a first circuit, and a second circuit. The memory cell includes a first transistor. The first transistor includes a first semiconductor layer, a first gate electrode, and a first back gate electrode. The first gate electrode is electrically connected to a first wiring. The first back gate electrode is electrically connected to a second wiring. The first circuit has a function of supplying a signal for controlling the conduction state of the first transistor to the first wiring. The second circuit has a function of supplying a voltage for controlling the threshold voltage of the first transistor to the second wiring. The second circuit includes a second transistor. The second transistor includes a second semiconductor layer and a second gate electrode. The second gate electrode is electrically connected to one of a source and a drain of the second transistor.

One embodiment of the present invention is a semiconductor device including a memory cell, a first circuit, and a second circuit. The memory cell includes a first transistor. The first transistor includes a first semiconductor layer, a first gate electrode, and a first back gate electrode. The first gate electrode is electrically connected to a first wiring. The first back gate electrode is electrically connected to a second wiring. The first circuit has a function of supplying a signal for controlling the conduction state of the first transistor to the first wiring. The second circuit has a function of supplying a voltage for controlling the threshold voltage of the first transistor to the second wiring. The second circuit includes a second transistor. The second transistor includes a second semiconductor layer, a second gate electrode, and a second back gate electrode. A wiring connected to the second gate electrode differs from a wiring connected to the second back gate electrode.

In the semiconductor device of one embodiment of the present invention, the second semiconductor layer preferably includes an oxide semiconductor.

In the semiconductor device of one embodiment of the present invention, the first transistor and the second transistor are preferably n-channel transistors, and a threshold voltage of the second transistor is preferably higher than a threshold voltage of the first transistor when potentials of the first gate electrode and the first back gate electrode are set to be the same.

In the semiconductor device of one embodiment of the present invention, the first wiring and the second wiring preferably have a first capacitance, the second wiring and wirings other than the first wiring connected to the memory cell and electrodes included in the memory cell have a second capacitance, and the first capacitance is 1.2 times or more as large as the second capacitance.

In the semiconductor device of one embodiment of the present invention, the layer in which the first wiring is provided is preferably provided above the layer in which the second wiring is provided, and the first wiring and the second wiring have a region where they overlap with each other with an insulating layer provided therebetween.

Note that other embodiments of the present invention will be shown in the following embodiments and the drawings.

One embodiment of the present invention can provide a semiconductor device and the like in which the on-state current of an OS transistor having an extremely low off-state current can be increased. Furthermore, one embodiment of the present invention can provide a semiconductor device and the like in which the driving voltage of a gate electrode is reduced so that the power consumption can be reduced. Furthermore, one embodiment of the present invention can provide a semiconductor device and the like in which a change in electrical characteristics of a transistor can be suppressed and in which the reliability of a circuit can be improved. Furthermore, one embodiment of the present invention can provide a novel semiconductor device and the like.

Note that the description of these effects does not preclude the existence of other effects. One embodiment of the present invention does not necessarily achieve all of these effects. Other effects will be apparent from and can be derived from the description of the specification, the drawings, the claims, and the like.

BRIEF DESCRIPTION OF THE DRAWINGS

FIGS. 15A to 15D illustrate a transistor.

DETAILED DESCRIPTION OF THE INVENTION

Figure 1A:
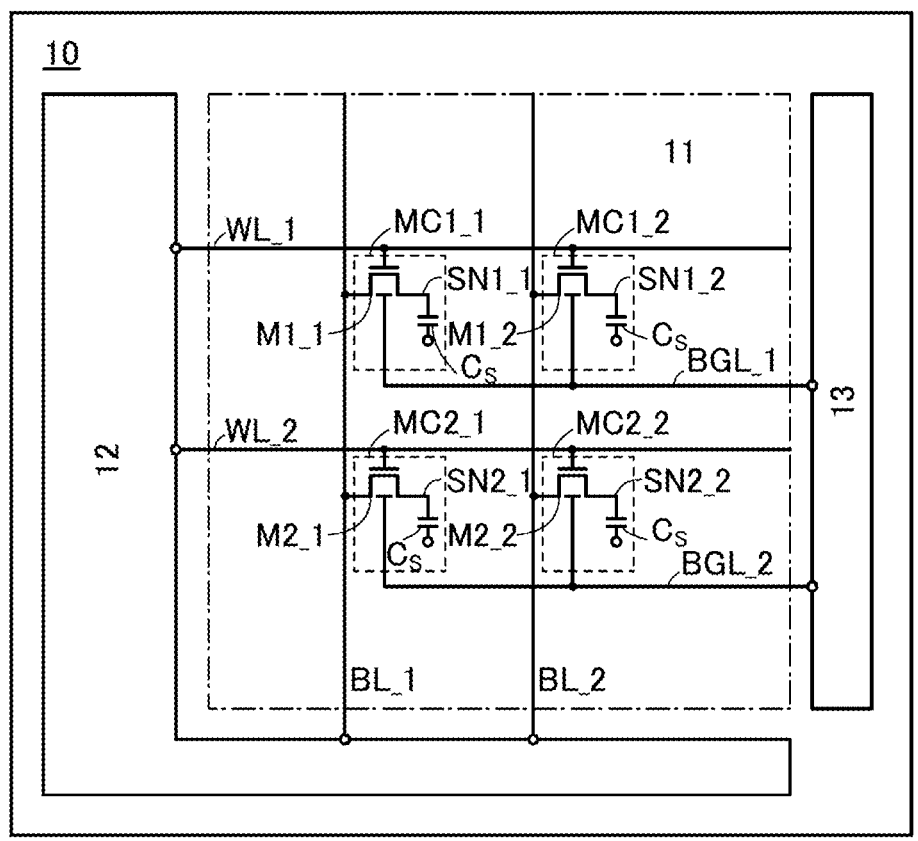
FIGS. 1A and 1B illustrate a structure and an operation of a semiconductor device.

Hereinafter, embodiments will be described with reference to drawings. However, the embodiments can be implemented with various modes. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as "first", "second", and "third" are used in order to avoid confusion among components. Thus, the terms do not limit the number or order of components. In the present specification and the like, a "first" component in one embodiment can be referred to as a "second" component in other embodiments or claims. Furthermore, in the present specification and the like, a "first" component in one embodiment can be referred to without the ordinal number in other embodiments or claims.

The same elements or elements having similar functions, elements formed using the same material, elements formed at the same time, or the like in the drawings are denoted by the same reference numerals, and the description thereof is not repeated in some cases.

(Embodiment 1)

A structure and an operation of a semiconductor device of one embodiment of the present invention will be described with reference to FIGS. 1A and 1B, FIGS. 2A and 2B, FIGS. 3A and 3B, FIGS. 4A and 4B, FIGS. 5A and 5B, FIG. 6, FIGS. 7A and 7B, FIGS. 8A to 8D, FIG. 9, FIGS. 10A and 10B, FIGS. 11A to 11C, FIGS. 12A to 12E, and FIGS. 13A and 13B. Note that the semiconductor device of one embodiment of the present invention has a function of a memory device capable of retaining data for a certain period of time.

<Structure and Operation of Semiconductor Device>

A semiconductor device 10 shown in FIG. 1A includes a memory cell array 11 ("Memory Cell Array" in the drawing), peripheral circuits 12 ("Peripheral Circuits" in the drawing), and a voltage retention circuit 13 ("$V_{BG}$ Retention Circuit" in the drawing).

The memory cell array 11 includes, as an example, four memory cells MC (MC1_1, MC1_2, MC2_1, and MC2_2)

arranged in two rows and two columns. The number of memory cells MC is not limited to four, and more than four memory cells MC may be included.

The memory cell MC1_1 includes a transistor M1_1. The memory cell MC1_1 retains a voltage corresponding to data (data voltage). In the case of data "1", the data voltage is a high-level voltage, and in the case of data "0", the data voltage is a low-level voltage, for example. The memory cell MC1_1 includes a capacitor $C_S$ for retaining the data voltage. The data voltage is retained in a node SN1_1 between the transistor M1_1 and the capacitor $C_S$.

Similarly, the memory cells MC1_2, MC2_1, and MC2_2 include transistors M1_2, M2_1, and M2_2, respectively. Each of the memory cells MC1_2, MC2_1, and MC2_2 includes the capacitor $C_S$ for retaining the data voltage. The data voltage is retained in nodes SN1_2, SN2_1, and SN2_2 of the memory cells MC1_2, MC2_1, and MC2_2.

Each of the transistors M1_1, M1_2, M2_1, and M2_2 includes a gate electrode and a back gate electrode. An oxide semiconductor (OS) is preferably used for a semiconductor layer of each of the transistors M1_1, M1_2, M2_1, and M2_2 where a channel is formed. A transistor in which an OS is used for a semiconductor layer where a channel is formed is also referred to as "OS transistor". Note that the following description will be made on the assumption that transistors M1_1, M1_2, M2_1, and M2_2 are n-channel transistors; however they may be p-channel transistors.

Leakage current flowing through an OS transistor in an off state (off-state current) is extremely low. Therefore, charges corresponding to the data voltages written to the nodes SN1_1, SN1_2, SN2_1, and SN2_2 can continue to be retained by turning off the transistors M1_1, M1_2, M2_1, and M2_2.

In the memory cells MC arranged in two rows and two columns, writing of the data voltage to the nodes SN1_1, SN1_2, SN2_1, and SN2_2 is controlled by a word signal supplied to word lines WL (WL_1, WL_2), for example.

The word line WL_1 is connected to gate electrodes of the transistors M1_1 and M1_2. The word line WL_2 is connected to gate electrodes of the transistors M2_1 and M2_2. By setting the word signal to a high-level voltage ($V_H$), the transistors M1_1 and M1_2, or the transistors M2_1 and M2_2 are turned on. By setting the word signal to a low-level voltage ($V_L$), the transistors M1_1 and M1_2, or the transistors M2_1 and M2_2 are turned off.

The data voltage is supplied, for example, to bit lines BL (BL_1, BL_2) for the memory cells MC arranged in two rows and two columns. The data voltage is written to the nodes SN1_1, SN1_2, SN2_1, and SN2_2 through the transistors M1_1, M1_2, M2_1, and M2_2 by controlling the word signal supplied to the word line WL in each row.

The bit line BL_1 is connected to one of a source and a drain of each of the transistors M1_1 and M2_1. The bit line BL_2 is connected to one of a source and a drain of each of the transistors M1_2 and M2_2.

In the memory cells MC arranged in two rows and two columns, the threshold voltage of the transistors M1_1, M1_2, M2_1, and M2_2 is controlled by a back gate voltage ($V_{BG}$) supplied to back gate lines BGL (BGL_1, BGL_2), for example.

The back gate voltage is capable of shifting the threshold voltage of the transistors M1_1, M1_2, M2_1, and M2_2 in a positive direction or a negative direction. In the case of shifting the threshold voltage in a positive direction, the back gate voltage is, for example, lower than a reference voltage (0 V). With such a structure, the transistors M1_1, M1_2, M2_1, and M2_2 can be turned off without setting the word signal to a voltage lower than the low-level voltage. Consequently, the amplitude voltage of the word signal can be lowered, and the power consumption can be reduced.

The back gate line BGL_1 is connected to the back gate electrodes of the transistors M1_1 and M1_2. The back gate line BGL_2 is connected to the back gate electrodes of the transistors M2_1 and M_2.

The peripheral circuits 12 have a function of supplying the word signal to the word lines WL_1 and WL_2. The peripheral circuits 12 have a function of supplying the data voltage to the bit lines BL_1 and BL_2. The peripheral circuits 12 include a plurality of circuits such as a word line driver circuit and a bit line driver circuit. In a period in which writing and reading of data voltage to and from the memory cells MC are performed, the peripheral circuits 12 output a word signal and a data voltage, and in a period other than that, the word signal is set to a low-level voltage so that the transistors M1_1, M1_2, M2_1, and M2_2 are brought into an off state.

The voltage retention circuit 13 has a function of supplying a back gate voltage to the back gate lines BGL_1 and BGL_2. In a period in which the peripheral circuits 12 perform writing and reading of data voltage to and from the memory cells MC, the voltage retention circuit 13 has a function of bringing the back gate lines BGL_1 and BGL_2 into an electrically floating state.

In the case in which the back gate voltage is continuously being supplied to the back gate lines BGL_1 and BGL_2, the threshold voltage of the transistors M1_1, M1_2, M2_1, and M2_2 can be shifted in a positive direction, as described above. Even though it is possible to lower the voltage of a word signal for turning off the transistors M1_1, M1_2, M2_1, and M2_2 by shifting the threshold voltage in a positive direction, the current flowing through the transistors in an on state (on-state current) is reduced. Thus, it is necessary to increase the voltage of a word signal for turning on the transistors, and a sufficient reduction of power consumption might not be achieved.

In one embodiment of the present invention, without continuously supplying the back gate voltage to the gate lines BGL_1 and BGL_2, the back gate lines BGL_1 and BGL_2 are brought into an electrically floating state at least in a period in which the peripheral circuits 12 perform writing and reading of data voltage to and from the memory cells MC. With such a structure, the voltage of the back gate line BGL increases by capacitive coupling between the word line WL and the back gate line only in a period in which the word signal is set to a high-level voltage. With such a structure, even when the high-level voltage of the word signal is lowered, the on-state current when the transistors M1_1, M1_2, M2_1, and M2_2 are turned on can be increased, and the amplitude voltage of the word signal can be lowered, thereby reducing the power consumption.

In addition, in one embodiment of the present invention, the back gate line BGL_1 and the back gate line BGL_2 are separately brought into an electrically floating state. In other words, the back gate line BGL_1 and the back gate line BGL_2 are each brought into an electrically floating state. When the voltage of the back gate line BGL_1 is increased by capacitive coupling by setting the word signal of the word line WL_1 to a high-level voltage, the increase of the voltage of the back gate line BGL_2 by capacitive coupling can be reduced in the case of setting the word signal of the word line WL_2 to a low-level voltage, so that a change in the initially supplied back gate voltage can be prevented. With such a structure, a decrease in the on-state current of the transistor to which the word signal set to a high-level voltage is supplied can be prevented, and an extremely low off-state current of the transistor to which the word signal set to a low-level voltage is supplied can be maintained.

Figure 1B:
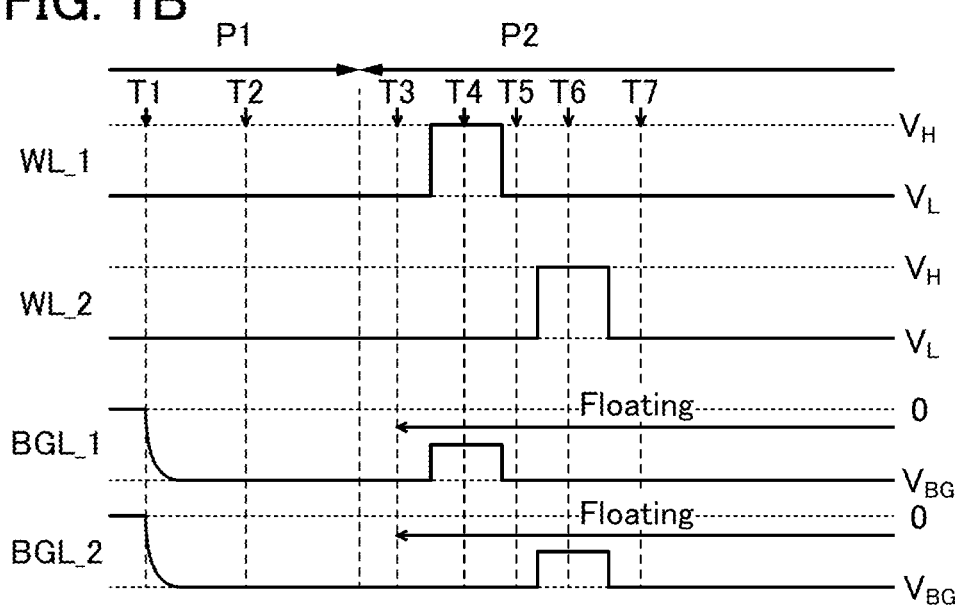

Next, FIG. 1B shows an operation of the semiconductor device 10 illustrated in FIG. 1A. FIG. 1B shows changes over time of the word signal of the word line WL_1, the word signal of the word line WL_2, the voltage of the back gate line BGL_1 and the voltage of the back gate line BGL_2 in a period P1 and a period P2. In FIG. 1B, time T1 to time T7 are given for explanation.

Note that the period P1 corresponds to a period during which a back gate voltage of the back gate line is set. The period P2 corresponds to a period in which a word signal is supplied to the word line in order to perform writing or reading of the data voltage.

In FIG. 1B, the high-level voltage of the word signal of the word lines WL_1 and WL_2 is shown as $V_H$. The voltage $V_H$ is preferably higher than the reference voltage (0 V), and can turn the transistors M1_1, M1_2, M2_1, and M2_2 on. In FIG. 1B, the low-level voltage of the word signal of the word lines WL_1 and WL_2 is shown as $V_L$. $V_L$ is preferably lower than or equal to the reference voltage (0 V), and can turn the transistors M1_1, M1_2, M2_1, and M_2 off.

In FIG. 1B, the back gate voltage of the back gate lines BGL_1 and BGL_2 is shown as $V_{BG}$. $V_{BG}$ is lower than the reference voltage (0 V), preferably lower than $V_L$. By making $V_{BG}$ lower than $V_L$, a shift of the threshold voltage of the transistor in the negative direction can be prevented more reliably, and an extremely low off-state current can be maintained.

In the period P1 in FIG. 1B, the voltage of the back gate lines BGL_1 and BGL_2 is changed from the reference voltage (0 V) to $V_{BG}$ at a time T1. In the period P1, the word lines WL_1 and WL_2 are set to the low-level voltage.

In the period P1 in FIG. 1B, the voltage of the back gate lines BGL_1 and BGL_2 is kept at $V_{BG}$ at a time T2. The voltage of the back gate electrode of each of the transistors M1_1, M1_2, M2_1, and M_2 is $V_{BG}$. Therefore, the threshold voltage is shifted in the positive direction, and the off-state current becomes extremely low.

In the period P2 in FIG. 1B, the voltage of the back gate lines BGL_1 and BGL_2 is set to $V_{BG}$ at a time T3, and the back gate lines BGL_1 and BGL_2 are brought into an electrically floating state. In the period P2, in order to perform writing or reading of the data voltage, the word lines WL_1 and WL_2 are set to $V_H$ or $V_L$. At a time T3, the word lines WL_1 and WL_2 are both set to $V_L$, and the transistors M1_1, M1_2, M2_1, and M2_2 are turned off. Note that because of the voltage of the back gate electrodes being set to $V_{BG}$, the transistors M1_1, M1_2, M2_1, and M2_2 are brought into an electrically floating state. Since charges corresponding to $V_{BG}$ which is supplied to the back gate electrodes are being retained, the threshold voltage shifts in a positive direction, and an extremely low off-state current can be maintained.

In the period P2 in FIG. 1B, in order to perform writing or reading of the data voltage to or from the memory cells MC1_1 and MC1_2 connected to the word line WL_1 in the first row, the word line WL_1 is set to $V_H$ and the word line WL_2 is set to $V_L$ at a time T4. The transistors M1_1 and M1_2 are turned on, and the transistors M2_1 and M2_2 are turned off.

As described above, in the period P2 in FIG. 1B, the voltage of the back gate lines BGL_1 and BGL_2 is set to $V_{BG}$, whereby they are brought into an electrically floating state. Therefore, by turning on the transistors M1_1 and M1_2 at the time T4, in other words, by raising the voltage of the word line WL_1 from $V_L$ to $V_H$, the voltage of the back gate line BGL_1 can be increased by capacitive coupling between the word line WL_1 and the back gate line BGL_1.

With such a structure, the on-state current of the transistors M1_1 and M1_2 in an on state can be increased, even when the voltage $V_H$ of the word line WL_1 is lowered. Additionally, the amplitude voltage of the word signal supplied to the word line WL_1 can be lowered by decreasing the voltage $V_H$ so that the power consumption can be reduced. Additionally, a change in electrical characteristics of the transistor can be suppressed, and the reliability of the circuit can be improved.

In addition, in the period P2 in FIG. 1B, the voltage of the back gate lines BGL_1 and BGL_2 is set to $V_{BG}$, whereby they are brought into an electrically floating state. Thus, by turning off the transistors M2_1 and M2_2 at the time T4, in other words, by keeping the word line WL_2 at $V_L$, a change in voltage of the back gate line BGL_2 can be prevented.

Such a structure can be achieved by bringing the back gate line BGL_1 and the back gate line BGL_2 separately into an electrically floating state. In other words, the back gate lines BGL_1 and BGL_2 can individually be brought into an electrically floating state when being electrically connected through a switch, a transistor, or the like. With such a structure, a decrease in the on-state current of the transistor can be prevented by setting the word line WL_1 to $V_H$ so that the back gate line BGL_1 is increased, and an extremely low off-state current of a transistor can be maintained by setting the word line WL_2 to $V_L$ and setting the back gate line BGL_2 to $V_{BG}$.

In the period P2 in FIG. 1B, the state at the time T5 equals the one at the time T3. In other words, the word lines WL_1 and WL_2 are both set to $V_L$, and the transistors M1_1, M1_2, M2_1, and M2_2 are turned off. Note that the voltage of the back gate line BGL_1 at the above-described time T4 is lowered at the time T5 by lowering the word line WL_1 from $V_H$ to $V_L$. This voltage lowering is due to the capacitive coupling between the word line WL_1 and the back gate line BGL_1. As a result, the voltage of the back gate line BGL_1 returns to $V_{BG}$. Therefore, the voltage of the back gate electrodes of the transistors M1_1, M1_2, M2_1, and M2_2 is set to $V_{BG}$, whereby they are brought into an electrically floating state. Note that in some cases, the voltage of the back gate line BGL_1 changes due to a change in voltage of the bit line BL, the node SN, or the like other than the word line WL_1.

In the period P2 in FIG. 1B, the word line WL_1 is set to $V_L$ and the word line WL_2 is set to $V_H$ at a time T6 in order to write or read the data voltage to or from the memory cells MC2_1 and MC2_2 connected to the word line WL_2 in the second row. The transistors M1_1 and M1_2 are turned off, and the transistors M21 and M_2 are turned on.

As described above, in the period P2 in FIG. 1B, the voltage of the back gate lines BGL_1 and BGL_2 is set to $V_{BG}$, whereby they are brought into an electrically floating state. Thus, by turning on the transistors M2_1 and M2_2 at a time T6, in other words, by raising the voltage of the word line WL_2 from $V_L$ to $V_H$, the voltage of the back gate line BGL_2 can be increased due to the capacitive coupling between the word line WL_2 and the back gate line BGL_2.

With such a structure, the on-state current can be increased when the transistors M2_1 and M2_2 are turned on, even when the voltage $V_H$ of the word line WL_2 is lowered. Additionally, the amplitude voltage of the word signal supplied to the word line WL_2 can be lowered by decreasing the voltage $V_H$, so that the power consumption can be reduced.

Additionally, in the period P2 in FIG. 1B, the voltage of the back gate lines BGL_1 and BGL_2 is set to $V_{BG}$, whereby they are brought into an electrically floating state. Thus, by turning off the transistors M1_1 and M1_2 at the time T6, in other words, by keeping the word line WL_1 at $V_L$, a change in the voltage of the back gate line BGL_1 can be prevented.

Such a structure can be achieved by bringing the back gate line BGL_1 and the back gate line BGL_2 separately into an electrically floating state. In other words, the back gate lines BGL_1 and BGL_2 can individually be brought into an electrically floating state when being electrically connected through a switch, a transistor, or the like. With such a structure, a decrease in the on-state current of the transistor can be prevented by setting the word line WL_2 to $V_H$ so that the back gate line BGL_2 is increased, and an extremely low off-state current of a transistor can be maintained by setting the word line WL_1 to $V_L$ and setting the back gate line BGL_1 to $V_{BG}$.

In the period P2 in FIG. 1B, the state at the time T7 equals the one at the times T3 and T5.

Figure 2A:
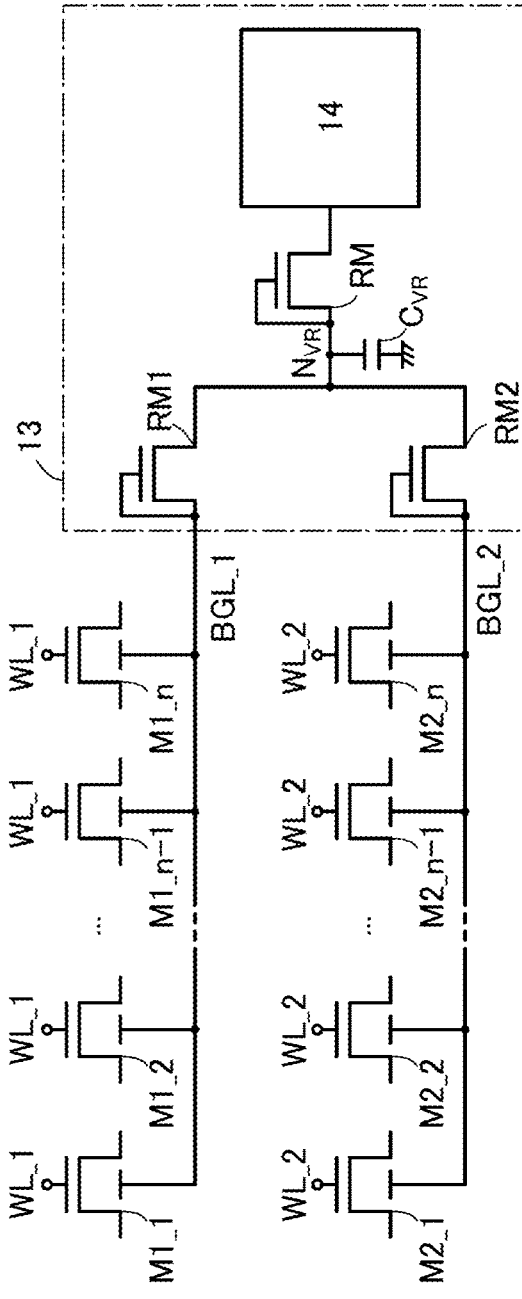
FIGS. 2A and 2B each illustrate a structure of a semiconductor device.
Figure 2B:
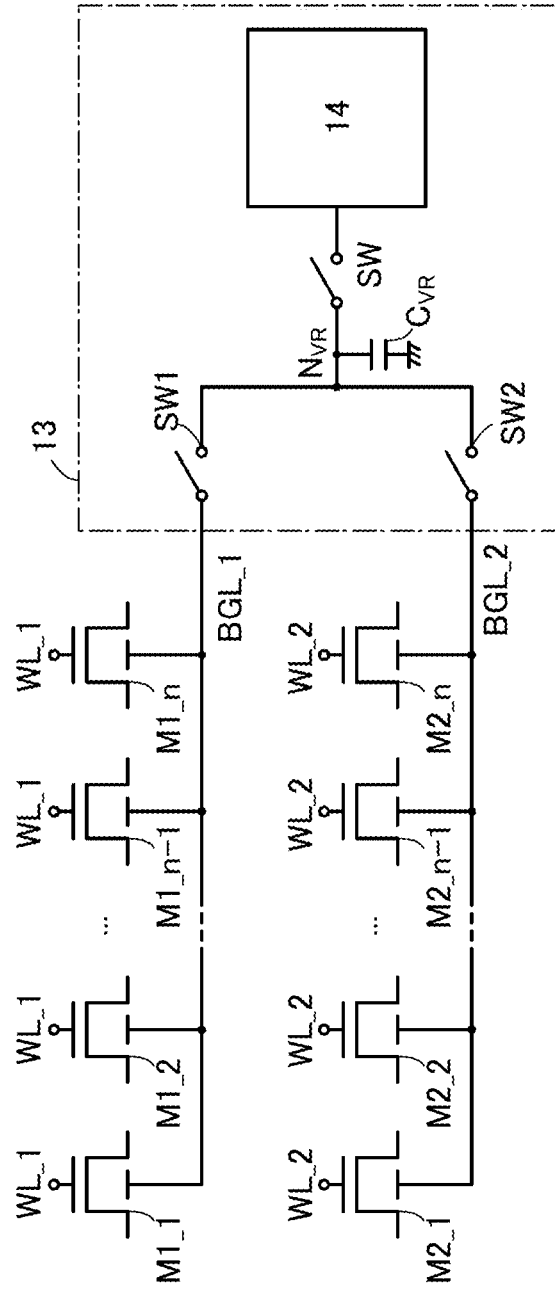

FIGS. 2A and 2B each illustrate a configuration example of the voltage retention circuit 13 through which the operation shown in FIG. 1B can be obtained. FIGS. 2A and 2B illustrate transistors M1_1 to M1_$n$ and M21 to M2_$n$ included in the memory cells MC arranged in two rows and n columns. The gate electrodes of the transistors M1_1 to M1_$n$ are connected to the word line WL_1. The back gate electrodes of the transistors M1_1 to M1_$n$ are connected to the back gate line BGL_1. The gate electrodes of the transistors M2_1 to M2_$n$ are connected to the word line WL_2. The back gate electrodes of the transistors M2_1 to M2_$n$ are connected to the back gate line BGL_2.

The voltage retention circuit 13 shown in FIG. 2A includes a transistor RM1, a transistor RM2, a transistor RM, a capacitor $C_{VR}$, and a voltage generation circuit 14. Note that the node where the transistor RM1, the transistor RM2, the transistor RM, and the capacitor $C_{VR}$ are connected is illustrated in FIG. 2A as node $N_{VR}$.

The voltage generation circuit 14 shown in FIG. 2A generates $V_{BG}$ with which the threshold voltage of the transistors included in the memory cells MC can be controlled. $V_{BG}$ may be generated by lowering a reference voltage (0 V), for example.

The transistor RM shown in FIG. 2A supplies $V_{BG}$ generated by the voltage generation circuit 14 to the node $N_{VR}$, and $V_{BG}$ can be retained at the node $N_{VR}$, even when generation of the voltage by the voltage generation circuit 14 is stopped afterwards. The transistor RM is preferably an OS transistor. The transistor RM preferably has a higher threshold voltage than the transistor included in the memory cell MC. It is preferable that the on-state current and the off-state current of the transistor RM be lower than those of the transistor included in the memory cell MC so that $V_{BG}$ of the node $N_{VR}$ can easily be retained. The gate of the transistor RM is connected to one of a source and a drain of the transistor RM. With the structure shown in FIG. 2A, the transistor RM can function as a diode, and $V_{BG}$ can be retained at the node $N_{VR}$ regardless of a control signal from an external component.

The transistors RM1 and RM2 shown in FIG. 2A supply $V_{BG}$ retained in the node $N_{VR}$ to the back gate lines BGL_1 and BGL_2, and can bring the back gate lines BGL_1 and BGL_2 into an electrically floating state after the back gate lines BGL_1 and BGL_2 are set to $V_{BG}$. The transistors RM1 and RM2 are preferably OS transistors. Like the transistor RM, the transistors RM1 and RM2 preferably have a higher threshold voltage than the transistor included in the memory cell MC. It is preferable that the on-state current and the off-state current of the transistors RM1 and RM2 be, like those of the transistor RM, lower than those of the transistor included in the memory cell MC so that $V_{BG}$ of the back gate lines BGL_1 and BGL_2 can easily be retained. The gate of the transistor RM1 is connected to one of a source and a drain of the transistor RM1. The gate of the transistor RM2 is connected to one of a source and a drain of the transistor RM2. With the structure shown in FIG. 2A, the transistors RM1 and RM2 can function as diodes and $V_{BG}$ supplied to the transistors RM1 and RM2 can be retained regardless of a control signal from an external component. Furthermore, if the node $N_{VR}$ has the same potential as the back gate lines BGL_1 and BGL_2, it is possible to bring the back gate lines BGL_1 and BGL_2 into an electrically floating state.

The transistors RM, RM1, and RM2 shown in FIG. 2A can be replaced by switches. A circuit configuration for such a case is illustrated in FIG. 2B. The voltage retention circuit 13 shown in FIG. 2B includes a switch SW1, a switch SW2, a switch SW, the capacitor $C_{VR}$, and the voltage generation circuit 14. Note that the node where the switch SW1, the switch SW2, the switch SW, and the capacitor $C_{VR}$ are connected is illustrated in FIG. 2B as node $N_{VR}$. The operation shown in FIG. 1B can be achieved by controlling each switch in FIG. 2B and setting the back gate lines BGL_1 and BGL_2 to $V_{BG}$, thereby bringing them into an electrically floating state.

The operation of the voltage retention circuit 13 and the states of the back gate lines BGL_1 and BGL_2 shown in FIG. 2A will be described with reference to FIGS. 3A and 3B, FIGS. 4A and 4B, FIGS. 5A and 5B, and FIG. 6. The state in FIG. 3A corresponds to time T1 in FIG. 1B. The state in FIG. 3B corresponds to time T2 in FIG. 1B. The state in FIG. 4A corresponds to time T3 in FIG. 1B. The state in FIG. 4B corresponds to time T4 in FIG. 1B. The state in FIG. 5A corresponds to time T5 in FIG. 1B. The state in FIG. 5B corresponds to time T6 in FIG. 1B. The state in FIG. 6 corresponds to time T7 in FIG. 1B.

Figure 3A:
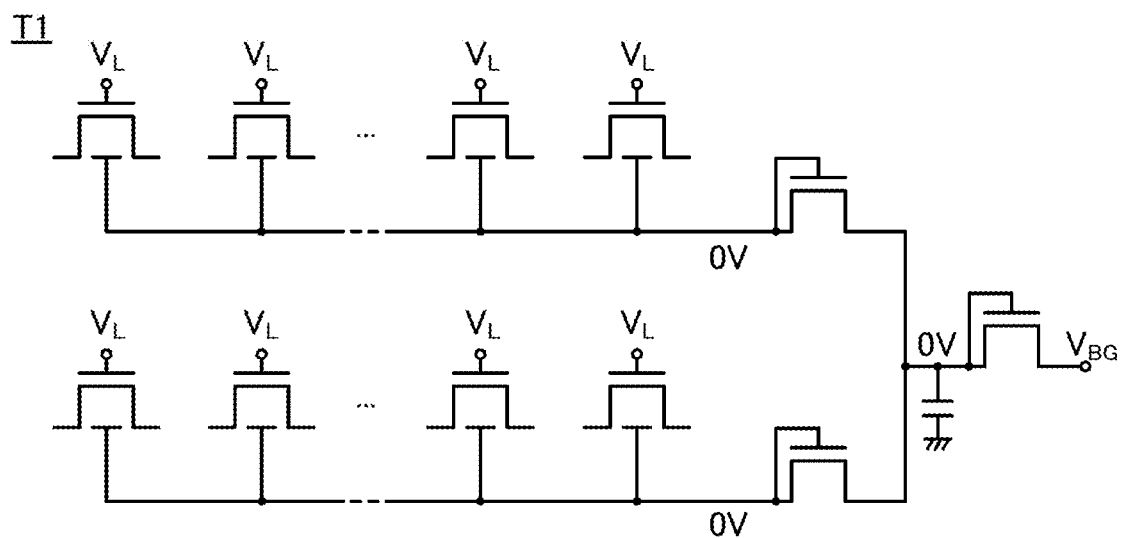
FIGS. 3A and 3B show operations of a semiconductor device.

In FIG. 3A, the voltage generation circuit 14 generates $V_{BG}$. Note that in an initial state, the node $N_{VR}$ and the back gate lines BGL_1 and BGL_2 are set to a reference voltage (0 V).

Figure 3B:
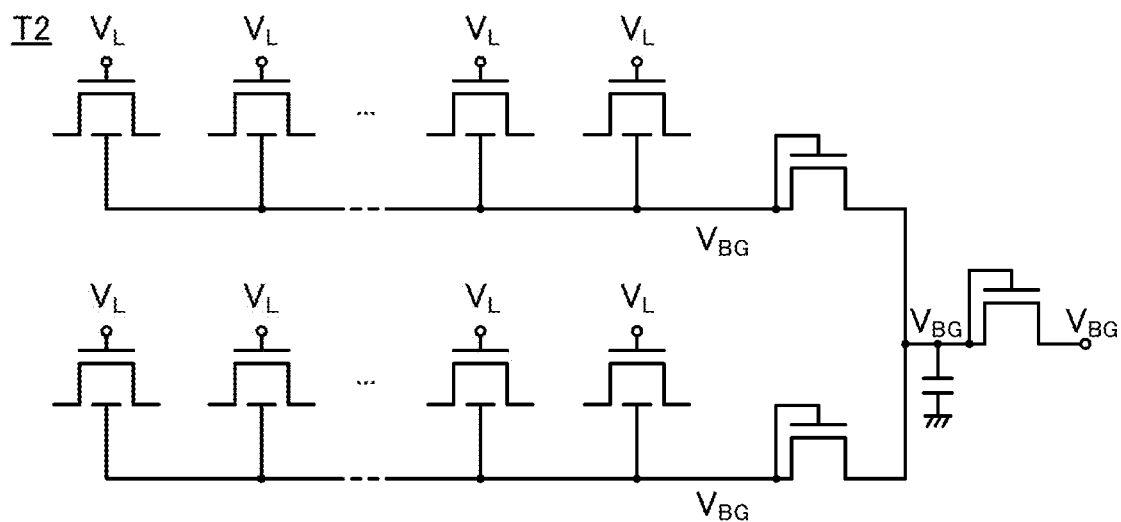

A potential difference is generated between the voltage generation circuit 14 and the node $N_{VR}$ so that a current flows in the transistor RM in FIG. 3B. Accordingly, the voltage of the node $N_{VR}$ becomes $V_{BG}$. Similarly, a potential difference is generated between the back gate line BL_1 and the node $N_{VR}$ so that a current flows in the transistor RM1. Accordingly, the voltage of the back gate line BGL_1 becomes $V_{BG}$. Similarly, a potential difference is generated between the back gate line BL_2 and the node $N_{VR}$ so that a current flows in the transistor RM2. Accordingly, the voltage of the back gate line BGL_2 becomes $V_{BG}$. Actually, a voltage that is lowered by the threshold voltage of the transistors RM, RM1, and RM2 is supplied to the node $N_{VR}$ and the back gate lines BGL_1 and BGL_2; however the threshold voltage is omitted in the following description because it is low.

Figure 4A:
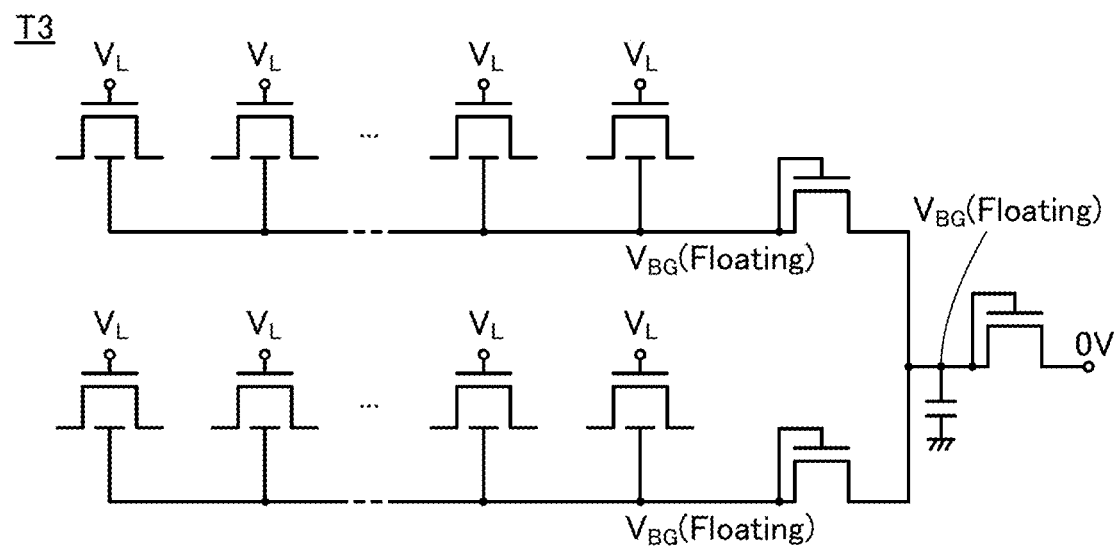
FIGS. 4A and 4B show operations of a semiconductor device.

In FIG. 4A, the voltage generation circuit 14 stops generating $V_{BG}$. Thus, the voltage between the voltage generation circuit 14 and the transistor RM becomes the reference voltage (0 V). $V_{BG}$ of the node $N_{VR}$ is lower than the reference voltage (0 V). The transistor functioning as a diode is turned off. The node $N_{VR}$ is brought into an electrically floating state. The off-state current of the transistor RM is extremely low. Thus, $V_{BG}$ of the node $N_{VR}$ can be retained for a long time. $V_{BG}$ of the back gate line BGL_1 becomes equal to $V_{BG}$ of the node $N_{VR}$. The transistor functioning as a diode is turned off. The back gate line BGL_1 is brought into an electrically floating state. Furthermore, the off-state current of the transistor RM1 is extremely low. Thus, $V_{BG}$ of the back gate line BGL_1 can be retained for a long time.

Figure 4B:
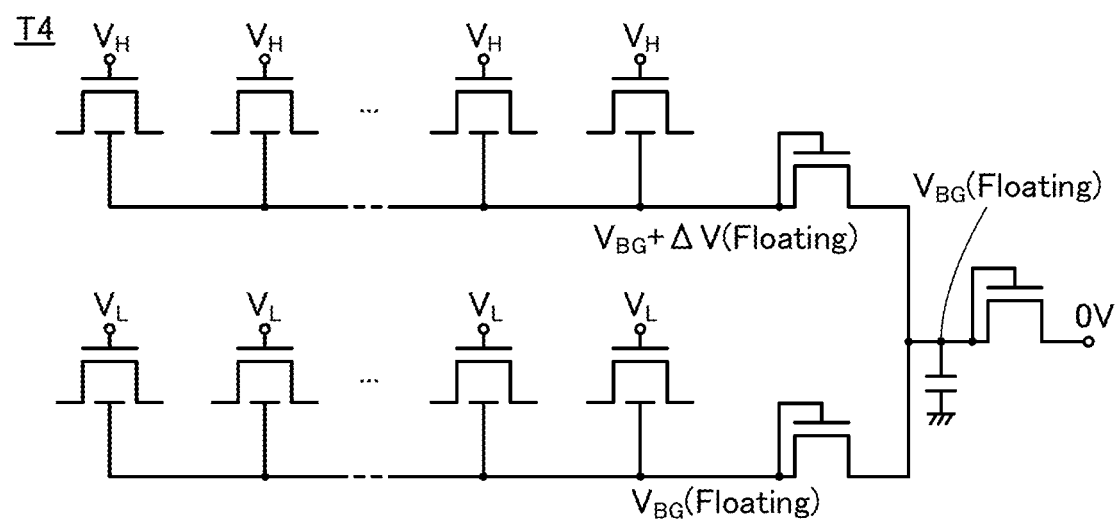

In FIG. 4B, the word line WL_1 is set to $V_H$ and the word line WL_2 is set to $V_L$. The voltage of the back gate line BGL_1 is raised from $V_{BG}$ to $\Delta V$ by capacitive coupling because the back gate line BGL_1 is in an electrically floating state. Although the back gate line BGL_2 is in an electrically floating state, the voltage of the back gate line BGL_2 remains at $V_{BG}$ due to the capacitive coupling generated between the word line WL_1 and the back gate line BGL_2 being small. Note that the voltage of the back gate line BGL_2 changes in some cases due to a change in voltage of the bit line BL, the node SN, or the like other than the word line WL_2.

Figure 5A:
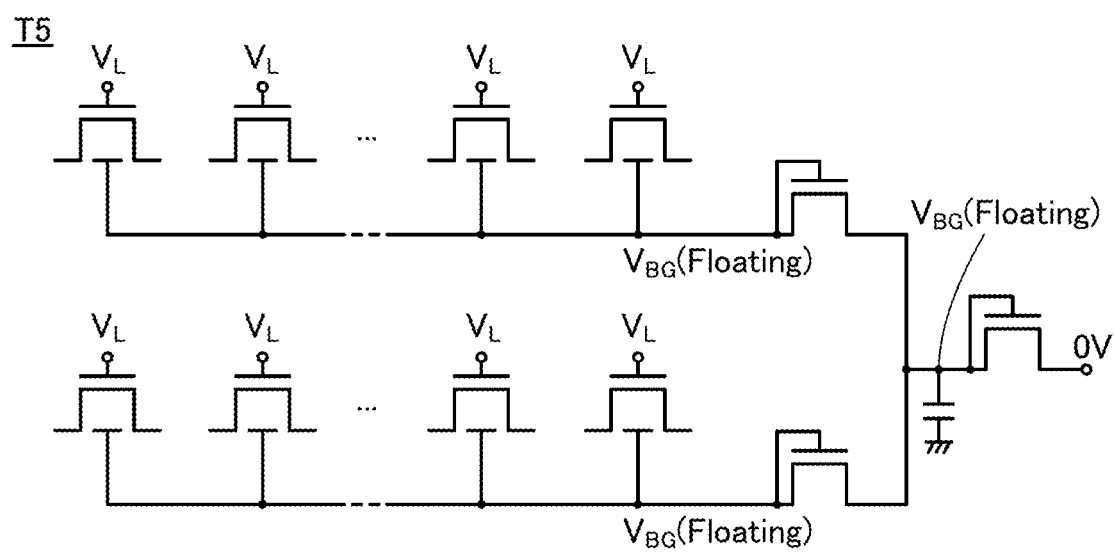
FIGS. 5A and 5B show operations of a semiconductor device.

In FIG. 5A, the word line WL_1 is set to $V_L$ and the word line WL_2 is set to $V_L$. The voltage of the back gate line BGL_1 becomes $V_{BG}$ by returning the word line WL_1 to $V_L$ because the back gate line BGL_1 is in an electrically floating state.

Figure 5B:
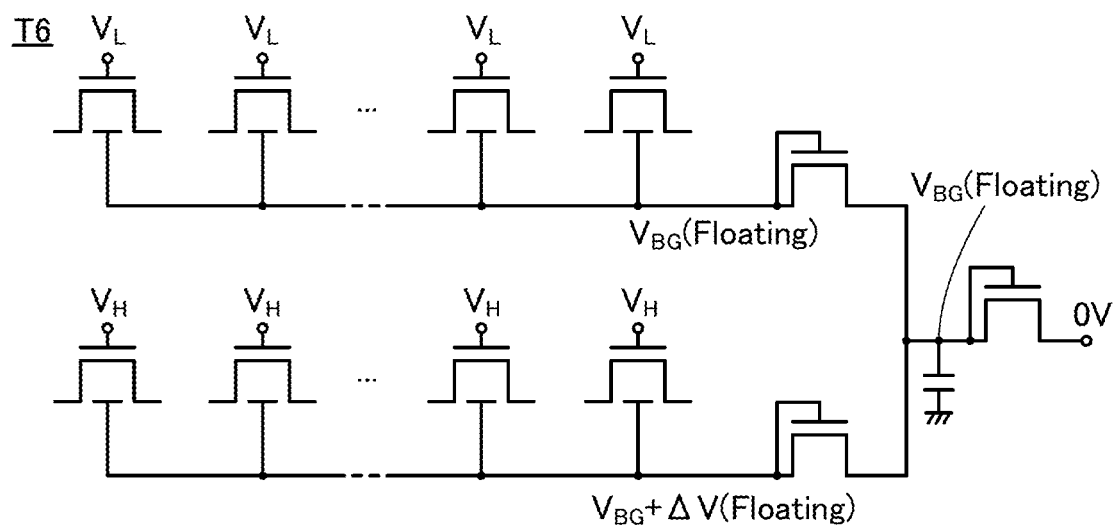

In FIG. 5B, the word line WL_1 is set to $V_L$ and the word line WL_2 is set to $V_H$. The voltage of the back gate line BGL_2 is raised from $V_{BG}$ to $\Delta V$ by capacitive coupling because the back gate line BGL_2 is in an electrically floating state. Although the back gate line BGL_1 is in an electrically floating state, the voltage of the back gate line BGL_1 remains at $V_{BG}$ due to the capacitive coupling generated between the word line WL_2 and the back gate line BGL_1 being small. Note that the voltage of the back gate line BGL_1 changes in some cases due to a change in voltage of a bit line BL, the node SN, or the like other than the word line WL_1.

Figure 6:
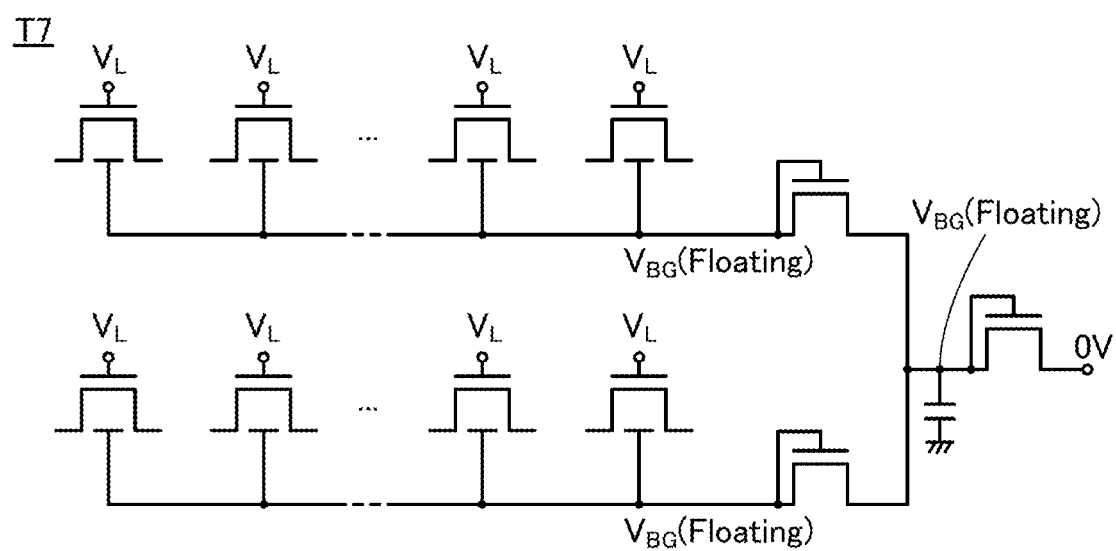
FIG. 6 shows an operation of the semiconductor device.

In FIG. 6, the word line WL_1 is set to $V_L$ and the word line WL_2 is set to $V_L$. The voltage of the back gate line BGL_2 becomes $V_{BG}$ by returning the word line WL_2 to $V_L$ because the back gate line BGL_2 is in an electrically floating state.

In one embodiment of the present invention, as described above, without continuously supplying the back gate voltage to the gate lines BGL_1 and BGL_2 the back gate lines BGL_1 and BGL_2 are brought into an electrically floating state in a period in which the peripheral circuits 12 perform writing and reading of a data voltage to and from memory cells MC. With such a structure, the voltage of the back gate line BGL can be increased only by capacitive coupling between the word line WL and the back gate line in a period in which the word signal is set to a high-level voltage. With such a structure, even when the high-level voltage of the word signal is lowered, the on-state current when the transistors M1_1, M1_2, M2_1 and M2_2 are turned on can be increased, and the amplitude voltage of the word signal can be lowered, thereby reducing the power consumption.

In addition, in one embodiment of the present invention, the back gate line BGL_1 and the back gate line BGL_2 are separately brought into an electrically floating state. In other words, the back gate line BGL_1 and the back gate line BGL_2 are each brought into an electrically floating state. When the voltage of the back gate line BGL_1 is increased by capacitive coupling by setting the word signal of the word line WL_1 to a high-level voltage, the increase of the voltage of the back gate line BGL_2 by capacitive coupling can be reduced in the case of setting the word signal of the word line WL_2 to a low-level voltage, so that a change in the initially supplied back gate voltage can be prevented. With such a structure, a decrease in the on-state current of the transistor to which the word signal set to a high-level voltage is supplied can be prevented, and an extremely low off-state current of the transistor to which the word signal set to a low-level voltage is supplied can be maintained.

<Modification Example>

A modification example of the structure shown in the above-described FIGS. 1A and 1B, FIGS. 2A and 2B, FIGS. 3A and 3B, FIGS. 4A and 4B, FIGS. 5A and 5B, and FIG. 6 will be described with reference to FIGS. 7A and 7B, FIGS. 8A to 8D, FIG. 9, and FIGS. 10A and 10B.

It is preferable that the back gate lines BGL_1 and BGL_2 shown in FIG. 2A have a large capacitance owing to the capacitor so that a voltage which has been supplied can easily be retained. On the other hand, when the capacitance of the back gate lines BGL_1 and BGL_2 is large, an increase in voltage of the back gate lines due to capacitive coupling between the word line and the back gate line can hardly be achieved. Thus, a structure is preferable in which the capacitor $C_{VR}$ for retaining the voltage of the back gate lines BGL_1 and BGL_2 is provided at the node $N_{VR}$ connected through the transistors RM1 and RM2.

In order to increase the back gate line by capacitive coupling between the word line and the back gate line, the parasitic capacitance of the back gate line in an electrically floating state is preferably reduced. The parasitic capacitance of the back gate line and the capacitance between the word line and the back gate line will be described with reference to FIGS. 7A and 7B.

Figure 7A:
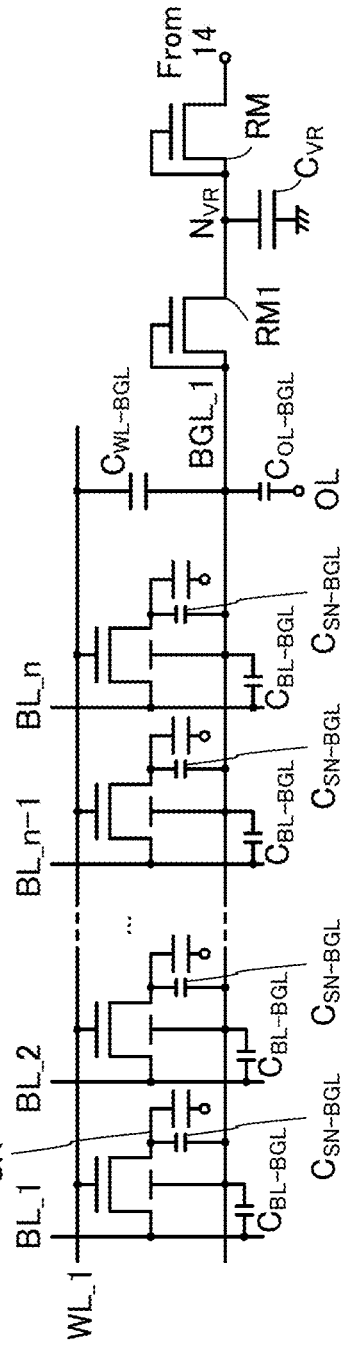
FIGS. 7A and 7B illustrate a structure of a semiconductor device.

As shown in FIG. 7A, the back gate line BGL_1 has a capacitance $C_{WL\text{-}BGL}$ between the word line WL_1 and the back gate line BGL_1, a capacitance $C_{BL\_BGL}$ between each of the bit lines BL_1 to BL_$n$ and the back gate line BGL_1, a capacitance $C_{SX\text{-}BGL}$ between each of the nodes SN and the back gate line BGL_1, and a capacitance $C_{OL\text{-}BGL}$ between another wiring OL and the back gate line BGL_1 (another wiring such as BL, WL, or the like which is not adjacent).

Figure 7B:
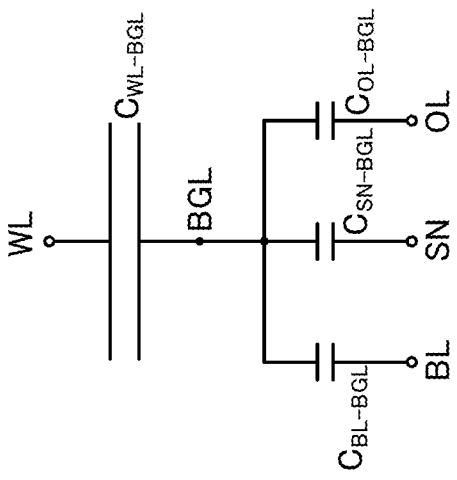

FIG. 7B is an equivalent circuit diagram showing the above-described back gate line BGL having the capacitance $C_{WL\text{-}BGL}$, the capacitance $C_{BL\text{-}BGL}$, the capacitance $C_{SN\text{-}BGL}$, and the capacitance $C_{OL\text{-}BGL}$. In order to change the voltage of the back gate line BGL in an electrically floating state depending on a change in voltage of the word line WL, a structure in which the capacitance $C_{WL\text{-}BGL}$ is larger than the capacitance $C_{BL\text{-}BGL}$, the capacitance $C_{SN\text{-}BGL}$, and the capacitance $C_{OL\text{-}BGL}$ is preferable. Specifically, it is preferable that the capacitance $C_{WL\text{-}BGL}$ be larger than or equal to 1.2 times the total capacitance of the capacitance $C_{BL\text{-}BGL}$, the capacitance $C_{SN\text{-}BGL}$, and the capacitance $C_{OL\text{-}BGL}$.

The capacitance $C_{WL\text{-}BGL}$ is designed to be large by increasing the capacitance between the word line WL and the back gate line BGL. An example will be described with reference to FIGS. 8A to 8D and FIG. 9.

Figure 8A:
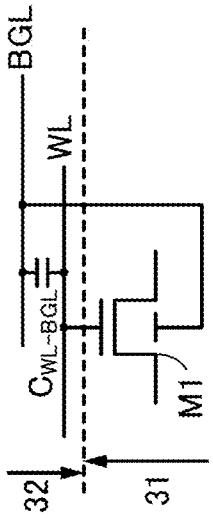
FIGS. 8A to 8D illustrate structures of a semiconductor device.

As shown in FIG. 8A, a layer 32 including the word line WL and the back gate line BGL ("WL+BGL Layer" in the drawing) is arranged over a layer 31 provided with the transistor M1 included in the memory cell MC ("Transistor Layer" in the drawing).

Figure 8B:
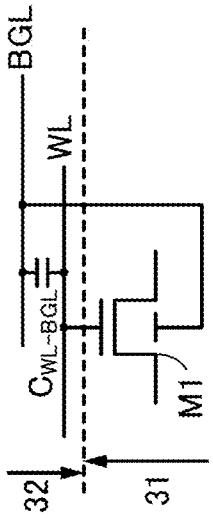

FIG. 8B is a simple circuit diagram corresponding to FIG. 8A. With the structure in FIG. 8A, the word line WL and the back gate line BGL can be arranged parallel to each other, so that the capacitance $C_{WL\text{-}BGL}$ can be increased, as shown in FIG. 8B.

Figure 8C:

Alternatively, as shown in FIG. 8C, a layer 34 provided with the transistor M1 included in the memory cell MC ("Transistor Layer" in the drawing) is arranged over a layer 33 including the back gate line BGL ("BGL Layer" in the drawing), and a layer 35 including the word line WL ("WL Layer" in the drawing) is arranged thereover.

Figure 8D:
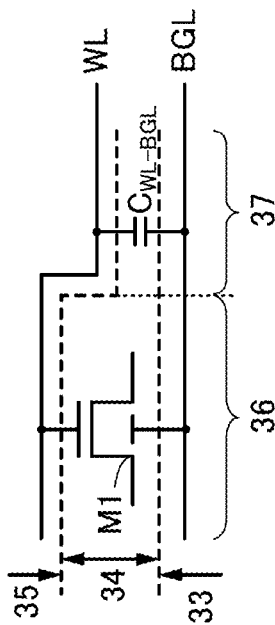

FIG. 8D is a simple circuit diagram corresponding to FIG. 8C. With the structure in FIG. 8C, the word line WL and the back gate line BGL can be arranged so that they overlap each other, so that the capacitance $C_{WL\text{-}BGL}$ can be increased, as shown in FIG. 8D. Furthermore, a structure is preferable in which a region 36 provided with the transistor M1 and a region 37 having the capacitor $C_{WL\text{-}BGL}$ are divided. With such a structure, the transistor M1 is provided in the region 36 where the insulating layer in the layer 34 is thick, and the capacitor $C_{WL\text{-}BGL}$ is provided in the region 37 where the insulating layer in the layer 34 is thin and the word line WL and the back gate line BGL are close to each other and overlap each other, thereby increasing the capacitance $C_{WL\text{-}BGL}$.

Figure 9:
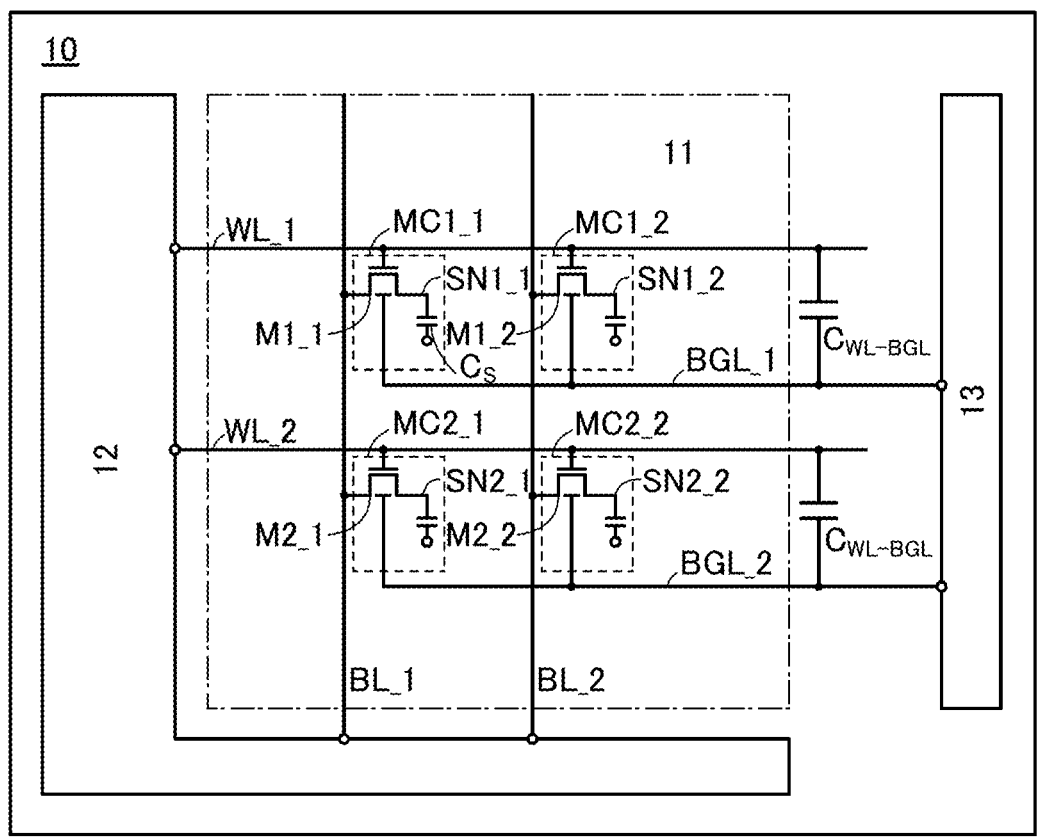
FIG. 9 illustrates a structure of a semiconductor device.

Alternatively, as shown in FIG. 9, a structure in which the capacitor $C_{WL\text{-}BGL}$ formed between the back gate line BGL and the word line WL is provided outside the memory cell array 11 may be used. With such a structure, a capacitor $C_{WL\text{-}BGL}$ with a large capacitance can be formed regardless of the inner layout or the like of the memory cell array 11.

Figure 10A:
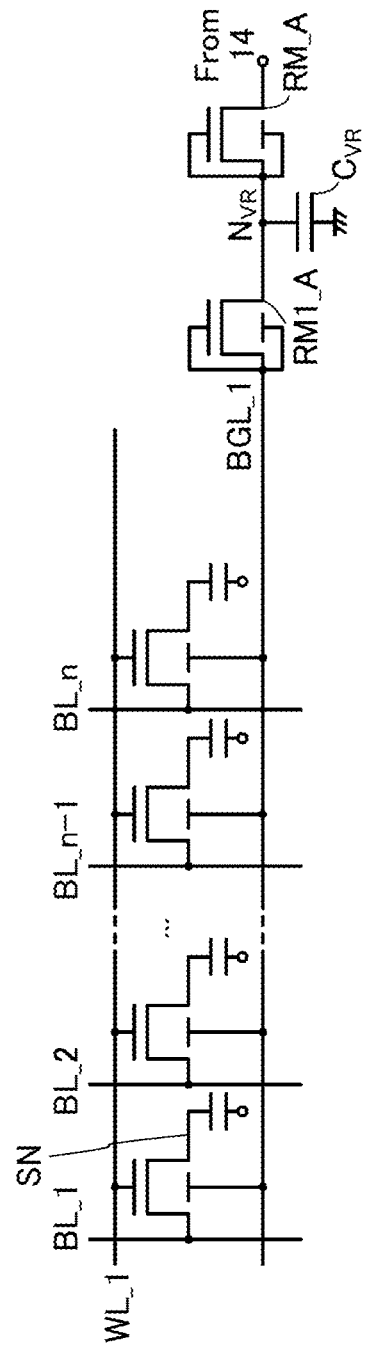
FIGS. 10A and 10B illustrate structures of a semiconductor device.

Note that the transistors RM and RM1 in FIGS. 2A and 2B have a top-gate structure or a bottom gate structure without a back gate electrode; however they are not limited thereto. As shown in FIG. 10A, transistors RM_A and RM1_A having a back gate electrode may be used, for example. With the structure shown in FIG. 10A, the amount of current flowing through the transistors RM_A and RM1_A can be increased, and the back gate line BGL can be set to $V_{BG}$ in a short period of time.

Figure 10B:
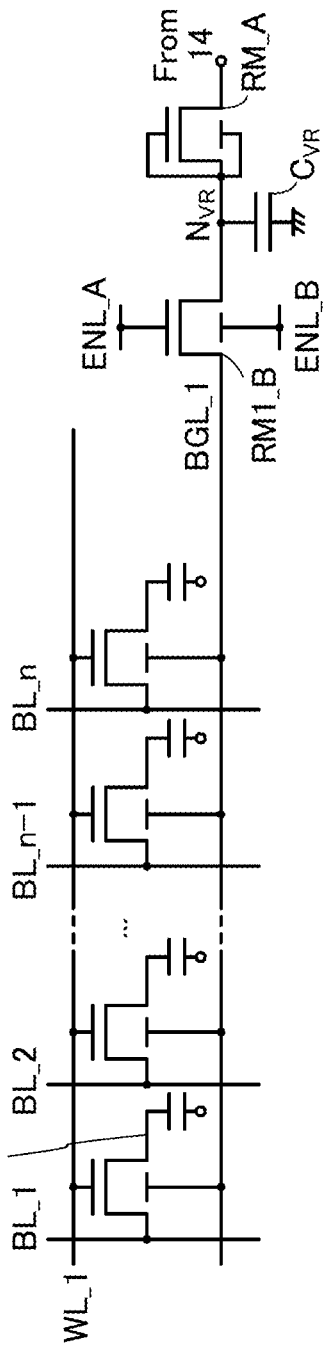

Alternatively, as shown in FIG. 10B, the transistor RM1_A in FIG. 10A may be replaced with a transistor RM1_B whose gate electrode is connected to a wiring ENL_A and whose back gate electrode is connected to a wiring ENL_B. The wiring ENL_A and the wiring ENL_B are preferably supplied with different control signals. For example, the control signals supplied to the wiring ENL_A and the wiring ENL_B turn the transistor RM1_B off when a word signal is supplied to the word line WL, and during other periods the transistor RM1_B is turned on. With the structure shown in FIG. 10B, the state of the transistor RM1_B can be easily controlled from the outside.

<Configuration Example of Voltage Generation Circuit 14>

Figure 11A:
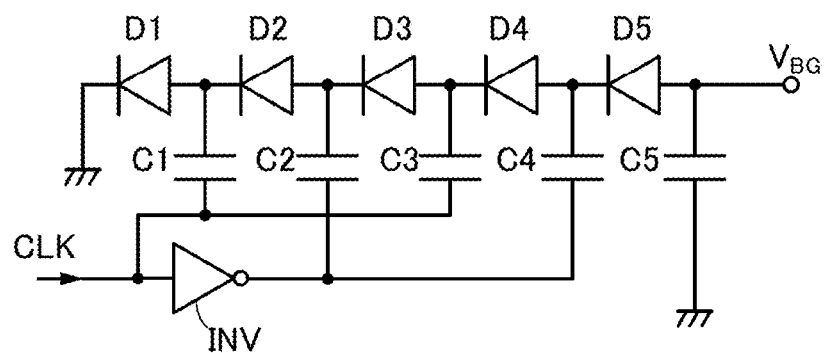
FIGS. 11A to 11C illustrate structures of a semiconductor device.

FIG. 11A illustrates an example of a circuit configuration applicable to the above-described voltage generation circuit 14.

A voltage generation circuit 14A illustrated in FIG. 11A is a four-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage VDD and the ground voltage (0 V), the voltage $V_{BG}$, which has been reduced from 0 V to a negative voltage having a negatively quadrupled value of the voltage VDD by application of the clock signal CLK, can be obtained. Note that a forward voltage of the diodes D1 to D5 is 0 V. A desired voltage $V_{BG}$ can be obtained by changing the number of stages of the charge pump.

The circuit configuration of the above-described voltage generation circuit 14A is not limited to the structure of the circuit diagram illustrated in FIG. 11A. Modification examples of the voltage generation circuit 14A are shown in FIGS. 11B and 11C.

Figure 11B:
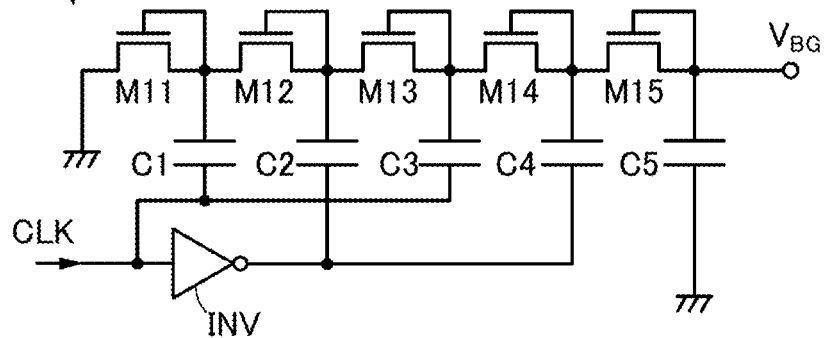

A voltage generation circuit 14B in FIG. 11B has a configuration in which the diodes D1 to D5 of the voltage generation circuit 14A in FIG. 11A are replaced with diode-connected transistors M11 to M15. In the voltage generation circuit 14B in FIG. 11B, when OS transistors are used as the transistors M11 to M15, the off-state current can be reduced, so that leakage of charge retained in the capacitors C1 to C5 can be inhibited. Thus, it becomes possible to efficiently lower the voltage from 0 V to $V_{BG}$.

Figure 11C:
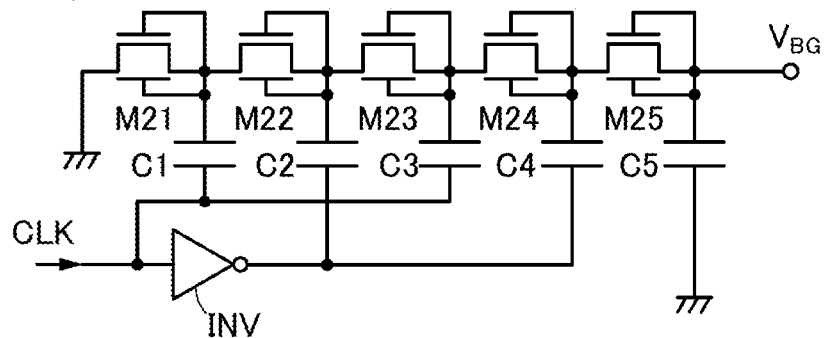

A voltage generation circuit 14C illustrated in FIG. 11C has a configuration in which the transistors M11 to M15 of the voltage generation circuit 14B in FIG. 11B are replaced with transistors M21 to M25 having back gate electrodes. In the voltage generation circuit 14C shown in FIG. 11C, the back gate electrodes can be supplied with voltages that are the same as those supplied to the gate electrodes, so that the amount of current flowing through the transistors can be increased. Thus, it becomes possible to efficiently lower the voltage from 0 V to $V_{BG}$.

<Structural Example of Memory Cell MC>

FIGS. 12A to 12E illustrate examples of a circuit configuration that the memory cell MC in FIG. 1A can have. In the circuit diagrams of memory cells illustrated in FIGS. 12A to 12E, a data voltage is written from a source line SL or the bit line BL, and controlling the voltages of a write word line WWL and a read word line RWL can control writing or reading of the data voltage.

Figure 12A:
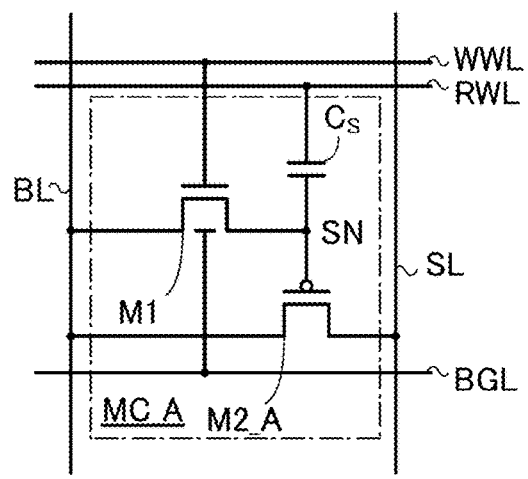
FIGS. 12A to 12E illustrate structures of a semiconductor device.

A memory cell MC_A illustrated in FIG. 12A includes a transistor M1, a transistor M2_A, and a capacitor $C_S$. The transistor M1 includes a back gate electrode, and a voltage supplied to the back gate electrode can be controlled by the back gate line BGL. The transistor M2_A is a p-channel transistor. Turning off the transistor M1 allows a charge based on a data voltage to be retained at the node SN. The transistor M2_A controls the current depending on a charge corresponding to a retained data voltage. The memory cell MC in FIG. 1A can employ the configuration in FIG. 12A.

Figure 12B:
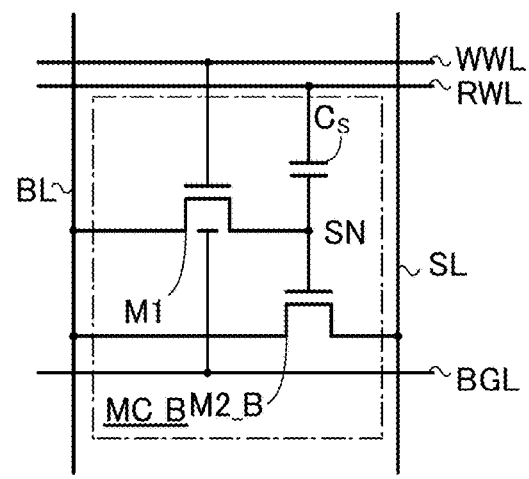

A memory cell MC_B shown in FIG. 12B includes the transistor M1, a transistor M2_B, and the capacitor $C_S$. FIG. 12B is different from FIG. 12A in that the transistor M2_B is an n-channel transistor. The memory cell MC in FIG. 1A can employ the configuration in FIG. 12B.

Figure 12C:
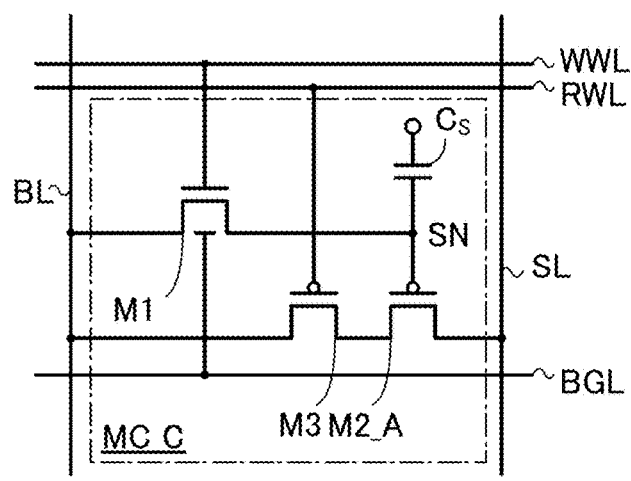

A memory cell MC_C illustrated in FIG. 12C includes the transistor M1, the transistor M2_A, a transistor M3, and the capacitor $C_S$. FIG. 12C is different from FIG. 12A in that the memory cell MC_C includes the transistor M3. The transistor M3 is, like the transistor M2_A, a p-channel transistor. Turning off the transistor M3 makes it possible to control the current flowing between the bit line BL and the source line SL. The memory cell MC in FIG. 1A can employ the configuration in FIG. 12C.

Figure 12D:
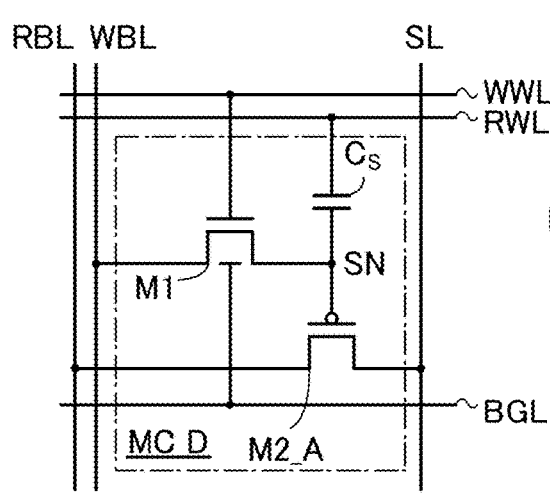

A memory cell MC_D shown in FIG. 12D includes the transistor M1, the transistor M2_A, and the capacitor $C_S$. The transistor M1 is connected to a write bit line WBL, and the transistor M2_A is connected to a read bit line RBL. In the configuration in FIG. 12D, for example, the read bit line RBL can be used to read out a data voltage, and the write bit line WBL can be used to write a data voltage. The memory cell MC in FIG. 1A can employ the configuration in FIG. 12D.

Figure 12E:
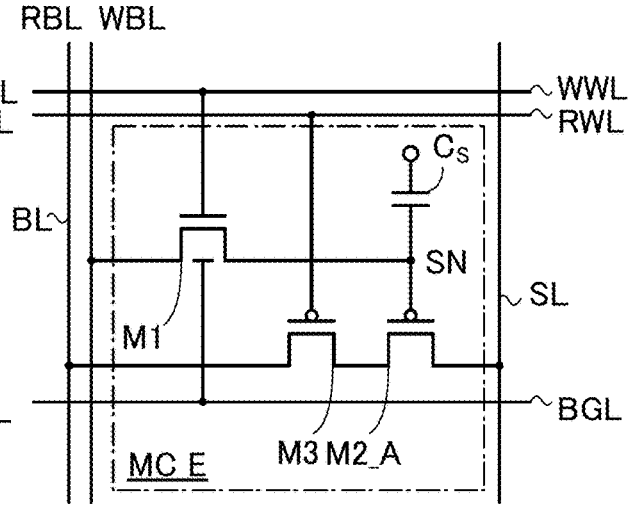

A memory cell MC_E shown in FIG. 12E includes the transistor M1, the transistor M2_A, the transistor M3, and the capacitor $C_S$. FIG. 12E is different from FIG. 12A in that the memory cell MC_E includes the transistor M3. The transistor M3 is, like the transistor M2_A, a p-channel transistor. Turning off the transistor M3 makes it possible to control the current flowing between the bit line BL and the source line SL. Additionally, the transistor M1 is connected to a write bit line WBL, and the transistor M2_A is connected to a read bit line RBL in the memory cell MC_E shown in FIG. 12E. In the configuration in FIG. 12E, for example, the read bit line RBL can be used to read out a data voltage, and the write bit line WBL can be used to write a data voltage. The memory cell MC in FIG. 1A can employ the configuration in FIG. 12E.

Figure 13B:
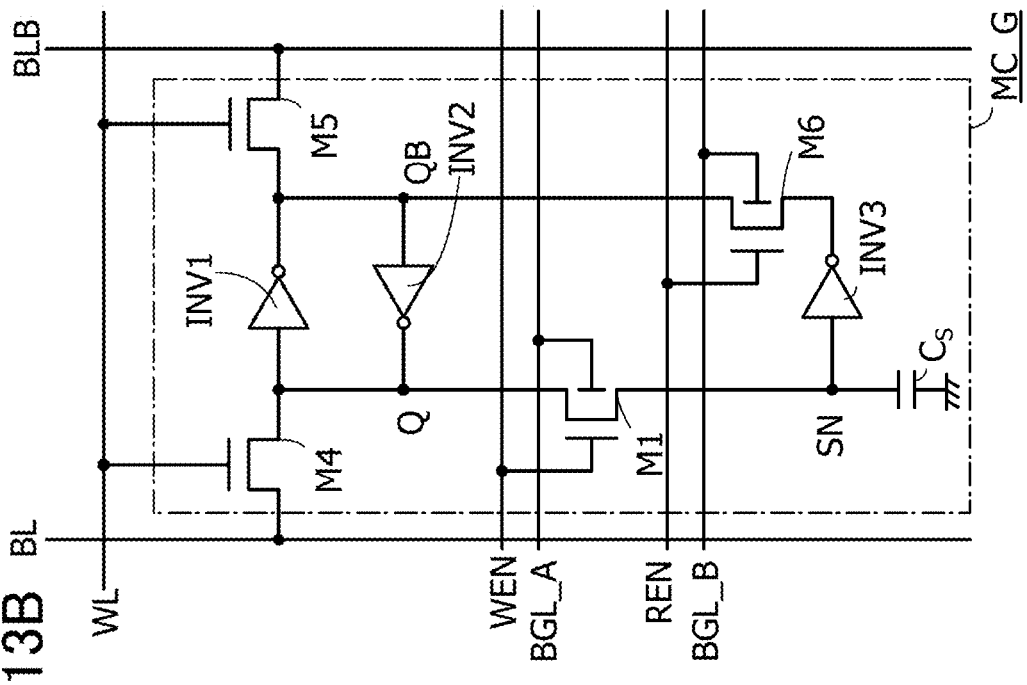
FIGS. 13A and 13B illustrate structures of a semiconductor device.
Figure 13A:
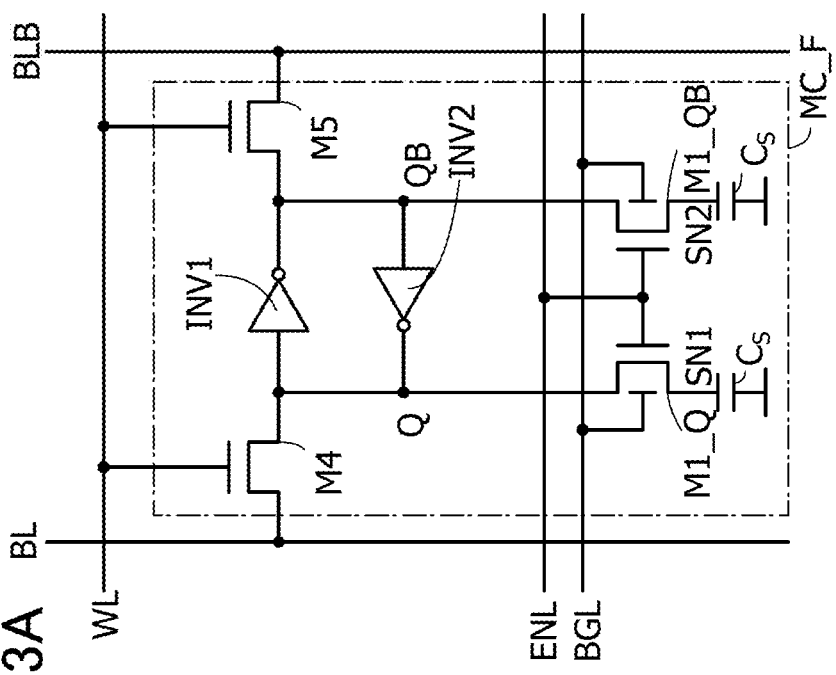

A memory cell MC_F shown in FIG. 13A includes transistors M4 and M5, inverters INV1 and INV2, transistors M1_Q and M1_QB, and the capacitors $C_S$ which form an SRAM (Static Random Access Memory).

The memory cell MC_F controls a control line ENL so that the data voltages of nodes Q and QB of the SRAM are backed up in nodes SN1 and SN2, and the data voltages are recovered from the nodes SN1 and SN2 to the nodes Q and QB. The transistors M1_Q and M1_QB each include a back gate electrode, and a voltage supplied to the back gate electrode can be controlled by the back gate line BGL. Turning off the transistors M1_Q and M1_QB allows charges based on a data voltages to be retained at the nodes SN1 and SN2. The memory cell MC in FIG. 1A can employ the configuration in FIG. 13A.

A memory cell MC_G shown in FIG. 13B includes transistors M4 and M5, inverters INV1 and INV2, transistors M1 and M6, the capacitors $C_S$, and an inverter INV3 which form an SRAM (Static Random Access Memory).

The memory cell MC_G controls a write control line WEN so that the data voltage of the node Q of the SRAM is backed up in the node SN. The memory cell MC_F controls a read control line REN, thus controlling the recovery of the data voltage from the node SN to the node QB through the inverter INV3. The transistor M1 includes a back gate electrode, and a voltage supplied to the back gate electrode can be controlled by a back gate line BGL_A. The transistor M6 includes a back gate electrode, and a voltage supplied to the back gate electrode can be controlled by a back gate line BGL_B. Turning off the transistor M1 allows a charge based on a voltage data to be retained at the node SN. Turning off the transistor M6 allows a leakage current from the node QB to be suppressed. The memory cell MC in FIG. 1A can employ the configuration in FIG. 13B.

As described above, one embodiment of the present invention can operate by utilizing a variety of structures.

(Embodiment 2)

In this embodiment, a structure will be described in which transistors having different electrical characteristics are provided over the same layer. With such a structure, the degree of freedom in design of a semiconductor device can be increased. Additionally, the degree of integration in the semiconductor device can be increased by providing transistors having different electrical characteristics over the same layer.

As electrical characteristics of the transistor, threshold voltage ($V_{th}$) can be given. In this embodiment, structural examples of transistors having different $V_{th}$ provided over the same layer will be described.

<Structure Example of Semiconductor Device 1000>

Figure 14A:
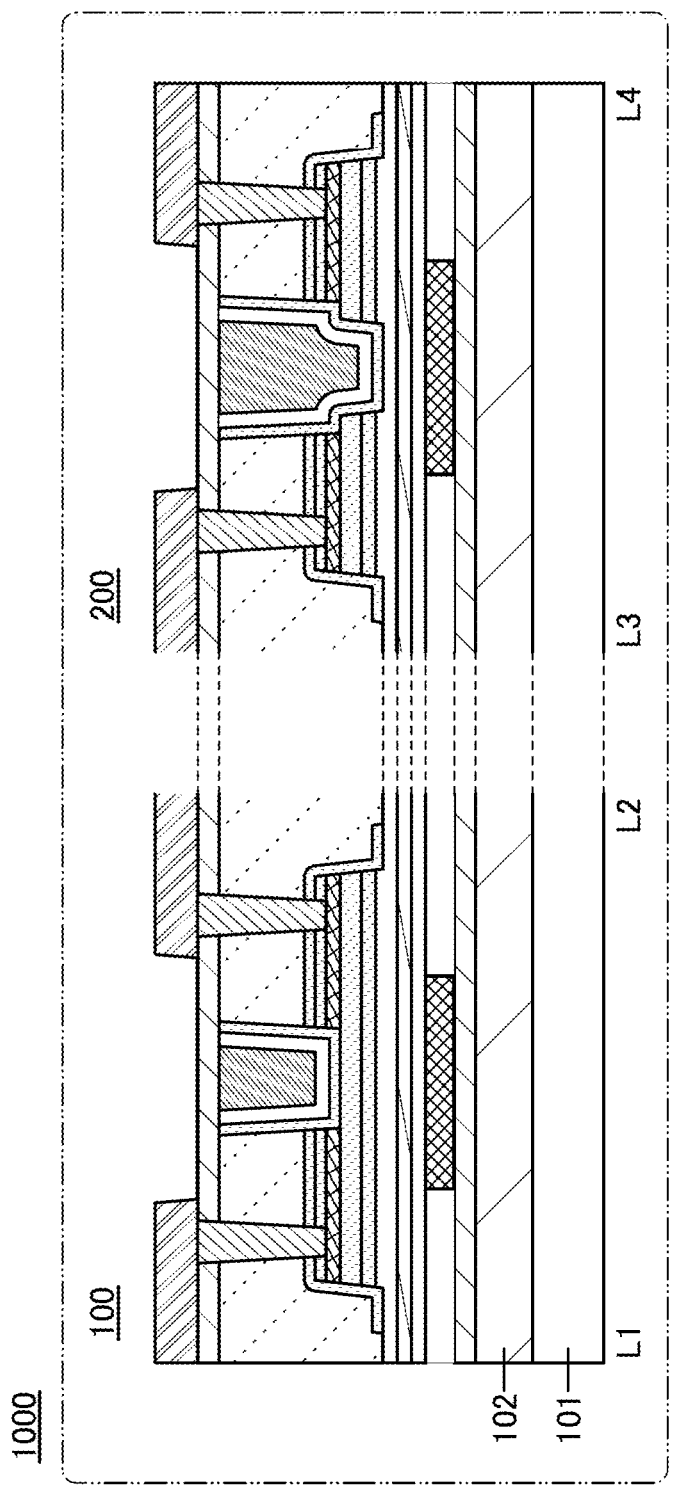
FIGS. 14A to 14C illustrate a semiconductor device and electrical characteristics of the semiconductor device.

FIG. 14A is a cross-sectional view of a semiconductor device 1000. The semiconductor device 1000 includes a transistor 100 and a transistor 200. The transistors 100 and 200 have different structures. FIG. 14A illustrates cross sections of the transistors 100 and 200 over a substrate 101. FIG. 14A corresponds to a cross-sectional view taken along dashed-dotted line L1-L2 in FIG. 15A and a cross-sectional view taken along dashed-dotted line L3-L4 in FIG. 16A.

FIG. 15A is a plan view of the transistor 100. FIG. 15B is a cross-sectional view taken along dashed-dotted line L1-L2 and a cross-sectional view taken along dashed-dotted line W1-W2 in FIG. 15A. In FIG. 15B, the cross-sectional view along L1-L2 is taken in the channel length direction of the transistor 100 and the cross-sectional view along W1-W2 is taken in the channel width direction of the transistor 100. FIG. 15C is an enlarged view of a portion 131 in FIG. 15B. FIG. 15D is an enlarged view of a portion 132 in FIG. 15B.

Figure 16A:
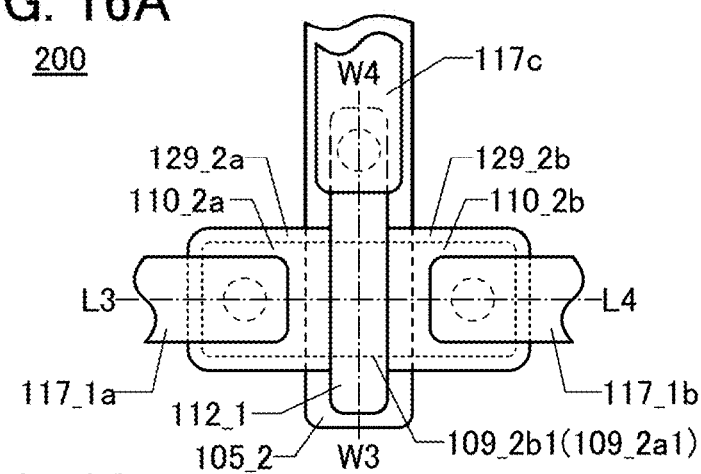
FIGS. 16A to 16C illustrate a transistor.
Figure 16B:
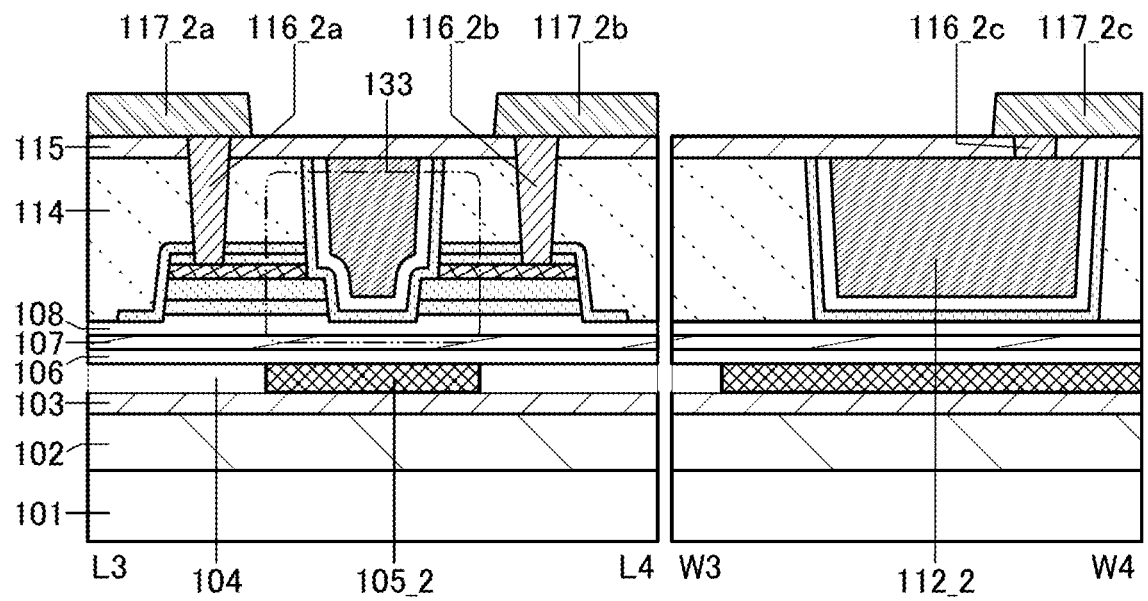
Figure 16C:
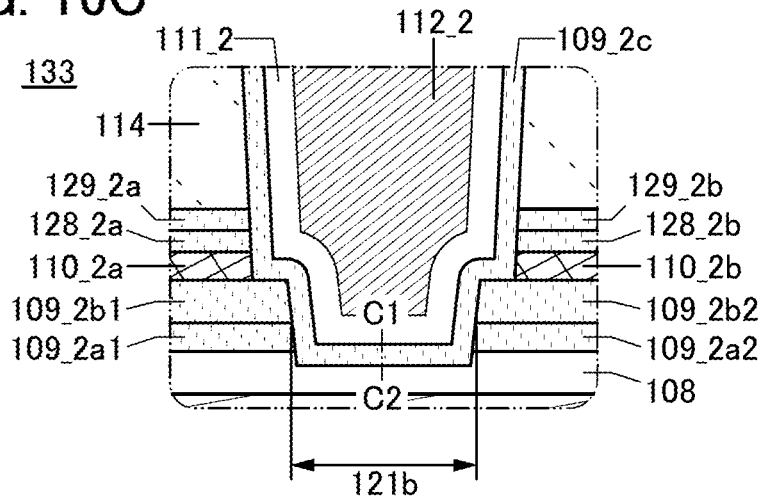

FIG. 16A is a plan view of the transistor 200. FIG. 16B is a cross-sectional view taken along dashed-dotted line L3-L4 and a cross-sectional view taken along dashed-dotted line W3-W4 in FIG. 16A. In FIG. 16B, the cross-sectional view along L3-L4 is taken in the channel length direction of the transistor 200 and the cross-sectional view along W3-W4 is taken in the channel width direction of the transistor 200. FIG. 16C is an enlarged view of a portion 133 in FIG. 16B.

Figure 14C:
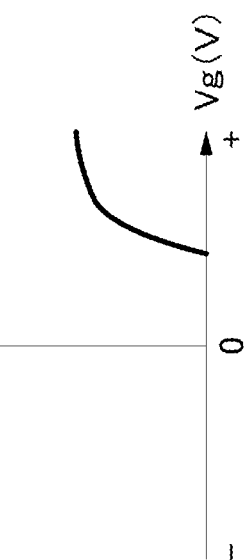
Figure 14B:
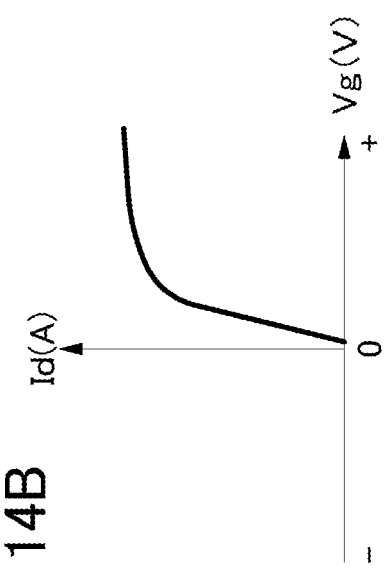

FIGS. 14B and 14C each show a $V_g$-$I_d$ curve, which is one of the electrical characteristics of a transistor. The horizontal axes of the $V_g$-$I_d$ curves shown in FIGS. 14B and 14C represent a potential difference ($V_g$) between a gate and a source regarded as a reference. The vertical axis represents current flowing to a drain ($I_d$) of the transistor on a logarithmic scale.

The transistors 100 and 200 are each a transistor including a back gate. FIG. 14B shows the $V_g$-$I_d$ curve of the transistor 100 in the case where the back gate is set to the same potential as the source or the gate. FIG. 14C shows the $V_g$-$I_d$ curve of the transistor 200 in the case where the potential of the back gate is set to the same as that of the source or the gate. As shown in FIGS. 14B and 14C, the transistors 100 and 200 have different transistor characteristics. The $V_g$ in the $V_g$-$I_d$ curve of the transistor 200 is shifted in the positive direction compared with that in the $V_g$-$I_d$ curve of the transistor 100. In other words, the transistor 200 has higher $V_{th}$ than the transistor 100.

The transistors 100 and 200 will be described with reference to the drawings.

[Transistor 100]

The transistor 100 is a kind of top-gate transistor. The transistor 100 includes an electrode 105_1, an insulating layer 106, an insulating layer 107, an insulating layer 108, a semiconductor layer 109_1a, a semiconductor layer 109_1b, a semiconductor layer 109_1c, an electrode 110_1a, an electrode 110_1b, a layer 128_1a, a layer 128_1b, a layer 129_1a, a layer 129_1b, an insulating layer 111_1, and an electrode 112_1 (see FIGS. 15A to 15C).

The transistor 100 illustrated in FIGS. 15A to 15C is provided over the substrate 101 with an insulating layer 102 and an insulating layer 103 located therebetween. Specifically, an insulating layer 104 is provided over the insulating layer 103, and the electrode 105_1 is embedded in a portion from which the insulating layer 104 has been removed. The insulating layer 106 is provided over the electrode 105_1 and the insulating layer 104, the insulating layer 107 is provided over the insulating layer 106, and the insulating layer 108 is provided over the insulating layer 107. The insulating layer 108 has a projection, the semiconductor layer 109_1a is provided over the projection, and the semiconductor layer 109_1b is provided over the semiconductor layer 109_1a.

Furthermore, the electrodes 110_1a and 110_1b are provided over the semiconductor layer 109_1b. One of the electrodes 110_1a and 110_1b can function as one of a source electrode and a drain electrode, and the other electrode can function as the other of the source electrode and the drain electrode. Thus, a region of the semiconductor layer 109_1b overlapping with the electrode 110_1a can function as one of a source region and a drain region of the transistor 100. A region of the semiconductor layer 109_1b overlapping with the electrode 110_1b can function as the other of the source region and the drain region of the transistor 100. Thus, a region 121a of the semiconductor layer 109_1b that is sandwiched between the electrode 110_1a and the electrode 110_1b when seen in the plan view can function as a channel formation region.

Furthermore, the layer 128_1a is provided over the electrode 110_1a, and the layer 129_1a is provided over the layer 128_1a. Part of a side surface of the electrode 110_1a, part of a side surface of the layer 128_1a, part of a side surface of the semiconductor layer 109_1b, and part of a side surface of the semiconductor layer 109_1a are covered with the layer 129_1a.

Furthermore, the layer 128_1b is provided over the electrode 110_1b, and the layer 129_1b is provided over the layer 128_1b. Part of a side surface of the electrode 110_1b, part of a side surface of the layer 128_1b, part of a side surface of the semiconductor layer 109_1b, and part of a side surface of the semiconductor layer 109_1a are covered with the layer 129_1b.

An opening is provided in a region of an insulating layer 114 overlapping with the region 121a, and the semiconductor layer 109_1c is provided along the side and bottom surfaces of the opening. The semiconductor layer 109_1c is in contact with the semiconductor layer 109_1b at the bottom surface of the opening. In the opening, the insulating layer 111_1 is provided along the side and bottom surfaces of the opening with the semiconductor layer 109_1c located therebetween. In addition, the electrode 112_1 is provided in the opening with the semiconductor layer 109_1c and the insulating layer 111_1 located therebetween.

Note that the opening is wider than the semiconductor layer 109_1a and the semiconductor layer 109_1b in the cross section in the channel width direction. Thus, in the region 121a, side surfaces of the semiconductor layers 109_1a and 109_1b are covered with the semiconductor layer 109_1c.

An insulating layer 115 is provided over the insulating layer 114, and an electrode 117_1a, an electrode 117_1b, and an electrode 117_1c are provided over the insulating layer 115. The electrode 117_1a is electrically connected to the electrode 110_1a through an electrode 116_1a in an opening formed by removing portions of the insulating layers 115 and 114 and the layers 129_1a and 128_1a. The electrode 117_1b is electrically connected to the electrode 110_1b through an electrode 116_1b in an opening formed by removing portions of the insulating layers 115 and 114 and the layers 129_1b and 128_1b. The electrode 117_1c is electrically connected to the electrode 112_1 through an electrode 116_1c in an opening formed by removing a portion of the insulating layer 115.

[S-Channel Structure]

As illustrated in FIG. 15B, the semiconductor layer 109_1b of the transistor 100 is located between the electrode 105_1 and the electrode 112_1 in the channel width direction. As described above, the insulating layer 108 has the projection. The semiconductor layer 109_1a and the semiconductor layer 109_1b are provided over the projection. By providing the projection, a bottom surface of the electrode 112_1 in a region not overlapping with the projection (a region not overlapping with the semiconductor layer 109_1b) can be closer to the substrate than a bottom surface of the semiconductor layer 109_1b. The height of the projection is preferably larger than or equal to the thickness of the insulating layer 111_1. Alternatively, the height of the projection is preferably larger than or equal to the sum of the thickness of the insulating layer 111_1 and the thickness of the semiconductor layer 109_1c. Thus, the side surface of the semiconductor layer 109_1b can be covered with the electrode 112_1.

In other words, the transistor 100 can have a structure in which the semiconductor layer 109_1b can be electrically surrounded by an electric field between the electrode 105_1 and the electrode 112_1. Such a structure of a transistor in which a semiconductor layer where a channel is formed is electrically surrounded by an electric field between conductive layers (the electrodes 105_1 and 112_1 in the transistor 100) is called a surrounded channel (s-channel) structure. In the transistor 100 having an s-channel structure, a channel can be formed in the whole (bulk) of the semiconductor layer 109_1b. In the s-channel structure, the drain current of the transistor can be increased, so that a larger amount of on-state current (current which flows between the source and the drain when the transistor is on) can be obtained. Furthermore, the entire channel formation region of the semiconductor layer 109_1b can be depleted by the electric field between the electrode 105_1 and the electrode 112_1. Accordingly, the off-state current of the s-channel transistor can be further reduced. When the channel width is shortened, the effects of the s-channel structure, such as an increase in on-state current and a reduction in off-state current, can be enhanced.

[Gate Electrode and Back Gate Electrode]

One of the electrodes 105_1 and 112_1 can function as a gate electrode and the other can function as a back gate electrode. In general, a gate electrode and a back gate electrode are formed using a conductive layer and positioned so that the channel formation region of a semiconductor layer is located between the gate electrode and the back gate electrode. Thus, the back gate electrode can function in a manner similar to that of the gate electrode. The potential of the back gate electrode may be the same as that of the gate electrode or may be a ground potential or a given potential. By changing the potential of the back gate electrode independently of the potential of the gate electrode, the threshold voltage of the transistor can be changed.

The electrode 105_1 and the electrode 112_1 can each function as a gate electrode. Thus, the insulating layers 106, 107, 108, and 111_1 can each function as a gate insulating layer.

In the case where one of the electrode 1051 and the electrode 112_1 is referred to as a "gate electrode" or a "gate", the other can be referred to as a "back gate electrode" or a "back gate". For example, in the transistor 100, in the case where the electrode 105_1 is referred to as a "gate electrode", the electrode 112_1 is referred to as a "back gate electrode". In the case where the electrode 112_1 is used as a "gate electrode", the transistor 100 can be regarded as a kind of bottom-gate transistor. Alternatively, one of the electrode 105_1 and the electrode 112_1 may be referred to as a "first gate electrode" or a "first gate", and the other may be referred to as a "second gate electrode" or a "second gate". Alternatively, one of the electrode 105_1 and the electrode 112_1 may be referred to as a "back gate", and the other may be referred to as a "front gate".

By providing the semiconductor layer 109_1b between the electrodes 105_1 and 112_1 and setting the electrodes 105_1 and 112_1 to the same potential, a region of the semiconductor layer 109_1*b* through which carriers flow is enlarged in the film thickness direction; thus, the number of transferred carriers is increased. As a result, the on-state current and the field-effect mobility of the transistor 100 are increased.

Therefore, the transistor 100 has a high on-state current for its area. That is, the area occupied by the transistor 100 can be small for required on-state current. Therefore, a semiconductor device having a high degree of integration can be provided.

Furthermore, the gate electrode and the back gate electrode are formed using conductive layers and thus each have a function of preventing an electric field generated outside the transistor from affecting the semiconductor layer where the channel is formed (in particular, an electric field blocking function against static electricity and the like). When the back gate electrode is formed larger than the semiconductor layer to cover the semiconductor layer in the plan view, the electric field blocking function can be enhanced.

Since the electrode 105_1 and the electrode 112_1 each have a function of blocking an external electric field, charges of charged particles and the like generated above the electrode 112_1 or below the electrode 105_1 do not influence the channel formation region in the semiconductor layer 109_1*b*. Thus, degradation by a stress test (e.g., a negative gate bias temperature (−GBT) stress test in which negative charges are applied to a gate) can be reduced. In addition, the electrode 105_1 and the electrode 112_1 can block an electric field generated by the drain electrode so as not to affect the semiconductor layer. Thus, changes in the rising voltage of on-state current due to changes in drain voltage can be suppressed. Note that this effect is significant when a potential is applied to each of the electrodes 105_1 and 112_1.

The GBT stress test is one kind of acceleration test and can evaluate, in a short period of time, a change by long-term use (i.e., a change over time) in the characteristics of a transistor. In particular, the amount of change in the threshold voltage of the transistor between before and after the GBT stress test is an important indicator when the reliability of the transistor is examined. If the amount of change in the threshold voltage between before and after the GBT stress test is small, the transistor has higher reliability.

By providing the electrodes 105_1 and 112_1 and setting the electrodes 105_1 and 112_1 to the same potential, the amount of change in threshold voltage is reduced. Accordingly, variation in electrical characteristics among a plurality of transistors is also reduced.

The transistor including the back gate electrode has a small change in threshold voltage by a positive GBT stress test in which positive charges are applied to a gate than a transistor including no back gate electrode.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

[Transistor 200]

The transistor 200 is a kind of top-gate transistor. The transistor 200 includes an electrode 105_2, the insulating layer 106, the insulating layer 107, the insulating layer 108, a semiconductor layer 109_2*a*1, a semiconductor layer 109_2*a*2, a semiconductor layer 109_2*b*1, a semiconductor layer 109_2*b*2, a semiconductor layer 109_2*c*, an electrode 110_2*a*, an electrode 110_2*b*, a layer 128_2*a*, a layer 128_2*b*, a layer 129_2*a*, a layer 129_2*b*, an insulating layer 111_2, and an electrode 112_2 (see FIGS. 16A to 16C).

The transistor 200 illustrated in FIGS. 16A to 16C is provided over the substrate 101 with the insulating layer 102 and the insulating layer 103 located therebetween. Specifically, the insulating layer 104 is provided over the insulating layer 103, and the electrode 105_2 is embedded in a portion from which the insulating layer 104 is removed. The insulating layer 106 is provided over the electrode 105_2 and the insulating layer 104, the insulating layer 107 is provided over the insulating layer 106, and the insulating layer 108 is provided over the insulating layer 107.

The insulating layer 108 includes a first projection and a second projection. The transistor 200 includes the semiconductor layer 109_2*a*1 over the first projection and the semiconductor layer 109_2*b*1 over the semiconductor layer 109_2*a*1. The transistor 200 includes the electrode 110_2*a* over the semiconductor layer 109_2*b*1, the layer 128_2*a* over the electrode 110_2*a*, and the layer 129_2*a* over the layer 128_2*a*. The transistor 200 includes the semiconductor layer 109_2*a*2 over the second projection and the semiconductor layer 109_2*b*2 over the semiconductor layer 109_2*a*2. The transistor 200 includes the electrode 110_2*b* over the semiconductor layer 109_2*b*2, the layer 128_2*b* over the electrode 110_2*b*, and the layer 129_2*b* over the layer 128_2*b*.

One of the electrode 110_2*a* and the electrode 110_2*b* can function as one of a source electrode and a drain electrode, and the other can function as the other of the source electrode and the drain electrode. Thus, one of the semiconductor layer 109_2*b*1 and the semiconductor layer 109_2*b*2 can function as one of a source region and a drain region of the transistor 200. The other of the semiconductor layer 109_2*b*1 and the semiconductor layer 109_2*b*2 can function as the other of the source region and the drain region of the transistor 200.

The layer 128_2*a* is provided over the electrode 110_2*a*, and the layer 129_2*a* is provided over the layer 128_2*a*. A part of a side surface of the electrode 110_2*a*, a part of a side surface of the layer 128_2*a*, a part of a side surface of the semiconductor layer 109_2*b*1, and a part of a side surface of the semiconductor layer 109_2*a*1 are covered with the layer 129_2*a*.

The layer 128_2*b* is provided over the electrode 110_2*b*, and the layer 129_2*b* is provided over the layer 128_2*b*. A part of a side surface of the electrode 110_2*b*, a part of a side surface of the layer 128_2*b*, a part of a side surface of the semiconductor layer 109_2*b*2, and a part of a side surface of the semiconductor layer 109_2*a*2 are covered with the layer 129_2*b*. A region 121*b* of the semiconductor layer 109_2*c* that is sandwiched between the semiconductor layer 109_2*b*1 and the semiconductor layer 109_2*b*2 when seen in the plan view can function as a channel formation region.

An opening is provided in a region of the insulating layer 114 overlapping with the region 121*b*. The semiconductor layer 109_2*c* is provided along the side and bottom surfaces of the opening. Portions of the semiconductor layers 109_2*b*1 and 109_2*b*2 are exposed in the opening. The semiconductor layer 109_2*c* is in contact with the semiconductor layer 109_2*b*1 and the semiconductor layer 109_2*b*2 in the opening. In the opening, the insulating layer 111_2 is provided along the side and bottom surfaces of the opening with the semiconductor layer 109_2*c* located therebetween. Furthermore, in the opening, the electrode 112_2 is provided with the semiconductor layer 109_2c and the insulating layer 111_2 located therebetween.

The insulating layer 115 is provided over the insulating layer 114, and an electrode 117_2a, an electrode 117_2b, and an electrode 117_2c are provided over the insulating layer 115. The electrode 117_2a is electrically connected to the electrode 110_2a through an electrode 116_2a in an opening formed by removing portions of the insulating layers 115 and 114 and the layers 129_2a and 128_2a. The electrode 117_2b is electrically connected to the electrode 110_2b through an electrode 116_2b in an opening formed by removing portions of the insulating layers 115 and 114 and the layers 129_2b and 128_2b. The electrode 117_2c is electrically connected to the electrode 112_2 through an electrode 116_2c in an opening formed by removing a portion of the insulating layer 115.

As in the transistor 100, one of the electrode 105_2 and the electrode 112_2 of the transistor 200 can function as a gate electrode, and the other can function as a back gate electrode. Thus, the insulating layers 106, 107, 108, and 111_2 can each function as a gate insulating layer.

In the case where one of the electrode 105_2 and the electrode 112_2 is referred to as a "gate electrode" or a "gate", the other can be referred to as a "back gate electrode" or a "back gate". For example, in the transistor 200, in the case where the electrode 105_2 is referred to as a "gate electrode", the electrode 112_2 is referred to as a "back gate electrode". In the case where the electrode 112_2 is used as a "gate electrode", the transistor 200 can be regarded as a kind of bottom-gate transistor. Alternatively, one of the electrode 105_2 and the electrode 112_2 may be referred to as a "first gate electrode" or a "first gate", and the other may be referred to as a "second gate electrode" or a "second gate". Alternatively, one of the electrode 105_2 and the electrode 112_2 may be referred to as a "back gate", and the other may be referred to as a "front gate".

In this specification and the like, the electrode 105_1 and the electrode 105_2 may be collectively referred to as an "electrode 105". The semiconductor layer 109_1a, the semiconductor layer 109_2a1, and the semiconductor layer 109_2a2 may be collectively referred to as a "semiconductor layer 109a". The semiconductor layer 109_2a1 and the semiconductor layer 109_2a2 may be collectively referred to as a "semiconductor layer 109_2a". The semiconductor layer 109_1b, the semiconductor layer 109_2b1, and the semiconductor layer 109_2b2 may be collectively referred to as a "semiconductor layer 109b". The semiconductor layer 109_2b1 and the semiconductor layer 109_2b2 may be collectively referred to as a "semiconductor layer 109_2b". The semiconductor layer 109_1c and the semiconductor layer 109_2c may be collectively referred to as a "semiconductor layer 109c". The semiconductor layer 109a, the semiconductor layer 109b, and the semiconductor layer 109c may be collectively referred to as a "semiconductor layer 109". The layer 128_1a, the layer 128_1b, the layer 128_2a, and the layer 128_2b may be collectively referred to as a "layer 128". The layer 128_1a and the layer 128_1b may be collectively referred to as a "layer 128_1". The layer 128_2a and the layer 128_2b may be collectively referred to as a "layer 128_2". The layer 129_1a, the layer 129_1b, the layer 129_2a, and the layer 129_2b may be collectively referred to as a "layer 129". The layer 129_1a and the layer 129_1b may be collectively referred to as a "layer 129_1". The layer 129_2a and the layer 129_2b may be collectively referred to as a "layer 129_2". The insulating layer 111_1 and the insulating layer 111_2 may be collectively referred to as an "insulating layer 111". The electrode 110_1a, the electrode 110_1b, the electrode 110_2a, and the electrode 110_2b may be collectively referred to as an "electrode 110". The electrode 110_1a and the electrode 110_1b may be collectively referred to as an "electrode 110_1". The electrode 110_2a and the electrode 110_2b may be collectively referred to as an "electrode 110_2". The electrode 112_1 and the electrode 112_2 may be collectively referred to as an "electrode 112". The insulating layer 113_1 and the insulating layer 113_2 may be collectively referred to as an "insulating layer 113". The electrode 116_1a, the electrode 116_1b, the electrode 116_1c, the electrode 116_2a, the electrode 116_2b, and the electrode 116_2c may be collectively referred to as an "electrode 116". The electrode 116_1a, the electrode 116_1b, and the electrode 116_1c may be collectively referred to as an "electrode 116_1". The electrode 116_2a, the electrode 116_2b, and the electrode 116_2c may be collectively referred to as an "electrode 116_2". The electrode 117_1a, the electrode 1171b, the electrode 117_1c, the electrode 117_2a, the electrode 117_2b, and the electrode 117_2c may be collectively referred to as an "electrode 117". The electrode 117_1a, the electrode 117_1b, and the electrode 117_1c may be collectively referred to as an "electrode 117_1". The electrode 117_2a, the electrode 117_2b, and the electrode 117_2c may be collectively referred to as an "electrode 117_2".

In the transistor 100, a channel is formed in the semiconductor layer 109b. In the transistor 200, a channel is formed in the semiconductor layer 109c. The semiconductor layer 109b and the semiconductor layer 109c are preferably formed using semiconductor materials having different physical properties. When the semiconductor layers 109b and 109c are formed using semiconductor materials having different physical properties, the transistors 100 and 200 can have different electrical characteristics. When semiconductor materials having different energy bandgaps are used for the semiconductor layers 109b and 109c, for example, the transistors 100 and 200 can have different field-effect mobilities.

When a semiconductor material having lower electron affinity than that of the semiconductor layer 109b is used for the semiconductor layer 109c, for example, the transistor 200 can have higher $V_{th}$ than the transistor 100. Specifically, when the semiconductor layer 109b is formed of an In-M-Zn oxide (an oxide containing In, an element M, and Zn) at an atomic ratio of $x_2:y_2:z_2$ and the semiconductor layer 109c is formed of an In-M-Zn oxide at an atomic ratio of $x_1:y_1:z_1$, $y_1/x_1$ needs to be larger than $y_2/x_2$. With such In-M-Zn oxides, the transistor 200 can have higher $V_{th}$ than the transistor 100.

When the semiconductor layer 109_2b1 is provided in contact with the electrode 110_2a and the semiconductor layer 109_2c, variation in electrical characteristics of the transistor 200 can be reduced. When the semiconductor layer 109_2b2 is provided in contact with the electrode 110_2b and the semiconductor layer 1092c, variation in electrical characteristics of the transistor 200 can be reduced. The effects of the semiconductor layers 109_2b1 and 109_2b2 are described later in Example.

<Materials>

[Substrate]

There is no particular limitation on a material used for the substrate 101 as long as the material has heat resistance high enough to withstand at least heat treatment performed later. For example, a single crystal semiconductor substrate or a polycrystalline semiconductor substrate made of silicon, silicon carbide, or the like or a compound semiconductor substrate made of silicon germanium or the like can be used as the substrate 101. Alternatively, an SOI substrate, a semiconductor substrate on which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. The substrate 101 is not limited to a simple supporting substrate, and may be a substrate where a device such as a transistor is formed. In this case, at least one of the gate, the source, and the drain of the transistor 100 and/or the transistor 200 may be electrically connected to the device.

Still alternatively, as the substrate 101, a glass substrate of barium borosilicate glass, aluminoborosilicate glass, or the like, a ceramic substrate, a quartz substrate, a sapphire substrate or the like can be used. Note that a flexible substrate may also be used as the substrate 101. In the case where a flexible substrate is used, a transistor, a capacitor, or the like may be directly formed over the flexible substrate, or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer is preferably provided between the manufacturing substrate and the transistor, the capacitor, or the like.

For the flexible substrate, for example, a metal, an alloy, a resin, glass, or a fiber thereof can be used. The flexible substrate used as the substrate 101 preferably has a lower coefficient of linear expansion because deformation due to an environment is suppressed. The flexible substrate used as the substrate 101 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

[Insulating Layer]

The insulating layers 102 to 104, 106 to 108, 111, and 113 to 115 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layer 115 and the insulating layer 102 and/or the insulating layer 103 be formed using an insulating material that is relatively impermeable to impurities. The insulating layer 115 and the insulating layer 102 and/or the insulating layer 103 may each be formed to have, for example, a single-layer structure or a stacked-layer structure including an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Examples of such an insulating material that is relatively impermeable to impurities include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material that is relatively impermeable to impurities is used for the insulating layer 102 and/or the insulating layer 103, impurity diffusion from the substrate 101 side can be suppressed, and the reliability of the transistor can be improved. When the insulating material that is relatively impermeable to impurities is used for the insulating layer 115, impurity diffusion from layers above the insulating layer 115 can be suppressed, and the reliability of the transistor can be improved.

Note that a stack of a plurality of insulating layers formed using these materials may be used as the insulating layer 115 and the insulating layer 102 and/or the insulating layer 103. One of the insulating layer 102 and the insulating layer 103 may be omitted.

When an oxide semiconductor is used for the semiconductor layer 109, the hydrogen concentrations in the insulating layers are preferably lowered in order to prevent an increase in the hydrogen concentration in the semiconductor layer 109. Specifically, the hydrogen concentration in the insulating layer that is measured by secondary ion mass spectrometry (SIMS) is set lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is particularly preferable to lower the hydrogen concentrations of the insulating layers 104, 106 to 108, 111, and 114. It is preferable to lower at least the hydrogen concentrations of the insulating layers 108, 111, and 114 in contact with the semiconductor layer 109.

Furthermore, the nitrogen concentrations in the insulating layers are preferably lowered in order to prevent an increase in the nitrogen concentration in the semiconductor layer 109. Specifically, the nitrogen concentration in the insulating layer that is measured by SIMS, is set lower than or equal to $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

It is preferable that a region of the insulating layer 108 which is in contact with at least the semiconductor layer 109 and a region of the insulating layer 111 which is in contact with at least the semiconductor layer 109 preferably have few defects and typically have as few signals observed by electron spin resonance (ESR) spectroscopy as possible. Examples of the signals include a signal due to an E' center observed at a g-factor of 2.001. Note that the E' center is due to a dangling bond of silicon. As the insulating layer 108 and the insulating layer 111, a silicon oxide layer or a silicon oxynitride layer whose spin density due to the E' center is lower than or equal to $3\times10^{17}$ spins/cm$^3$, preferably lower than or equal to $5\times10^{16}$ spins/cm$^3$ can be used.

In addition to the above-described signal, a signal due to nitrogen dioxide (NO$_2$) might be observed. The signal is divided into three signals according to the N nuclear spin: a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is favorable to use an insulating layer whose spin density of a signal due to nitrogen dioxide ($NO_2$) is higher than or equal to $1\times10^{17}$ spins/cm$^3$ and lower than $1\times10^{18}$ spins/cm$^3$ as the insulating layer 108 and the insulating layer 111, for example.

Note that nitrogen oxide ($NO_x$) such as nitrogen dioxide ($NO_2$) forms a state in the insulating layer. The state is positioned in the energy gap of the oxide semiconductor layer. Thus, when nitrogen oxide ($NO_x$) is diffused to the interface between the insulating layer and the oxide semiconductor layer, an electron can potentially be trapped by the state on the insulating layer side. As a result, the trapped electron remains in the vicinity of the interface between the insulating layer and the oxide semiconductor layer; thus, the threshold voltage of the transistor is shifted in the positive direction. Therefore, a shift in the threshold voltage of the transistor can be reduced when a film with a low nitrogen oxide content is used as the insulating layer 108 and the insulating layer 111.

As an insulating layer that releases little nitrogen oxide ($NO_x$), for example, a silicon oxynitride layer can be used. The silicon oxynitride layer is a film of which the amount of released ammonia is larger than the amount of released nitrogen oxide ($NO_x$) in thermal desorption spectroscopy (TDS); the typical amount of released ammonia is greater than or equal to $1\times10^{18}$/cm$^3$ and less than or equal to $5\times10^{19}$/cm$^3$. Note that the released amount of ammonia is the total amount of ammonia released by heat treatment in a range from 50° C. to 650° C. or a range from 50° C. to 550° C. in TDS.

Since nitrogen oxide ($NO_x$) reacts with ammonia and oxygen in heat treatment, the use of an insulating layer that releases a large amount of ammonia reduces nitrogen oxide ($NO_x$).

At least one of the insulating layers 108, 111, and 114 is preferably formed using an insulating layer from which oxygen is released by heating. Specifically, it is preferable to use an insulating layer of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that oxygen released by heating is also referred to as "excess oxygen".

The insulating layer containing excess oxygen can be formed by performing treatment for adding oxygen to an insulating layer. Oxygen can be added by heat treatment in an oxygen atmosphere, an ion implantation method, an ion doping method, a plasma immersion ion implantation method, plasma treatment, or the like. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

A heat-resistant organic material such as polyimide, an acrylic-based resin, a benzocyclobutene-based resin, polyamide, or an epoxy-based resin may be used for the insulating layer 114. Other than the above organic materials, a low-dielectric constant material (low-k material), a siloxane-based resin, phosphosilicate glass (PSG), borophosphosilicate glass (BPSG), or the like can be used. Note that the insulating layer 114 may be formed by stacking a plurality of insulating layers formed using any of these materials.

Note that the siloxane-based resin corresponds to a resin including a Si—O—Si bond formed using a siloxane-based material as a starting material. The siloxane-based resin may contain, as a substituent, an organic group (e.g., an alkyl group or an aryl group) or a fluoro group. The organic group may contain a fluoro group.

There is no particular limitation on a method for forming the insulating layer 114, and any of the following methods can be used depending on the material: a sputtering method, an SOG method, spin coating, dipping, spray coating, a droplet discharging method (e.g., an ink-jet method), a printing method (e.g., screen printing or offset printing), or the like. When a baking step of the insulating layer 114 also serves as heat treatment for another layer, the transistor can be manufactured efficiently.

Any of the above insulating layers may be used as the layer 128. In the case where the layer 128 is an insulating layer, an insulating layer which is less likely to release oxygen and/or which is less likely to absorb oxygen is preferably used.

Any of the above insulating layers may be used as the layer 129. In the case where the layer 129 is an insulating layer, an insulating layer which is less likely to release oxygen and/or which is less likely to absorb oxygen is preferably used.

[Electrode]

As a conductive material for forming the electrodes 105, 110, 112, 116, and 117, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. Alternatively, a semiconductor having a high electric conductivity typified by polycrystalline silicon containing an impurity element such as phosphorus, or a silicide such as nickel silicide may be used.

A conductive material containing the above metal element and oxygen may be used. Alternatively, a conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, indium tin oxide to which silicon is added, or indium gallium zinc oxide containing nitrogen may be used.

A stack of a plurality of conductive layers formed using the above materials may be used. For example, a stacked-layer structure formed using a material containing the above metal element and a conductive material containing oxygen may be used. Alternatively, a stacked-layer structure formed using a material containing the above metal element and a conductive material containing nitrogen may be used. Still alternatively, a stacked-layer structure formed using a material containing the above metal element, a conductive material containing oxygen, and a conductive material containing nitrogen may be used.

Note that in the case where an oxide semiconductor is used for the semiconductor layer and a stacked-layer structure formed using a material containing the above metal element and a conductive material containing oxygen is used for the gate electrode, the conductive material containing oxygen is preferably provided on the semiconductor layer side. By providing the conductive material containing oxygen on the semiconductor layer side, oxygen released from the conductive material is easily supplied to the semiconductor layer.

The electrode 116 may be formed using, for example, a conductive material with high embeddability, such as tungsten or polysilicon. A conductive material with high embeddability and a barrier layer (a diffusion prevention layer) such as a titanium layer, a titanium nitride layer, or a tantalum nitride layer may be used in combination. Note that the electrode 116 may be referred to as a "contact plug".

In particular, the electrode 105 in contact with the insulating layers 103 and 104 is preferably formed using a conductive material that is relatively impermeable to impurities. Furthermore, the electrode 116 in contact with the insulating layers 114 and 115 is preferably formed using a conductive material that is relatively impermeable to impurities. As an example of the conductive material that is relatively impermeable to impurities, tantalum nitride can be given.

When the insulating layers 103 and 115 are formed using an insulating material that is relatively impermeable to impurities and the electrodes 105 and 116 are formed using a conductive material that is relatively impermeable to impurities, diffusion of impurities into the transistors 100 and 200 can be further suppressed. Thus, the reliability of the transistors 100 and 200 can be further improved.

Any of the above conductive materials may be used for the layer 128. In the case where the layer 128 is formed using a conductive material, a conductive material which is less likely to release oxygen and/or which is less likely to absorb oxygen is preferably used.

Any of the above conductive materials may be used for the layer 129. In the case where the layer 129 is formed using a conductive material, a conductive material which is less likely to release oxygen and/or which is less likely to absorb oxygen is preferably used.

[Semiconductor Layer]

For the semiconductor layer 109, a single-crystal semiconductor, a polycrystalline semiconductor, a microcrystalline semiconductor, an amorphous semiconductor, or the like can be used alone or in combination. As a semiconductor material, silicon, germanium, or the like can be used. Alternatively, a compound semiconductor such as silicon germanium, silicon carbide, gallium arsenide, an oxide semiconductor, or a nitride semiconductor, or the like, an organic semiconductor, or the like may be used.

In the case of using an organic semiconductor for the semiconductor layer 109, a low molecular organic material having an aromatic ring, π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

The semiconductor layers 109a to 109c may be formed using semiconductors having different crystal states or different semiconductor materials.

The band gap of an oxide semiconductor is greater than or equal to 2 eV; thus, when an oxide semiconductor is used for the semiconductor layer 109, a transistor with an extremely low off-state current can be provided. Specifically, the off-state current per micrometer in channel width at room temperature (typically 25° C.) and at a source-drain voltage of 3.5 V can be lower than $1 \times 10^{-20}$ A, lower than $1 \times 10^{-22}$ A, or lower than $1 \times 10^{-24}$ A. That is, the on/off ratio of the transistor can be greater than or equal to 20 digits and less than or equal to 150 digits. A transistor including an oxide semiconductor in the semiconductor layer 109 has high withstand voltage between its source and drain. Thus, a transistor with high reliability can be provided. Furthermore, a transistor with high output voltage and high withstand voltage can be provided. Furthermore, a semiconductor device or the like with high reliability can be provided. Furthermore, a semiconductor device with high output voltage and high withstand voltage can be provided.

In this specification and the like, a transistor in which an oxide semiconductor is used for a semiconductor layer where a channel is formed is also referred to as an "OS transistor". In this specification and the like, a transistor in which silicon having crystallinity is used for a semiconductor layer where a channel is formed is also referred to as a "crystalline Si transistor".

The crystalline Si transistor tends to obtain relatively high mobility as compared to the OS transistor. On the other hand, the crystalline Si transistor has difficulty in obtaining extremely low off-state current unlike the OS transistor. Thus, it is important that the semiconductor material used for the semiconductor layer be selected depending on the purpose and the usage. For example, depending on the purpose and the usage, the OS transistor and the crystalline Si transistor may be used in combination.

In the case where the semiconductor layer 109 is formed using an oxide semiconductor layer, the oxide semiconductor layer is preferably formed by a sputtering method. The oxide semiconductor layer is preferably formed by a sputtering method, in which case the oxide semiconductor layer can have high density. In the case where the oxide semiconductor layer is formed by a sputtering method, a rare gas (typically argon), oxygen, or a mixed gas of a rare gas and oxygen is used as a sputtering gas. In addition, increasing the purity of the sputtering gas is necessary. For example, an oxygen gas or a rare gas used as a sputtering gas is a gas that is highly purified to have a dew point of −60° C. or lower, preferably −100° C. or lower. By using the sputtering gas that is highly purified, entry of moisture or the like into the oxide semiconductor layer can be prevented as much as possible.

In the case where the oxide semiconductor layer is formed by a sputtering method, it is preferable that moisture in a deposition chamber of a sputtering apparatus be removed as much as possible. For example, with an adsorption vacuum evacuation pump such as cryopump, the deposition chamber is preferably evacuated to be a high vacuum state (to a degree of about $5 \times 10^{-7}$ Pa to $1 \times 10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1 \times 10^{-4}$ Pa, more preferably lower than or equal to $5 \times 10^{-5}$ Pa.

Any of the above semiconductor layers may be used as the layer 128. Any of the above semiconductor layers may be used as the layer 129.

In this embodiment, the case where an oxide semiconductor is used for the semiconductor layer 109 and the layers 128 and 129 will be described.

[Oxide Semiconductor]

An oxide semiconductor of one embodiment of the present invention will be described below. An oxide semiconductor preferably contains at least indium or zinc. In particular, indium and zinc are preferably contained. In addition to these, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M First, preferred ranges of the atomic ratio of indium, the element M, and zinc contained in an oxide semiconductor of the present invention will be described with reference to FIGS. 19A to 19C. Note that the proportion of oxygen atoms is not shown in FIGS. 19A to 19C. The terms of the atomic ratio of indium, the element M, and zinc contained in the oxide semiconductor are denoted by [In], [M], and [Zn], respectively.

Figure 19A:
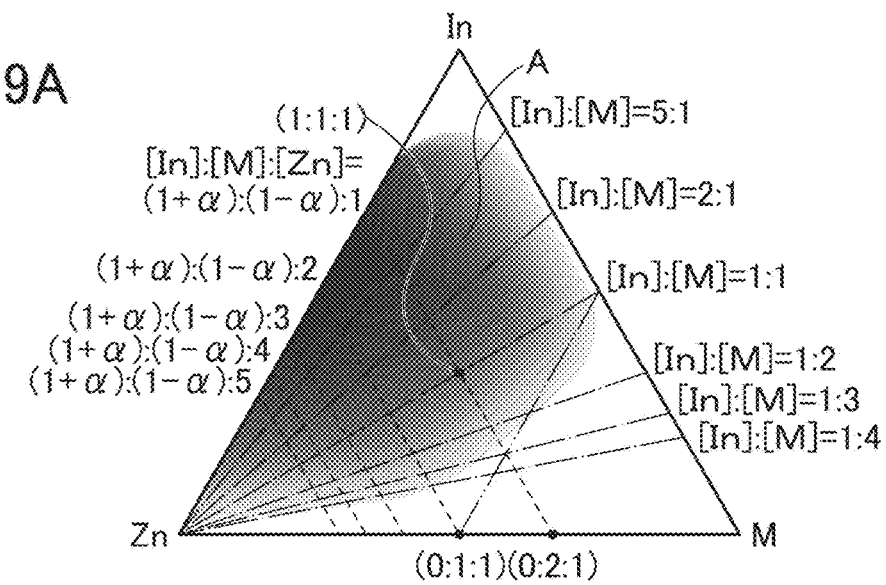
FIGS. 19A to 19C each illustrate an atomic ratio range of an oxide.
Figure 19B:
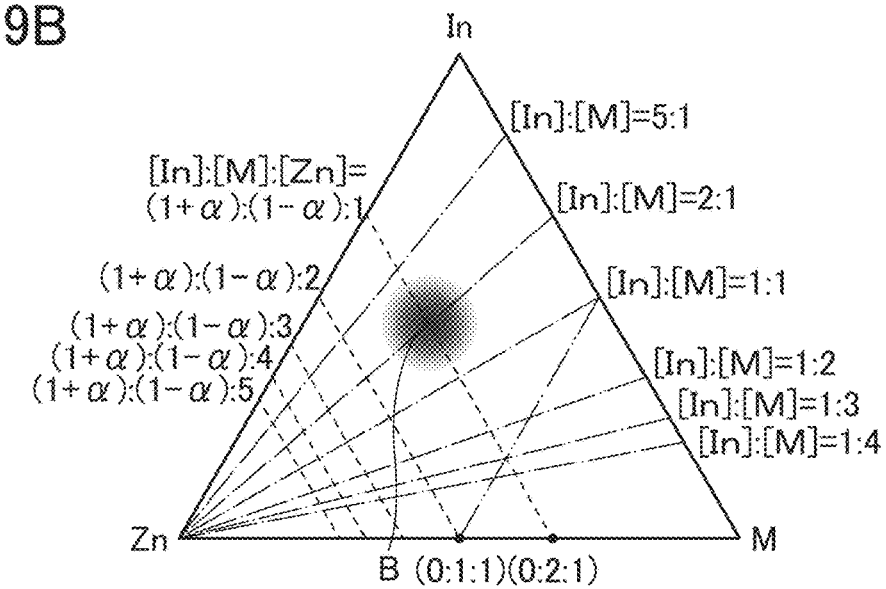
Figure 19C:
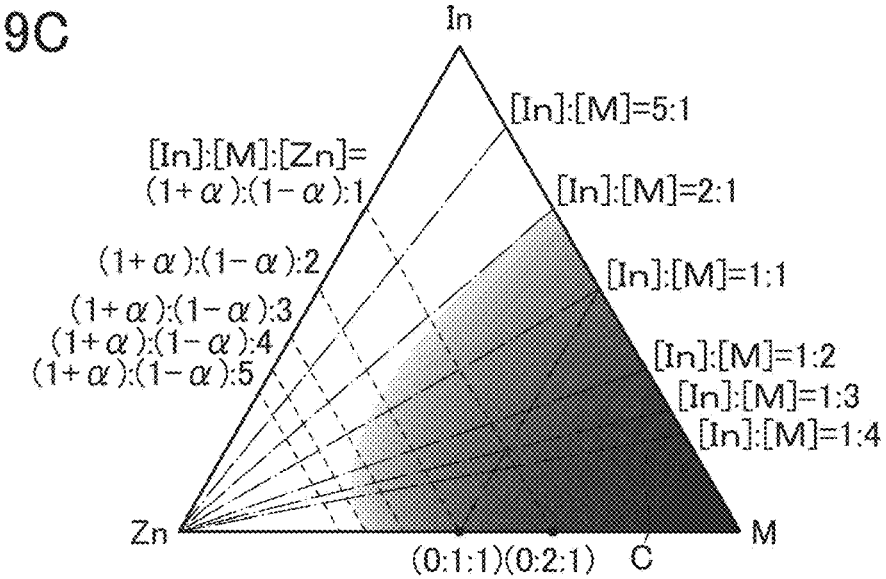

In FIGS. 19A to 19C, broken lines indicate a line where the atomic ratio [In]:[M]:[Zn] is $(1+\alpha):(1-\alpha):1$ (where $-1\leq\alpha\leq1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$ (where $\beta\geq0$), a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

Dashed-double dotted lines indicate a line where the atomic ratio [In]:[M]:[Zn] is $(1+\gamma):2:(1-\gamma)$ (where $-1\leq\gamma\leq1$). The oxide semiconductor shown in FIGS. 19A to 19C with an atomic ratio of [In]:[M]:[Zn]=0:2:1 or an atomic ratio that is in the neighborhood thereof is likely to have a spinel crystal structure.

FIGS. 19A and 19B illustrate examples of the preferred ranges of the atomic ratio of indium, the element M, and zinc contained in an oxide semiconductor in one embodiment of the present invention.

Figure 20:
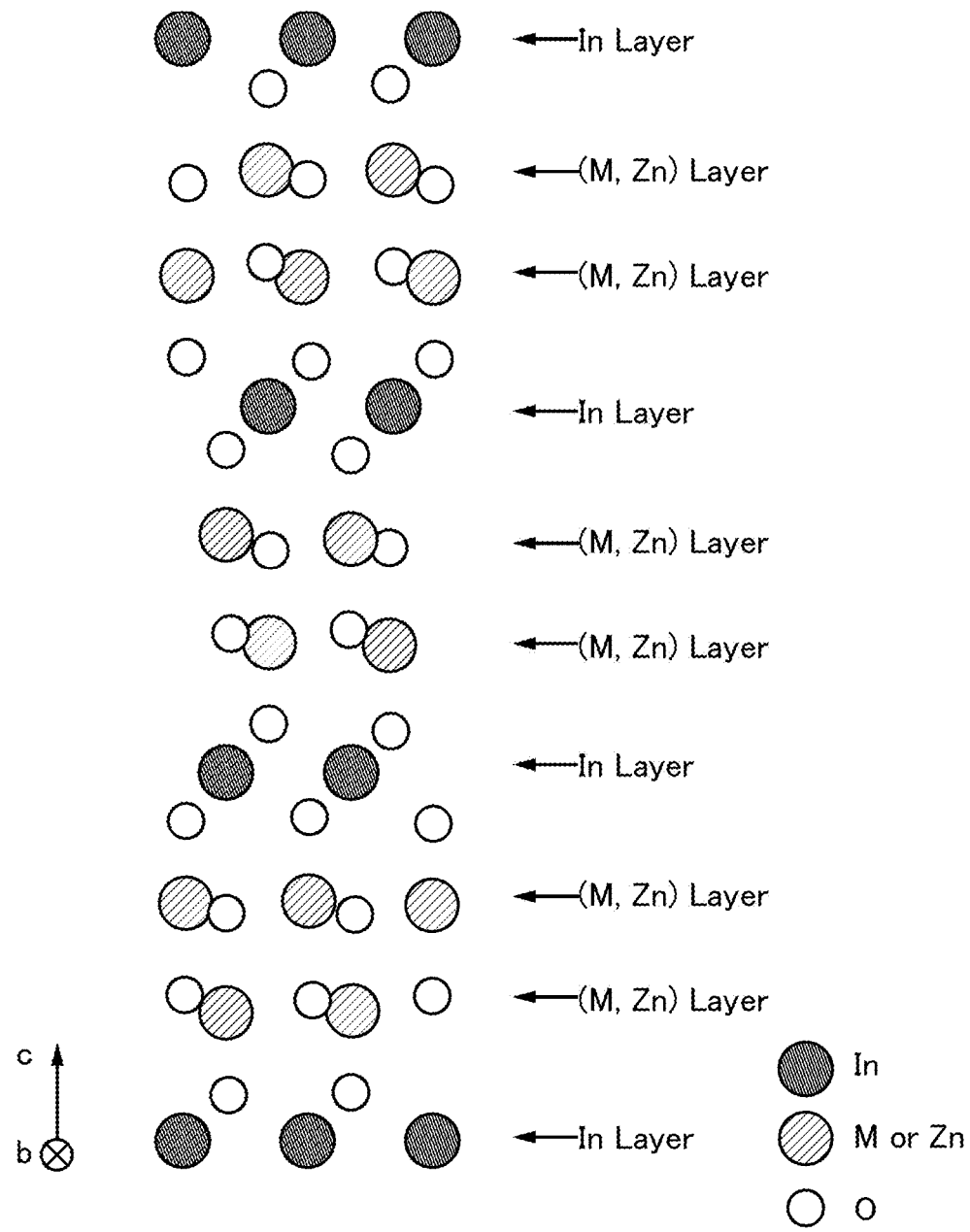
FIG. 20 illustrates a crystal structure of $InMZnO_4$.

FIG. 20 illustrates an example of the crystal structure of $InMZnO_4$ whose atomic ratio [In]:[M]:[Zn] is 1:1:1. In FIG. 20, the crystal structure of $InMZnO_4$ observed from the direction parallel to a b-axis is illustrated. Note that a metal element in a layer that contains M, Zn, and oxygen (hereinafter, this layer is referred to as an (M,Zn) layer) in FIG. 20 represents the element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 20.

Indium and the element M can be replaced with each other. Therefore, when the element M in the (M,Zn) layer is replaced by indium, the layer can also be referred to as an (In,M,Zn) layer. In that case, a layered structure that includes one In layer for every two (In,M,Zn) layers is obtained.

An oxide semiconductor whose atomic ratio [In]:[M]:[Zn] is 1:1:2 has a layered structure that includes one In layer for every three (M,Zn) layers. In other words, if [Zn] is larger than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, the oxide semiconductor might have plural kinds of layered structures where the number of (M,Zn) layers with respect to one In layer is an integer. For example, in the case of [In]:[M]:[Zn]=1:1:1.5, the oxide semiconductor might have the following coexisting layered structures: a layered structure of one In layer for every two (M,Zn) layers and a layered structure of one In layer for every three (M,Zn) layers.

For example, in the case where the oxide semiconductor is deposited with a sputtering apparatus, a film having an atomic ratio deviated from the atomic ratio of a target is formed. In particular, [Zn] in the film might be smaller than [Zn] in the target, depending on the substrate temperature in deposition.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor containing indium in a higher proportion can have a higher carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; therefore, an oxide semiconductor having a high indium content has higher carrier mobility than that of an oxide semiconductor having a low indium content.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 19C), insulation performance becomes better.

Accordingly, an oxide semiconductor of one embodiment of the present invention preferably has an atomic ratio represented by a region A in FIG. 19A. With the atomic ratio, a layered structure with high carrier mobility and a few grain boundaries is easily obtained.

A region B in FIG. 19B represents an atomic ratio of [In]:[M]:[Zn]=4:2:3 to 4:2:4.1 and the vicinity thereof. The vicinity includes an atomic ratio of [In]:[M]:[Zn]=5:3:4, for example. An oxide semiconductor having an atomic ratio represented by the region B is an excellent oxide semiconductor that has particularly high crystallinity and high carrier mobility.

Note that a condition where an oxide semiconductor has a layered structure is not uniquely determined by an atomic ratio. The difficulty of forming a layered structure depends on the atomic ratio to some extent. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with a low carrier density is preferably used for the transistor. For example, an oxide semiconductor whose carrier density is lower than $8\times10^{11}/cm^3$, preferably lower than $1\times10^{11}/cm^3$, more preferably lower than $1\times10^{10}/cm^3$, and higher than or equal to $1\times10^{-9}/cm^3$ is used.

A highly purified intrinsic or substantially highly purified intrinsic oxide semiconductor has few carrier generation sources and thus can have a low carrier density. The highly purified intrinsic or substantially highly purified intrinsic oxide semiconductor has a low density of defect states and accordingly has a low density of trap states in some cases.

Charges trapped by the trap states in the oxide semiconductor take a long time to be released and may behave like fixed charges. Thus, a transistor whose channel is formed in an oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, an alkali metal, an alkaline earth metal, iron, nickel, and silicon.

Here, the influence of impurities in the oxide semiconductor will be described.

When silicon or carbon, which is one of Group 14 elements, is contained in the oxide semiconductor, defect states are formed. Thus, the concentration of silicon or carbon in the oxide semiconductor and around an interface with the oxide semiconductor (measured by SIMS) is set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor including an oxide semiconductor that contains an alkali metal or an alkaline earth metal is likely to be normally-on. Therefore, it is preferable to reduce the concentration of an alkali metal or an alkaline earth metal in the oxide semiconductor. Specifically, the concentration of an alkali metal or an alkaline earth metal in the oxide semiconductor measured by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor including, as a semiconductor, an oxide semiconductor that contains nitrogen is likely to be normally-on. For this reason, nitrogen in the oxide semiconductor is preferably reduced as much as possible. The nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration in the oxide semiconductor measured by SIMS is set lower than $1\times10^{20}$ atoms/cm$^3$, preferably lower than $1\times10^{19}$ atoms/cm$^3$, more preferably lower than $5\times10^{18}$ atoms/cm$^3$, still more preferably lower than $1\times10^{18}$ atoms/cm$^3$.

When an oxide semiconductor with a sufficiently reduced impurity concentration is used for a channel formation region of a transistor, the transistor can have stable electrical characteristics.

For the semiconductor layer 109*b*, an oxide semiconductor with a wide energy gap is used, for example. The energy gap of the semiconductor layer 109*b* is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

For example, in the case where an InGaZnO$_X$(X>0) film is formed as the semiconductor layer 109 by a thermal CVD method, trimethylindium (In(CH$_3$)$_3$), trimethylgallium (Ga(CH$_3$)$_3$), and dimethylzinc (Zn(CH$_3$)$_2$) are used. Without limitation to the above combination, triethylgallium (Ga(C$_2$H$_5$)$_3$) can be used instead of trimethylgallium, and diethylzinc (Zn(C$_2$H$_5$)$_2$) can be used instead of dimethylzinc.

For example, in the case where an InGaZnO$_X$ (X>0) film is formed as the semiconductor layer 109 by an ALD method, an In(CH$_3$)$_3$ gas and an O$_3$ gas are sequentially introduced a plurality of times to form an InO$_2$ layer, a Ga(CH$_3$)$_3$ gas and an O$_3$ gas are sequentially introduced a plurality of times to form a GaO layer, and then a Zn(CH$_3$)$_2$ gas and an O$_3$ gas are sequentially introduced a plurality of times to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed using these gases. Note that although an H$_2$O gas which is obtained by bubbling water with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas or tris(acetylacetonato)indium may be used. Note that tris(acetylacetonato)indium is also referred to as In(acac)$_3$. Instead of a Ga(CH$_3$)$_3$ gas, a Ga(C$_2$H$_5$)$_3$ gas or tris(acetylacetonato)gallium may be used. Note that tris(acetylacetonato)gallium is also referred to as Ga(acac)$_3$. Furthermore, a Zn(CH$_3$)$_2$ gas or zinc acetate may be used. However, the deposition gas is not limited to these.

In the case where the semiconductor layer 109 is formed by a sputtering method, a target containing indium is preferably used in order to reduce the number of particles. In addition, if an oxide target having a high atomic proportion of the element M is used, the conductivity of the target may be decreased. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

In the case where the semiconductor layer 109 is formed by a sputtering method, the atomic ratio of In to M and Zn contained in the target may be 3:1:1, 3:1:2, 3:1:4, 1:1:0.5, 1:1:1, 1:1:2, 1:4:4, 4:2:4.1, 1:3:2, or 1:3:4, for example.

In the case where the semiconductor layer 109 is formed by a sputtering method, a film having an atomic ratio different from the atomic ratio of the target may be formed. Especially for zinc, the proportion of zinc atoms of a formed film is smaller than that of zinc atoms of the target in some cases. Specifically, the proportion of zinc atoms of the film may be approximately 40% to 90% of the proportion of zinc atoms of the target.

The semiconductor layer 109a and the semiconductor layer 109c are preferably formed using a material containing one or more kinds of metal elements, other than oxygen, contained in the semiconductor layer 109b. With the use of such a material, interface states at interfaces between the semiconductor layer 109a and the semiconductor layer 109b and between the semiconductor layer 109c and the semiconductor layer 109b are less likely to be generated. Accordingly, carriers are not likely to be scattered or captured at the interfaces, which results in an improvement in field-effect mobility of the transistor. Furthermore, variation in threshold voltage of the transistor can be reduced. Thus, a semiconductor device having favorable electrical characteristics can be obtained.

When the semiconductor layer 109b is an In-M-Zn oxide containing In, the element M, and Zn at an atomic ratio of $x_2:y_2:z_2$ and each of the semiconductor layer 109a and the semiconductor layer 109c is an In-M-Zn oxide containing In, M, and Zn at an atomic ratio of $x_1:y_1:z_1$, $y_1/x_1$ is preferably larger than $y_2/x_2$. More preferably, the semiconductor layer 109a, the semiconductor layer 109c, and the semiconductor layer 109b in which $y_1/x_1$ is 1.5 or more times as large as $y_2/x_2$ are selected. Still more preferably, the semiconductor layer 109a, the semiconductor layer 109c, and the semiconductor layer 109b in which $y_1/x_1$ is 2 or more times as large as $y_2/x_2$ are selected. Still more preferably, the semiconductor layer 109a, the semiconductor layer 109c, and the semiconductor layer 109b in which $y_1/x_1$ is 3 or more times as large as $y_2/x_2$ are selected. In the semiconductor layer 109b of this case, $y_1$ is preferably larger than or equal to $x_1$ because the transistor can have stable electrical characteristics. However, when $y_1$ is 5 or more times as large as $x_1$, the field-effect mobility of the transistor is reduced; accordingly, $y_1$ is preferably smaller than 5 times $x_1$. When the semiconductor layers 109a and 109c each have the above structure, each of the semiconductor layers 109a and 109c can be a layer in which oxygen vacancy is less likely to occur than in the semiconductor layer 109b.

In the case of using an In-M-Zn oxide as the semiconductor layer 109a, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the semiconductor layer 109b, when the summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the semiconductor layer 109c, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the semiconductor layer 109c and the semiconductor layer 109a may be formed using the same type of oxide.

For example, an In—Ga—Zn oxide which is formed using a target having an atomic ratio of In:Ga:Zn=1:3:2, 1:3:4, 1:3:6, 1:4:5, 1:6:4, or 1:9:6 or an In—Ga oxide which is formed using a target having an atomic ratio of In:Ga=1:9 or 7:93 can be used for each of the semiconductor layers 109a and 109c containing In or Ga. Furthermore, an In—Ga—Zn oxide which is formed using a target having an atomic ratio of In:Ga:Zn=1:1:1 or 3:1:2 can be used for the semiconductor layer 109b. Note that the atomic ratio of each of the semiconductor layers 109a, 109b, and 109c may vary within a margin of ±20% of the corresponding atomic ratio.

For the semiconductor layer 109b, an oxide having a higher electron affinity than the semiconductor layer 109a and the semiconductor layer 109c is used. For example, for the semiconductor layer 109b, an oxide having an electron affinity higher than that of each of the semiconductor layer 109a and the semiconductor layer 109c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum.

An indium gallium oxide has a low electron affinity and a high oxygen-blocking property. Therefore, the semiconductor layer 109c preferably includes an indium gallium oxide. The proportion of gallium atoms [Ga/(In+Ga)] is, for example, higher than or equal to 70%, preferably higher than or equal to 80%, more preferably higher than or equal to 90%.

Note that the semiconductor layer 109a and/or the semiconductor layer 109c may be gallium oxide. For example, when gallium oxide is used for the semiconductor layer 109c, leakage current generated between the electrode 105 and the semiconductor layer 109 can be reduced. In other words, the off-state current of the transistor 100 can be reduced.

At this time, when a gate voltage is applied, a channel is formed in the semiconductor layer 109b having the highest electron affinity among the semiconductor layers 109a to 109c.

In order to give stable electrical characteristics to the OS transistor, it is preferable that impurities and oxygen vacancies in the oxide semiconductor layer be reduced to highly purify the oxide semiconductor layer so that at least the semiconductor layer 109b can be regarded as an intrinsic or substantially intrinsic oxide semiconductor layer. Furthermore, it is preferable that at least the channel formation region of the semiconductor layer 109b be regarded as an intrinsic or substantially intrinsic semiconductor layer.

The layer 129 (the layer 129a and the layer 129b) may be formed using a material and a method which are similar to those of the semiconductor layer 109. In the case where the layer 129 is formed using an oxide semiconductor layer, an oxide semiconductor layer which is less likely to release oxygen and/or which is less likely to absorb oxygen is preferably used.

[Energy Band Structure of Oxide Semiconductor Layer]

Figure 17A:
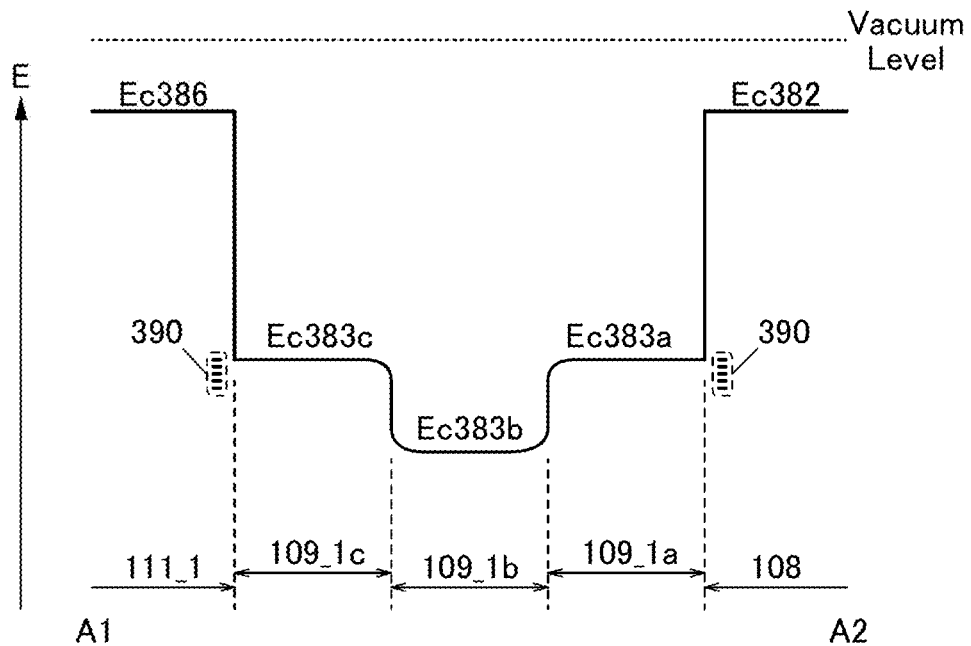
FIGS. 17A and 17B illustrate an energy band structure of a transistor.

A function and an effect of the semiconductor layer 109 consisting of the semiconductor layers 109_1a, 109_1b, and 109_1c will be described using an energy band structure diagrams of FIGS. 17A and 17B. FIG. 17A illustrates the energy band structure of a portion along dashed-dotted line A1-A2 in FIGS. 15B and 15C. In other words, FIG. 17A illustrates the energy band structure of a channel formation region of the transistor 100.

In FIG. 17A, Ec382, Ec383a, Ec383b, Ec383c, and Ec386 indicate the energy of the conduction band minimum of the insulating layer 108, the semiconductor layer 109_1a, the semiconductor layer 109_1b, the semiconductor layer 109_1c, and the insulating layer 111_1, respectively.

Here, an electron affinity corresponds to a value obtained by subtracting an energy gap from a difference in energy between the vacuum level and the valence band maximum (the difference is also referred to as "ionization potential"). The energy gap can be measured using a spectroscopic ellipsometer (UT-300 manufactured by HORIBA Jobin Yvon SAS). The energy difference between the vacuum level and the valence band maximum can be measured using an ultraviolet photoelectron spectroscopy (UPS) device (VersaProbe manufactured by ULVAC-PHI, Inc.).

An In—Ga—Zn oxide formed using a target with an atomic ratio of In:Ga:Zn=1:3:2 has an energy gap of approximately 3.5 eV and an electron affinity of approximately 4.5 eV. An In—Ga—Zn oxide formed using a target with an atomic ratio of In:Ga:Zn=1:3:4 has an energy gap of approximately 3.4 eV and an electron affinity of approximately 4.5 eV. An In—Ga—Zn oxide formed using a target with an atomic ratio of In:Ga:Zn=1:3:6 has an energy gap of approximately 3.3 eV and an electron affinity of approximately 4.5 eV. An In—Ga—Zn oxide formed using a target with an atomic ratio of In:Ga:Zn=1:6:2 has an energy gap of approximately 3.9 eV and an electron affinity of approximately 4.3 eV. An In—Ga—Zn oxide formed using a target with an atomic ratio of In:Ga:Zn=1:6:8 has an energy gap of approximately 3.5 eV and an electron affinity of approximately 4.4 eV. An In—Ga—Zn oxide formed using a target with an atomic ratio of In:Ga:Zn=1:6:10 has an energy gap of approximately 3.5 eV and an electron affinity of approximately 4.5 eV. An In—Ga—Zn oxide formed using a target with an atomic ratio of In:Ga:Zn=1:1:1 has an energy gap of approximately 3.2 eV and an electron affinity of approximately 4.7 eV. An In—Ga—Zn oxide formed using a target with an atomic ratio of In:Ga:Zn=3:1:2 has an energy gap of approximately 2.8 eV and an electron affinity of approximately 5.0 eV. An In—Ga—Zn oxide formed using a target with an atomic ratio of In:Ga:Zn=3:1:4 has an energy gap of approximately 2.8 eV and an electron affinity of approximately 4.6 eV. An In—Ga—Zn oxide formed using a target with an atomic ratio of In:Ga:Zn=4:2:4.1 has an energy gap of approximately 3.0 eV and an electron affinity of approximately 4.4 eV.

Since the insulating layer 108 and the insulating layer 111_1 are insulators, Ec382 and Ec386 are closer to the vacuum level (have a lower electron affinity) than Ec383a, Ec383b, and Ec383c.

Ec383a is closer to the vacuum level than Ec383b. Specifically, Ec383a is preferably located closer to the vacuum level than Ec383b by greater than or equal to 0.07 eV and less than or equal to 1.3 eV, more preferably greater than or equal to 0.1 eV and less than or equal to 0.7 eV, more preferably greater than or equal to 0.15 eV and less than or equal to 0.4 eV.

Ec383c is closer to the vacuum level than Ec383b. Specifically, Ec383c is preferably located closer to the vacuum level than Ec383b by greater than or equal to 0.07 eV and less than or equal to 1.3 eV, more preferably greater than or equal to 0.1 eV and less than or equal to 0.7 eV, more preferably greater than or equal to 0.15 eV and less than or equal to 0.4 eV.

Here, a mixed region of the semiconductor layer 109_1a and the semiconductor layer 109_1b might exist between the semiconductor layer 109_1a and the semiconductor layer 109_1b. A mixed region of the semiconductor layer 109_1b and the semiconductor layer 109_1c might exist between the semiconductor layer 109_1b and the semiconductor layer 109_1c. The mixed region has a low density of interface states. For that reason, the stack including the semiconductor layers 109_1a, 109_1b, and 109_1c has a band structure where energy at each interface and in the vicinity of the interface is changed continuously (continuous junction).

At this time, electrons move mainly in the semiconductor layer 109_1b, not in the semiconductor layer 109_1a and the semiconductor layer 109_1c. Thus, when the interface state density at the interface between the semiconductor layer 109_1a and the semiconductor layer 109_1b and the interface state density at the interface between the semiconductor layer 109_1b and the semiconductor layer 109_1c are decreased, electron movement in the semiconductor layer 109_1b is less likely to be inhibited and the on-state current of the transistor 100 can be increased.

Although trap states 390 due to impurities or defects might be formed at or near the interface between the semiconductor layer 109_1a and the insulating layer 108 and at or near the interface between the semiconductor layer 109_1c and the insulating layer 111_1, the semiconductor layer 109_1b can be separated from the trap states owing to the existence of the semiconductor layer 109_1a and the semiconductor layer 109_1c.

Since the transistor 100 has an s-channel structure, a channel is formed in the whole of the semiconductor layer 109_1b. Therefore, as the semiconductor layer 109_1b has a larger thickness, a channel formation region becomes larger. In other words, the thicker the semiconductor layer 109_1b is, the higher the on-state current of the transistor 100 is. The thickness of the semiconductor layer 109_1b is 5 nm or larger, preferably 10 nm or larger, more preferably 20 nm or larger, still more preferably 50 nm or larger.

Moreover, the thickness of the semiconductor layer 109_1c is preferably as small as possible to increase the on-state current of the transistor 100. The thickness of the semiconductor layer 109_1c is less than 20 nm, preferably less than or equal to 10 nm, more preferably less than or equal to 5 nm. Meanwhile, the semiconductor layer 109_1c has a function of blocking entry of elements other than oxygen (such as hydrogen and silicon) included in the adjacent insulator into the semiconductor layer 109_1b where a channel is formed. For this reason, it is preferable that the semiconductor layer 109_1c have a certain thickness. The semiconductor layer 109_1c has a thickness of greater than or equal to 0.3 nm, preferably greater than or equal to 1 nm, more preferably greater than or equal to 2 nm.

To improve reliability, preferably, the thickness of the semiconductor layer 109_1a is large. The semiconductor layer 109_1a has a thickness of greater than or equal to 10 nm, preferably greater than or equal to 20 nm, more preferably greater than or equal to 40 nm, still more preferably greater than or equal to 60 nm. When the thickness of the semiconductor layer 109_1a is made large, the distance from an interface between the adjacent insulator (the insulating layer 108) and the semiconductor layer 109_1a to the semiconductor layer 109_1b, in which a channel is formed, can be large. However, to prevent a decrease in productivity of the transistor 100 or the semiconductor device including the transistor 100, the semiconductor layer 109_1a has a thickness of, for example, less than or equal to 50 nm, preferably less than or equal to 20 nm, more preferably less than or equal to 10 nm.

The semiconductor layer 109_1a may have a function of blocking entry of elements other than oxygen (such as hydrogen and silicon) included in the adjacent insulator into the semiconductor layer 109_1b, where a channel is formed. The semiconductor layer 109_1a may have an oxygen-blocking property to suppress outward diffusion of oxygen included in the semiconductor layer 109_1b.

In the case where an electrode functioning as a gate electrode or a back gate electrode is provided below the semiconductor layer 109_1a, the thickness of the semiconductor layer 109_1a is preferably as small as possible to increase the on-state current of the transistor 100. In that case, the semiconductor layer 109_1a includes a region with a thickness of less than 20 nm, preferably less than or equal to 10 nm, more preferably less than or equal to 5 nm, for example.

Figure 17B:
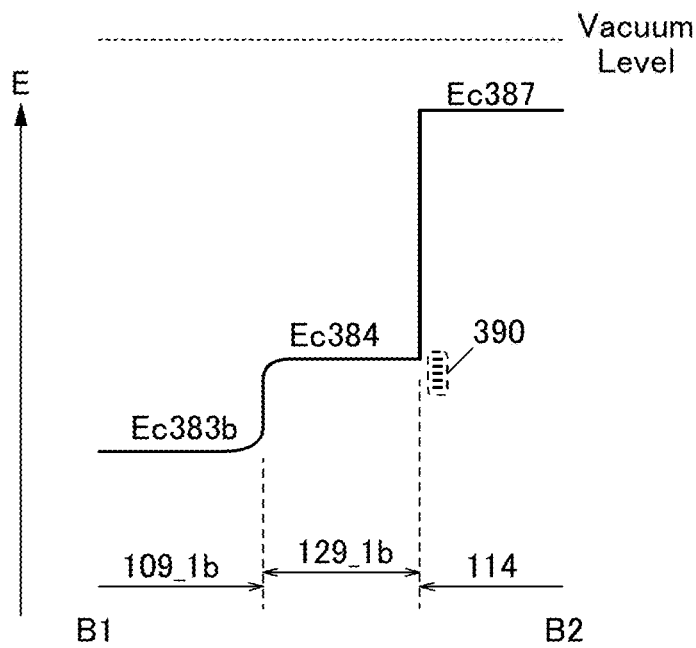

FIG. 17B illustrates the energy band structure of a portion along dashed-dotted line B1-B2 in FIG. 15D. In other words, FIG. 17B illustrates the energy band structure of a side surface of the semiconductor layer 109_1b.

In FIG. 17B, Ec387, Ec384, and Ec383b indicate the energy of the conduction band minimum of the insulating layer 114, the layer 129_1b, and the semiconductor layer 109_1b, respectively. Although the trap states 390 due to impurities or defects might be formed in the vicinity of the interface between the side surface of the semiconductor layer 109_1b and the insulating layer 114, the side surface of the semiconductor layer 109_1b can be separated from the trap states owing to the existence of the layer 129_1b.

By providing the layer 129_1b in contact with the side surface of the semiconductor layer 109_1b, diffusion of elements other than oxygen (such as hydrogen and silicon) included in the adjacent insulator into the semiconductor layer 109_1b through the side surface thereof can be prevented. Furthermore, outward diffusion of oxygen included in the semiconductor layer 109_1b can be suppressed.

Figure 18:
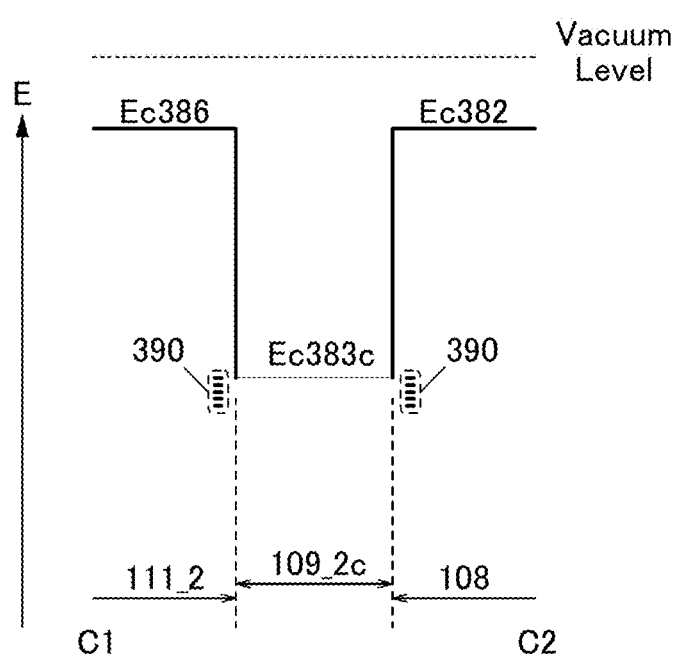
FIG. 18 illustrates an energy band structure of a transistor.

FIG. 18 illustrates the energy band structure of a portion along dashed-dotted line C1-C2 in FIG. 16C. In other words, FIG. 18 illustrates the energy band structure of a channel formation region of the transistor 200.

In FIG. 18, Ec382, Ec383c, and Ec386 indicate the energy of the conduction band minimum of the insulating layer 108, the semiconductor layer 109_2c, and the insulating layer 111_2, respectively. Since a region of the semiconductor layer 109_2c where a channel is formed is in direct contact with the insulating layer 108 and the insulating layer 111_2 in the transistor 200, the transistor 200 is likely to be affected by interface scattering and the trap states 390. Thus, the transistor 200 has lower on-state current and field-effect mobility than the transistor 100. Furthermore, the transistor 200 has higher $V_{th}$ than the transistor 100.

Although the semiconductor layer of the transistor 100 has the above three-layer structure in this embodiment, one embodiment of the present invention is not limited thereto. For example, the semiconductor layer may have a two-layer structure without one of the semiconductor layer 109_1a and the semiconductor layer 109_1c. Alternatively, a single-layer structure using any one of the semiconductor layer 109_1a, the semiconductor layer 109_1b, and the semiconductor layer 109_1c may be employed. Alternatively, a four-layer structure in which any one of the above-described semiconductors is provided over or under the semiconductor layer 109_1a or over or under the semiconductor layer 109_1c may be employed. Still alternatively, it is possible to employ an n-layer structure (n is an integer of 5 or more) in which any one of the semiconductors described as examples of the semiconductor layer 109_1a, the semiconductor layer 109_1b, and the semiconductor layer 109_1c is provided at two or more of the following positions: over the semiconductor layer 109_1a; under the semiconductor layer 109_1a; over the semiconductor layer 109_1c; and under the semiconductor layer 109_1c.

[Concentration of Impurities in Oxide Semiconductor Layer]

Note that silicon contained in the oxide semiconductor might serve as a carrier trap or a carrier generation source. Therefore, the silicon concentration of the semiconductor layer 109_1b is preferably as low as possible. For example, a region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor layer 109_1b and the semiconductor layer 109_1a. A region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor layer 109_1b and the semiconductor layer 109_1c.

It is preferable to reduce the hydrogen concentration in the semiconductor layer 109_1a and the semiconductor layer 109_1c in order to reduce the hydrogen concentration in the semiconductor layer 109_1b. The semiconductor layer 109_1a and the semiconductor layer 109_1c each have a region in which the hydrogen concentration measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$.

It is preferable to reduce the nitrogen concentration in the semiconductor layer 109_1a and the semiconductor layer 109_1c in order to reduce the nitrogen concentration in the semiconductor layer 109_1b. The semiconductor layer 109_1a and the semiconductor layer 109_1c each have a region in which the nitrogen concentration measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Note that when copper enters the oxide semiconductor, an electron trap might be generated. The electron trap might shift the threshold voltage of the transistor in the positive direction. Therefore, the copper concentration at the surface of or in the semiconductor layer 109b is preferably as low as possible. For example, the semiconductor layer 109b preferably has a region in which the copper concentration is lower than or equal to $1\times10^{19}$ atoms/cm$^3$, lower than or equal to $5\times10^{18}$ atoms/cm$^3$, or lower than or equal to $1\times10^{18}$ atoms/cm$^3$.

[Deposition Method]

An insulating material for forming the insulating layers, a conductive material for forming the electrodes, or a semiconductor material for forming the semiconductor layers can be formed by a sputtering method, a spin coating method, a chemical vapor deposition (CVD) method (including a thermal CVD method, a metal organic chemical vapor deposition (MOCVD) method, a plasma enhanced CVD (PECVD) method, a high density plasma CVD method, a low pressure CVD (LPCVD) method, an atmospheric pressure CVD (APCVD) method, and the like), an atomic layer deposition (ALD) method, a molecular beam epitaxy (MBE) method, or a pulsed laser deposition (PLD) method.

By using a PECVD method, a high-quality film can be formed at a relatively low temperature. By using a deposition method that does not use plasma for deposition, such as an MOCVD method, an ALD method, or a thermal CVD method, a film can be formed with few defects because damage is not easily caused on a surface on which the film is deposited.

In the case where a film is formed by an ALD method, a gas that does not contain chlorine is preferably used as a material gas.

(Embodiment 3)

In this embodiment, an IC chip, an electronic component, electronic devices, and the like are described as examples of a semiconductor device.

<<Example of a Method for Manufacturing an Electronic Component>>

Figure 21A:
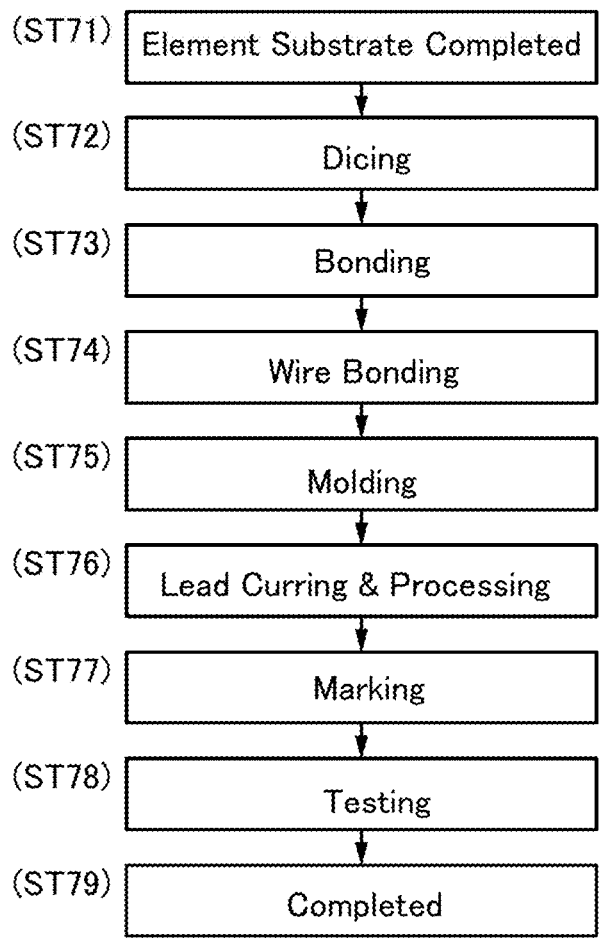
FIGS. 21A to 21E show a structure of a semiconductor wafer and an electronic component.

FIG. 21A is a flow chart showing an example of a method for manufacturing an electronic component. The electronic component is also referred to as a semiconductor package or an IC package. This electronic component has a plurality of standards and names depending on a terminal extraction direction and a terminal shape. Thus, examples of the electronic component are described in this embodiment.

A semiconductor device including a transistor is completed by integrating detachable components on a printed board through an assembly process (post-process). The post-process can be completed through steps shown in FIG. 21A. Specifically, after an element substrate obtained in the pre-process is completed (Step ST71), a back surface of the substrate is ground. The substrate is thinned in this step to reduce warpage or the like of the substrate in the preceding process and to reduce the size of the component. Then, a dicing step of dividing the substrate into a plurality of chips is performed (Step ST72).

Figure 21B:
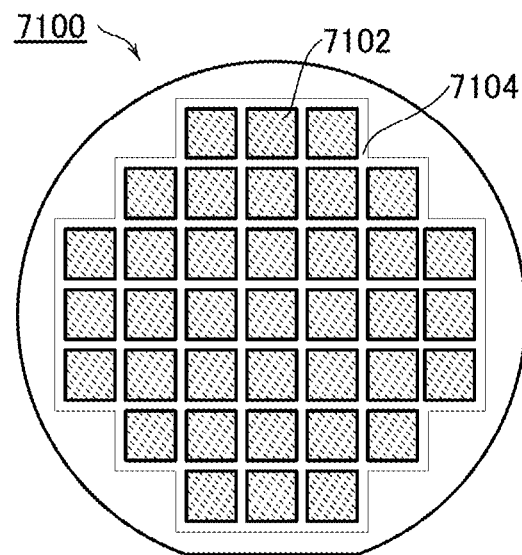
Figure 21C:
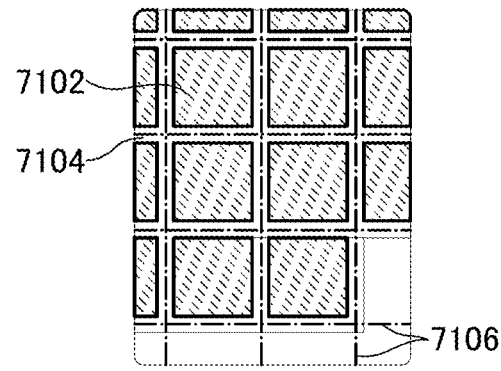

FIG. 21B is a top view of a semiconductor wafer 7100 on which a dicing step is not yet performed. FIG. 21C is a partial enlarged view of FIG. 21B. A plurality of circuit regions 7102 is provided on the semiconductor wafer 7100. A semiconductor device of one embodiment of the present invention is provided in each circuit region 7102.

Figure 21D:
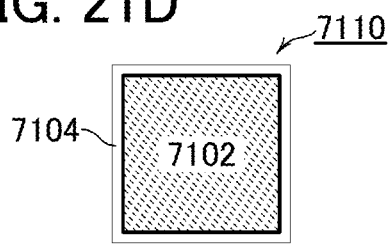

The plurality of circuit regions 7102 is surrounded by a separation region 7104. Separation lines (also referred to as "dicing lines") 7106 are set at positions overlapping with the separation regions 7104. In the dicing step ST72, the semiconductor wafer 7100 is cut along the separation lines 7106, whereby chips 7110 including the circuit regions 7102 are cut out from the semiconductor wafer 7100. FIG. 21D is an enlarged view of the chip 7110.

A conductive layer or a semiconductor layer may be provided in the separation regions 7104. Providing a conductive layer or a semiconductor layer in the separation regions 7104 relieves ESD that might be caused in the dicing step, preventing a decrease in the yield due to the dicing step. A dicing step is generally performed while pure water whose specific resistance is decreased by dissolution of carbon dioxide or the like is supplied to a cut portion in order to cool down a substrate, remove swarf, and prevent electrification, for example. Providing a conductive layer or a semiconductor layer in the separation regions 7104 allows a reduction in the usage of the pure water. Therefore, the cost of manufacturing semiconductor devices can be reduced. Thus, semiconductor devices can be manufactured with improved productivity.

After Step ST72, the divided chips are separately picked up, placed on a lead frame, and bonded thereto in a die bonding step (Step ST73). In the die bonding step, the chip may be bonded to the lead frame by an appropriate method depending on the product, for example, with a resin or a tape. In the die bonding step, the chip may be mounted on an interposer and bonded thereto. In a wire bonding step, a lead of the lead frame and an electrode on the chip are electrically connected to each other with a metal wire (Step ST74). A silver wire or a gold wire can be used as the metal wire. The wire bonding may be either ball bonding or wedge bonding.

A wire-bonded chip is subjected to a molding step of sealing the chip with an epoxy resin or the like (Step ST75). In the molding step, the inside of the electronic component is filled with a resin, thereby reducing damage to the circuit portion and the wire embedded in the component caused by external mechanical force as well as reducing deterioration of characteristics due to moisture or dust. The lead of the lead frame is plated. After that, the lead is cut and processed (Step ST76). This plating process prevents rust of the lead and facilitates soldering at the time of mounting the chip on a printed board in a later step. Printing process (marking) is performed on a surface of the package (Step ST77). After a testing step (Step ST78), the electronic component is completed (Step ST79). An electronic component including the semiconductor device described in the above embodiment can achieve low power consumption and a small size.

Figure 21E:
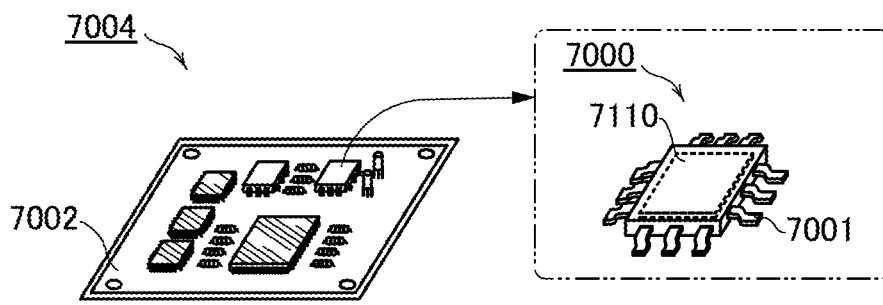

FIG. 21E is a perspective schematic view of a completed electronic component. FIG. 21E shows a perspective schematic view of a quad flat package (QFP) as an example of the electronic component. As illustrated in FIG. 21E, an electronic component 7000 includes a lead 7001 and the chip 7110.

The electronic component 7000 is mounted on a printed board 7002, for example. A plurality of such electronic components 7000 which are combined and electrically connected to each other over the printed board 7002 can be mounted on an electronic device. A completed circuit board 7004 is provided in an electronic device or the like. When an electronic device includes the electronic component 7000, the power consumption of the electronic device can be reduced. Alternatively, the electronic device can easily have a smaller size.

The electronic component 7000 can be used as an electronic component (IC chip) of electronic devices in a wide range of fields, such as digital signal processing, software-defined radio systems, avionic systems (electronic devices used in aircrafts, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multi-function printers, automated teller machines (ATM), vending machines, and consumer electronics.

Then, applications of the electronic component to an electronic device such as a computer, a portable information terminal (including a cellular phone, a portable game machine, an audio reproducing device, and the like), electronic paper, a television device (also referred to as a television or a television receiver), or a digital video camera are described.

Figure 22A:
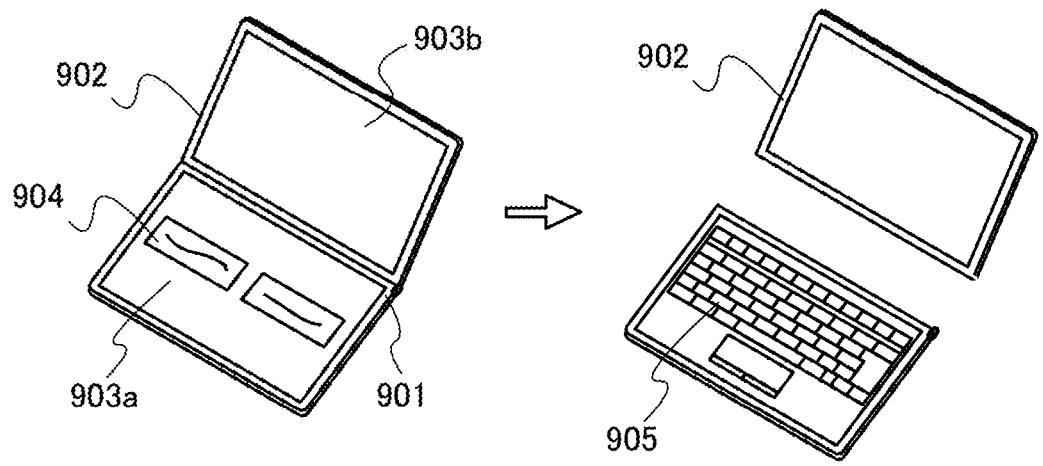
FIGS. 22A to 22E show structural examples of electronic devices.

FIG. 22A illustrates a portable information terminal that includes a housing 901, a housing 902, a first display portion 903a, a second display portion 903b, and the like. The semiconductor device described in the above embodiment is provided inside at least part of the housings 901 and 902.

Thus, the portable information terminal which achieves reduction in power consumption can be obtained.

Note that the first display portion 903a is a panel having a touch-input function, and for example, as illustrated in the left part of FIG. 22A, "touch input" or "keyboard input" can be selected with a selection button 904 displayed on the first display portion 903a. Because the selection button can be displayed with a variety of sizes, the portable information terminal can be easily used by people of any generation. For example, when "keyboard input" is selected, a keyboard 905 is displayed on the first display portion 903a as illustrated in the right part of FIG. 22A. With the keyboard 905, letters can be input quickly by keyboard input as in the case of using a conventional information terminal, for example.

One of the first display portion 903a and the second display portion 903b can be detached from the portable information terminal as illustrated in the right part of FIG. 22A. Providing the second display portion 903b with a touch input function makes the information terminal convenient to carry because the weight can be further reduced and to operate with one hand while the other hand supports the housing 902.

The portable information terminal in FIG. 22A can have a function of displaying a variety of information (e.g., a still image, a moving image, and a text image); a function of displaying a calendar, a date, the time, or the like on the display portion; a function of processing or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information terminal illustrated in FIG. 22A may transmit and receive data wirelessly. Through wireless communication, desired book data or the like can be purchased and downloaded from an electronic book server.

Furthermore, the housing 902 illustrated in FIG. 22A may be equipped with an antenna, a microphone function, and a wireless communication function to be used as a cellular phone.

Figure 22B:
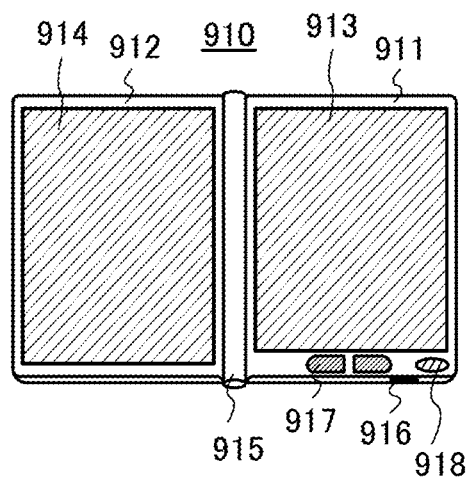

FIG. 22B illustrates an e-book reader 910 in which electronic paper is incorporated. The e-book reader includes two housings of a housing 911 and a housing 912. The housing 911 and the housing 912 are provided with a display portion 913 and a display portion 914, respectively. The housings 911 and 912 are connected by a hinge portion 915 and can be opened or closed with the hinge portion 915 as an axis. The housing 911 is provided with a power switch 916, an operation key 917, a speaker 918, and the like. At least one of the housing 911 and the housing 912 is provided with the semiconductor device described in the above embodiment. Thus, the e-book reader which achieves reduction in power consumption can be obtained.

Figure 22C:
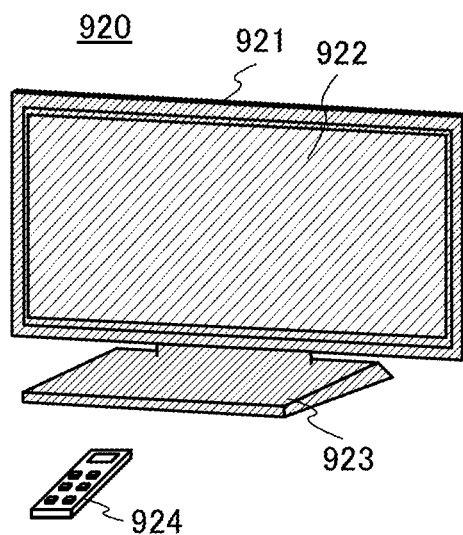

FIG. 22C illustrates a television device including a housing 921, a display portion 922, a stand 923, and the like. The television device 920 can be operated with a switch of the housing 921 and a remote controller 924. The semiconductor device described in the above embodiment is provided in the housing 921 and the remote controller 924. Thus, the television device which achieves reduction in power consumption can be obtained.

Figure 22D:
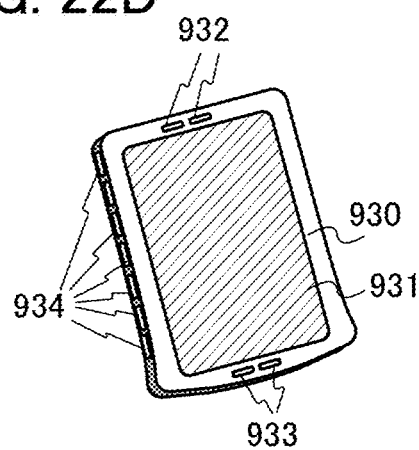

FIG. 22D illustrates a smartphone in which a main body 930 is provided with a display portion 931, a speaker 932, a microphone 933, operation keys 934, and the like. The semiconductor device described in the above embodiment is provided in the main body 930. Thus, the smartphone which is less likely to malfunction and achieves reduction in power consumption can be obtained.

Figure 22E:
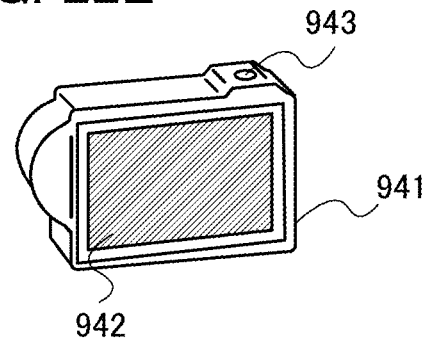

FIG. 22E illustrates a digital camera including a main body 941, a display portion 942, an operation switch 943, and the like. The semiconductor device described in the above embodiment is provided in the main body 941. Thus, the digital camera which achieves reduction in power consumption can be obtained.

As described above, the electronic devices described in this embodiment each include the semiconductor device according to the above embodiment. Thus, the electronic devices which achieve reduction in power consumption can be obtained.

(Example)

An effect of one embodiment of the present invention in the case of changing the voltage of the word line by bringing the back gate line into an electrically floating state was estimated with circuit simulation. The circuit simulation estimates the amount of change in voltage of the back gate line, the amount of change in threshold voltage of a transistor included in the memory cell MC, and the operation frequency of the semiconductor device.

The circuit simulation was carried out with the use of the software "SmartSpice" from Silvaco, Inc.

Figure 23:
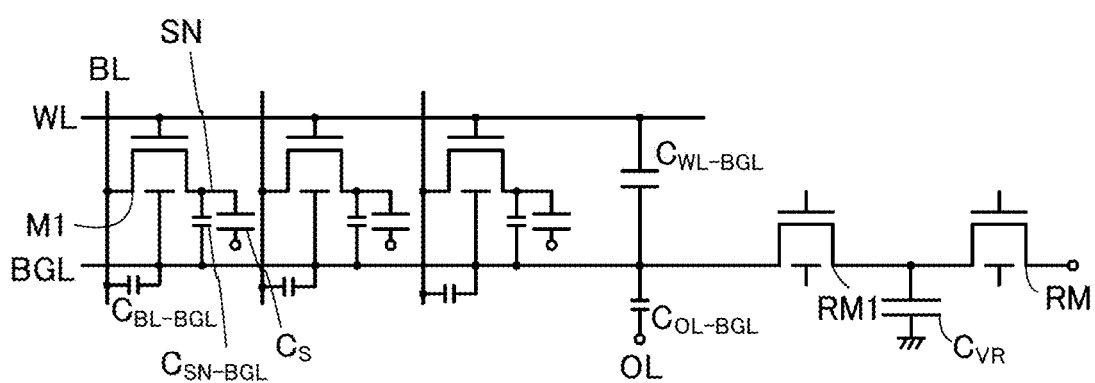
FIG. 23 illustrates a structure of a semiconductor device.

FIG. 23 is a circuit diagram which is used for the circuit simulation. In FIG. 23, the word line WL, the back gate line BGL, and the bit line BL are illustrated. In FIG. 23, the transistor M1 and the capacitor $C_S$ included in the memory cell, the transistors RM and RM1 for keeping the voltage of the back gate line at $V_{BG}$, and the capacitor $C_{VR}$ are illustrated.

The structure and operation in FIG. 23 are the same as those in FIGS. 1A and 1B of Embodiment 1. Specifically, in a period in which the on/off state of the transistor M1 is controlled, the back gate line BGL is brought into an electrically floating state. When the voltage changes as a consequence of the word line WL shifting from a low level to a high level, the voltage of the back gate line BGL increases because of the capacitive coupling between the word line WL and the back gate line BGL. When the voltage of the back gate line increases, the voltage of the back gate electrode of the transistor M1 increases. The threshold voltage of the transistor M1 shifts in the positive direction and the on-state current rises, thereby improving the operation speed required for writing the data voltage.

Table 1 which is used for the circuit simulation shows nodes which are capacitively coupled with the back gate line BGL, and their capacitances.

TABLE 1

| Nodes capacitive coupled with BGL | Capacitance |
| --- | --- |
| $C_{WL-BGL}$ | 17 fF |
| $C_{BL-BGL}$ | 5.3 fF |
| $C_{SN-BGL}$ | 5.1 fF |
| $C_{OL-BGL}$ | 3.2 fF |

$C_{WL-BGL}$ is the capacitance between the word line WL and the back gate line BGL. $C_{BL-BGL}$ is the capacitance between the bit line BL and the back gate line BGL. $C_{SN-BGL}$ is the capacitance between the node SN and the back gate line BGL. $C_{OL-BGL}$ is the capacitance between the back gate line BGL and a wiring (OL) other than the word line WL, the bit line BL, and the node SN.

Table 2 shows comparison results of the case in which the back gate line BGL is set to $V_{BG}$ (BGL=$V_{BG}$) and the case in which the back gate line BGL is set to $V_{BG}$ and brought into an electrically floating state (BGL=floating).

TABLE 2

| | $\Delta V_{BG}$ | $\Delta V_{th}$ | OF |
|---|---|---|---|
| BGL = $V_{BG}$ | 0 V | 0 V | ≅50 MHz |
| BGL = Floating | +1.2 V | −0.25 V | ≅100 MHz |

$\Delta V_{BG}$ is the amount of change in the voltage of the back gate line BGL when the word line WL is changed from a low level to a high level. $\Delta V_{th}$ is the amount of change in the threshold voltage of the transistor M1 when the word line WL is changed from a low level to a high level. OF is the estimated driving frequency at which the semiconductor device can be operated (operating frequency). Note that the amplitude voltage of the word line WL is set to 3.3 V.

As shown in Table 2, it can be estimated that the driving frequency can be improved in the case where the back gate line BGL is brought into an electrically floating state after the back gate line BGL is set to $V_{BG}$.

In the above-described circuit simulation, the amplitude voltage of the word line WL was set to be 3.3 V; however it can be changed to 2.5 V, for example. Although a deterioration of the operation occurs when the amplitude voltage is lowered without an operation for bringing the back gate line BGL into an electrically floating state, the influence thereof can be suppressed by an operation for bringing the back gate line BGL into an electrically floating state.

(Supplementary Notes on the Description in this Specification and the Like)

The following are notes on the description of the above embodiments and structures in the embodiments.

<Supplementary Notes on One Embodiment of the Present Invention Described in Embodiments>

One embodiment of the present invention can be constituted by appropriately combining the structure described in an embodiment with any of the structures described in the other embodiments. In addition, in the case where several structure examples are given in one embodiment, any of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of drawings or a content described with text disclosed in this specification.

Note that by combining a diagram (or part thereof) used in one embodiment with another part of the diagram, a different diagram (or may be part of the different diagram) used in the embodiment, and/or a diagram (or may be part of the diagram) used in one or a plurality of different embodiments, much more diagrams can be formed.

In Embodiment 1, one embodiment of the present invention has been described. Other embodiments of the present invention are described in Embodiments 2 to 3. Note that one embodiment of the present invention is not limited thereto. In other words, various embodiments of the invention are described in Embodiments 1 to 3, and one embodiment of the present invention is not limited to a particular embodiment. For example, an example in which a channel formation region, a source region, a drain region, or the like of a transistor include an oxide semiconductor is described as one embodiment of the present invention; however, one embodiment of the present invention is not limited to this example. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor. Depending on the circumstances or conditions, the transistor, the channel formation region, the source region, the drain region, or the like of the transistor do not necessarily include an oxide semiconductor. The example in which one embodiment of the present invention is applied to a memory cell is described; however, one embodiment of the present invention is not limited thereto. For example, one embodiment of the present invention may be applied to a circuit with another function depending on circumstances or conditions. Furthermore, depending on circumstances or conditions, one embodiment of the present invention is not necessarily applied to a memory cell.

<Supplementary Notes on the Description for Drawings>

In this specification and the like, terms for explaining arrangement, such as "over" and "under", are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits is concerned with one function. Therefore, blocks in a block diagram do not necessarily show components described in the specification, which can be described with different term as appropriate depending on the situation.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as top views (also referred to as plan views) and perspective views, some components may be omitted for clarity of the drawings.

<Supplementary Notes on Expressions that can be Rrephrased>

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, a term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" or "wirings" formed in an integrated manner.

In this specification and the like, voltage and potential can be replaced with each other as appropriate. The term voltage refers to a potential difference from a reference potential. When the reference potential is a ground potential, for example, voltage can be replaced with potential. The ground potential does not necessarily mean 0 V. Potentials are relative values, and the potential applied to a wiring or the like is changed depending on the reference potential in some cases.

In this specification and the like, terms such as "film" and "layer" can be interchanged with each other depending on the case or circumstances. For example, the term "conductive layer" can be changed into the term "conductive film" in some cases. Also, the term "insulating film" can be changed into the term "insulating layer" in some cases.

<Supplementary Notes on Definitions of Terms>

The following are definitions of the terms that are mentioned in the above embodiments.

<<Switch>>

In this specification and the like, a switch is conducting (on state) or not conducting (off state) to determine whether current flows therethrough or not. Alternatively, the switch is an element having a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using micro electro mechanical system (MEMS) technology, such as a digital micromirror device (DMD). Such a switch includes a mechanically movable electrode whose movement controls conduction and non-conduction of the switch.

<<Channel Length>>

In this specification and the like, the channel length refers to, for example, a distance between a source and a drain in a region where a semiconductor (or a portion where current flows in a semiconductor when a transistor is on) and a gate overlap with each other or a region where a channel is formed in a top view of the transistor.

In one transistor, channel lengths are not necessarily the same in all regions. In other words, the channel length of one transistor is not fixed to one value in some cases. Therefore, in this specification, the channel length is any one of values, the maximum value, the minimum value, or the average value in a region where a channel is formed.

<<Channel Width>>

In this specification and the like, the channel width refers to, for example, the length of a portion where a source and a drain face each other in a region where a semiconductor (or a portion where current flows in a semiconductor when a transistor is on) and a gate overlap with each other or a region where a channel is formed.

In one transistor, channel widths are not necessarily the same in all regions. In other words, the channel width of one transistor is not fixed to one value in some cases. Therefore, in this specification, the channel width is any one of values, the maximum value, the minimum value, or the average value in a region where a channel is formed.

Note that depending on the transistor structure, a channel width in a region where a channel is actually formed (hereinafter referred to as an effective channel width) is different from a channel width shown in a top view of the transistor (hereinafter referred to as an apparent channel width) in some cases. For example, in a transistor having a three-dimensional structure, an effective channel width is larger than an apparent channel width shown in a plan view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is larger than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a "surrounded channel width" (SCW) in some cases. Further, in this specification, in the case where the term channel width is simply used, it may represent a surrounded channel width or an apparent channel width. Alternatively, in this specification, in the case where the term channel width is simply used, it may represent an effective channel width. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

<<Connection>>

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

This application is based on Japanese Patent Application serial no. 2016-055235 filed with Japan Patent Office on Mar. 18, 2016, the entire contents of which are hereby incorporated by reference.

What is claimed is:

1. A semiconductor device comprising:
a memory cell including a transistor;
a first circuit; and
a second circuit,
wherein the transistor includes a gate electrode and a back gate electrode,
wherein the first circuit is configured to supply a signal for controlling a conduction state of the transistor to the gate electrode, and
wherein the second circuit is configured to supply a voltage to the back gate electrode for controlling a threshold voltage of the transistor and configured to change the supply of the voltage to the back gate electrode to place the back gate electrode into an electrical floating state in a period in which the signal for controlling the conduction state of the transistor is supplied to the gate electrode.

2. The semiconductor device according to claim 1,
wherein a first wiring connected to the gate electrode and a second wiring connected to the back gate electrode have a first capacitance,
wherein the second wiring and wirings other than the first wiring connected to the memory cell and electrodes included in the memory cell have a second capacitance, and
wherein the first capacitance is 1.2 times or more as large as than the second capacitance.

3. The semiconductor device according to claim 1,
wherein a first wiring connected to the gate electrode is provided over a second wiring connected to the back gate electrode, and
wherein the first wiring and the second wiring have a region overlapping with each other with an insulating layer located therebetween.

4. An electronic device comprising:
the semiconductor device according to claim 1; and
at least one of an antenna, a battery, an operation switch, a microphone, and a speaker.

5. A semiconductor wafer comprising:
a plurality of the semiconductor devices according to claim 1; and
a separation region.

6. The semiconductor device according to claim 1, wherein the voltage of the back gate electrode increases only in a period in which the gate electrode is set to a high-level voltage.

7. A semiconductor device comprising:
a memory cell including a first transistor;
a first circuit; and
a second circuit including a second transistor,
wherein the first transistor includes a first gate electrode and a back gate electrode,
wherein the first circuit is configured to supply a signal for controlling a conduction state of the first transistor to the first gate electrode,
wherein the second circuit is configured to supply a voltage for controlling a threshold voltage of the first transistor to the back gate electrode and to place the back gate electrode into an electrical floating state in a period in which the signal for controlling the conduction state of the first transistor is supplied to the first gate electrode, and
wherein the second transistor includes a second gate electrode connected to one of a source and a drain of the second transistor.

8. The semiconductor device according to claim 7, wherein the second transistor contains an oxide semiconductor.

9. The semiconductor device according to claim 7,
wherein the first transistor and the second transistor are n-channel transistors, and
wherein a threshold voltage of the second transistor is higher than the threshold voltage of the first transistor at a time when potentials of the first gate electrode and the back gate electrode are the same.

10. The semiconductor device according to claim 7,
wherein a first wiring connected to the first gate electrode and a second wiring connected to the back gate electrode have a first capacitance,
wherein the second wiring and wirings other than the first wiring connected to the memory cell and electrodes included in the memory cell have a second capacitance, and
wherein the first capacitance is 1.2 times or more as large as than the second capacitance.

11. The semiconductor device according to claim 7,
wherein a first wiring connected to the first gate electrode is provided over a second wiring connected to the back gate electrode, and
wherein the first wiring and the second wiring have a region overlapping with each other with an insulating layer located therebetween.

12. An electronic device comprising:
the semiconductor device according to claim 7; and
at least one of an antenna, a battery, an operation switch, a microphone, and a speaker.

13. A semiconductor wafer comprising:
a plurality of the semiconductor devices according to claim 7; and
a separation region.

14. The semiconductor device according to claim 7, wherein the voltage of the back gate electrode increases only in a period in which the first gate electrode is set to a high-level voltage.

15. A semiconductor device comprising:
a memory cell including a first transistor;
a first circuit; and
a second circuit including a second transistor,
wherein the first transistor includes a first gate electrode and a first back gate electrode,
wherein the first circuit is configured to supply a signal for controlling a conduction state of the first transistor to the first gate electrode,
wherein the second circuit is configured to supply a voltage for controlling a threshold voltage of the first transistor to the first back gate electrode and to place the first back gate electrode into an electrical floating state in a period in which the signal for controlling the conduction state of the first transistor is supplied to the first gate electrode,
wherein the second transistor includes a second gate electrode and a second back gate electrode, and
wherein a wiring connected to the second gate electrode is different from a wiring connected to the second back gate electrode.

16. The semiconductor device according to claim 15, wherein the second transistor contains an oxide semiconductor.

17. The semiconductor device according to claim 15,
wherein the first transistor and the second transistor are n-channel transistors, and
wherein a threshold voltage of the second transistor is higher than the threshold voltage of the first transistor at a time when potentials of the first gate electrode and the first back gate electrode are the same.

18. The semiconductor device according to claim 15,
wherein a first wiring connected to the first gate electrode and a second wiring connected to the first back gate electrode have a first capacitance,
wherein the second wiring and wirings other than the first wiring connected to the memory cell and electrodes included in the memory cell have a second capacitance, and
wherein the first capacitance is 1.2 times or more as large as than the second capacitance.

19. The semiconductor device according to claim 15,
wherein a first wiring connected to the first gate electrode is provided over a second wiring connected to the first back gate electrode, and
wherein the first wiring and the second wiring have a region overlapping with each other with an insulating layer located therebetween.

20. An electronic device comprising:
the semiconductor device according to claim 15; and
at least one of an antenna, a battery, an operation switch, a microphone, and a speaker.

21. A semiconductor wafer comprising:
a plurality of the semiconductor devices according to claim 15; and
a separation region.

22. The semiconductor device according to claim 15, wherein the voltage of the first back gate electrode increases only in a period in which the first gate electrode is set to a high-level voltage.

23. A semiconductor device comprising:
a plurality of memory cells each including a transistor, the plurality of memory cells arranged in m rows and n columns;
a first circuit; and
p second circuits, where p equals m/2 and each second circuit corresponds to two of the m rows of the plurality of memory cells,
wherein the transistor includes a gate electrode and a back gate electrode,
wherein the first circuit is configured to supply a signal for controlling a conduction state of the transistor to the gate electrode, and
wherein each of the p second circuits is configured to supply a voltage for controlling a threshold voltage of the transistor to the back gate electrode and to place the back gate electrode into an electrical floating state in a period in which the signal for controlling the conduction state of the transistor is supplied to the gate electrode.

24. The semiconductor device according to claim 23,
wherein a first wiring connected to the gate electrode and a second wiring connected to the back gate electrode have a first capacitance,
wherein the second wiring and wirings other than the first wiring connected to one of the plurality of memory cells and electrodes included in the one of the plurality of memory cells have a second capacitance, and
wherein the first capacitance is 1.2 times or more as large as than the second capacitance.

25. The semiconductor device according to claim 23,
wherein a first wiring connected to the gate electrode is provided over a second wiring connected to the back gate electrode, and
wherein the first wiring and the second wiring have a region overlapping with each other with an insulating layer located therebetween.

26. An electronic device comprising:
the semiconductor device according to claim 23; and
at least one of an antenna, a battery, an operation switch, a microphone, and a speaker.

27. A semiconductor wafer comprising:
a plurality of the semiconductor devices according to claim 23; and
a separation region.

28. The semiconductor device according to claim 23, wherein the voltage of the back gate electrode increases only in a period in which the gate electrode is set to a high-level voltage.

* * * * *